(12) United States Patent
Walls et al.

(10) Patent No.: US 10,003,021 B2
(45) Date of Patent: *Jun. 19, 2018

(54) RESISTIVE MEMORY CELL WITH SLOPED BOTTOM ELECTRODE

(71) Applicant: Microchip Technology Incorporated, Chandler, AZ (US)

(72) Inventors: James Walls, Mesa, AZ (US); Paul Fest, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/184,034

(22) Filed: Feb. 19, 2014

(65) Prior Publication Data

US 2015/0236257 A1 Aug. 20, 2015

(51) Int. Cl.
*H01L 45/00* (2006.01)

(52) U.S. Cl.
CPC .......... *H01L 45/1273* (2013.01); *H01L 45/08* (2013.01); *H01L 45/1233* (2013.01); *H01L 45/1608* (2013.01); *H01L 45/1675* (2013.01)

(58) Field of Classification Search
CPC . H01L 45/16; H01L 45/1666; H01L 45/1675; H01L 45/124; H01L 45/1273
See application file for complete search history.

(56) References Cited

U.S. PATENT DOCUMENTS

| | | | |
|---|---|---|---|
| 5,687,112 A | 11/1997 | Ovshinsky | 365/1.63 |
| 5,790,455 A | 8/1998 | Caywood | 635/185.06 |
| 5,962,872 A | 10/1999 | Zhang et al. | 257/66 |
| 5,986,931 A | 11/1999 | Caywood | 365/185.06 |
| 6,031,287 A | 2/2000 | Harshfield et al. | 257/734 |
| 6,147,395 A * | 11/2000 | Gilgen | 257/529 |
| 6,436,611 B1 | 8/2002 | Lee | 430/314 |
| 9,269,606 B2 | 2/2016 | Fest | |

(Continued)

FOREIGN PATENT DOCUMENTS

| | | | | |
|---|---|---|---|---|
| CN | 101794860 A | 8/2010 | | G11C 11/21 |
| CN | 102130145 A | 7/2011 | | H01L 27/24 |

(Continued)

OTHER PUBLICATIONS

International Search Report and Written Opinion, Application No. PCT/US2014/019868, 10 pages, dated Jun. 5, 2014.

(Continued)

*Primary Examiner* — Laura Menz
*Assistant Examiner* — Candice Y Chan
(74) *Attorney, Agent, or Firm* — Slayden Grubert Beard PLLC

(57) ABSTRACT

A method of forming a resistive memory cell, e.g., a CBRAM or ReRAM cell, may include forming a plurality of bottom electrode connections, depositing a bottom electrode layer over the bottom electrode connections, performing an etch to remove portions of the bottom electrode layer to form at least one upwardly-pointing bottom electrode region above the bottom electrode connections, each upwardly-pointing bottom electrode region defining a bottom electrode tip, and forming an electrolyte region and a top electrode over each bottom electrode tip such that the electrolyte region is arranged between the top electrode and the respective bottom electrode top.

30 Claims, 57 Drawing Sheets

(56) References Cited

U.S. PATENT DOCUMENTS

| | | | |
|---|---|---|---|
| 9,281,476 B2 | 3/2016 | Cai et al. | |
| 9,318,702 B2 | 4/2016 | Fest et al. | |
| 9,349,950 B2 | 5/2016 | Walls | |
| 9,362,496 B2 | 6/2016 | Walls et al. | |
| 9,385,313 B2 | 7/2016 | Fest et al. | |
| 9,412,942 B2 | 8/2016 | Walls et al. | |
| 9,444,040 B2 | 9/2016 | Sato et al. | |
| 2002/0036931 A1 | 3/2002 | Lowrey et al. | 365/200 |
| 2002/0039306 A1 | 4/2002 | Lowrey | 365/100 |
| 2004/0085833 A1 | 5/2004 | Hwang et al. | 365/200 |
| 2004/0192009 A1 | 9/2004 | Belyansky et al. | 438/424 |
| 2005/0029505 A1 | 2/2005 | Lowrey | 257/5 |
| 2006/0006443 A1 | 1/2006 | Lowrey et al. | 257/296 |
| 2006/0097238 A1 | 5/2006 | Breuil et al. | 257/4 |
| 2006/0131556 A1 | 6/2006 | Liu et al. | 257/5 |
| 2006/0131618 A1 | 6/2006 | Hsueh | 257/246 |
| 2007/0097738 A1 | 5/2007 | Asano et al. | 365/163 |
| 2007/0267618 A1 | 11/2007 | Zaidi et al. | 257/2 |
| 2008/0012079 A1 | 1/2008 | Zaidi | 257/379 |
| 2009/0017591 A1 | 1/2009 | Cervin-Lawry et al. | 438/384 |
| 2009/0026438 A1 | 1/2009 | Lin | 257/4 |
| 2009/0096568 A1 | 4/2009 | Hosoi et al. | 338/20 |
| 2009/0200640 A1 | 8/2009 | Hosoi et al. | 257/536 |
| 2010/0019218 A1 | 1/2010 | Chung | 257/4 |
| 2010/0038614 A1 | 2/2010 | Hampton | 257/2 |
| 2010/0252798 A1 | 2/2010 | Baker et al. | 206/503 |
| 2010/0055687 A1 | 3/2010 | Sawyers et al. | 435/6.11 |
| 2010/0084741 A1 | 4/2010 | Andres et al. | 257/536 |
| 2010/0163829 A1 | 7/2010 | Wang et al. | 257/3 |
| 2010/0193762 A1 | 8/2010 | Hsieh et al. | 257/4 |
| 2010/0264396 A1 | 10/2010 | Lung et al. | 257/3 |
| 2011/0147694 A1 | 6/2011 | Song et al. | 257/3 |
| 2011/0175048 A1 | 7/2011 | Sekine et al. | 257/2 |
| 2011/0180775 A1 | 7/2011 | Lin et al. | 257/4 |
| 2011/0291064 A1 | 12/2011 | Marsh et al. | 257/4 |
| 2012/0294065 A1* | 11/2012 | Hong | H01L 45/04 365/148 |
| 2012/0313071 A1 | 12/2012 | Gopalan | 257/4 |
| 2012/0319072 A1 | 12/2012 | Wei et al. | 257/4 |
| 2013/0001501 A1 | 1/2013 | Sills | 257/4 |
| 2013/0001503 A1 | 1/2013 | Gallo | 257/4 |
| 2013/0082231 A1 | 4/2013 | Tada et al. | 257/4 |
| 2013/0112936 A1 | 5/2013 | Wei et al. | 257/4 |
| 2013/0214234 A1 | 8/2013 | Gopalan et al. | 257/3 |
| 2013/0252431 A1 | 9/2013 | Chen et al. | 438/702 |
| 2013/0336046 A1 | 12/2013 | Oh | 365/163 |
| 2014/0264245 A1 | 9/2014 | Walls et al. | 257/4 |
| 2015/0236255 A1 | 8/2015 | Fest et al. | 257/3 |
| 2015/0236258 A1 | 8/2015 | Fest et al. | 257/3 |
| 2015/0236527 A1 | 8/2015 | Goldman | 320/134 |
| 2016/0190441 A1 | 6/2016 | Walls et al. | 257/4 |
| 2016/0190442 A1 | 6/2016 | Fest et al. | 257/4 |
| 2016/0380192 A1 | 12/2016 | Sato et al. | 257/4 |

FOREIGN PATENT DOCUMENTS

| | | | | |
|---|---|---|---|---|
| CN | 102738386 A | 10/2012 | | H01L 27/24 |
| CN | 103035840 A | 4/2013 | | G11C 13/00 |
| DE | 102007049786 A1 | 4/2009 | | |
| EP | 1355365 A2 | 10/2003 | | H01L 27/10 |
| EP | 2202816 A1 | 6/2010 | | |
| EP | 2267775 A2 | 12/2010 | | G11C 16/04 |
| EP | 2339585 A1 | 6/2011 | | G11C 16/00 |
| WO | 2010/082922 A1 | 7/2010 | | H01L 21/8247 |
| WO | 2012/057772 A1 | 5/2012 | | H01L 21/8247 |
| WO | 2012/167286 A1 | 12/2012 | | G11C 11/34 |
| WO | 2014/164015 A1 | 10/2014 | | H01L 45/00 |

OTHER PUBLICATIONS

International Search Report and Written Opinion, Application No. PCT/US2014/019906, 12 pages, dated Jul. 2, 2014.

Kozicki, M., "Nanoscale Memory Elements Based on Solid-State Electrolytes," IEEE Transactions on Nano Technology, vol. 4, No. 3, 8 pages, May 2005.

Chen, A., "Non-Volatile Resistive Switching for Advanced Memory Applications," IEDM Technical Digest, 4 pages, 2005.

Balakrishnan, M. et al., "A Low Power Non-Volatile Memory Element Based on Copper in Deposited Silicon Oxide," Non-Volatile Memory Technology Symposium, 7 pages, 2006.

Schindler, C. et al., "Bipolar and Unipolar Resistive Switching in Cu-Doped SiO2," IEEE Transactions on Electron Devices, vol. 54, No. 10, 7 pages, 2007.

Chen, A., "Ionic Memories: Status and Challenges," Non-Volatile Memory Technology Symposium, 5 pages, 2008.

Valov, I. et al., "Electrochemical Metallization Memories—Fundamentals, Applications, Prospects," Nanotechnology, vol. 22, No. 25, 22 pages, Jun. 24, 2011.

Jou, S. et al., "Resistance Switching Properties in Cu/Cu—SiO2/TaN Device," Proceeding World Congress on Engineering, vol. 2, 4 pages, Jul. 6, 2011.

Yang, L. et al., "Linear Scaling of Reset Current Down to 22-nm Node for a Novel CuxSiyO RRAM," IEEE Electron Device Letters, vol. 33, No. 1, 3 pages, 2012.

International Search Report and Written Opinion, Application No. PCT/US2014/020188, 10 pages, dated May 13, 2014.

International Search Report and Written Opinion, Application No. PCT/US2014/022194, 11 pages, dated May 16, 2014.

U.S. Non-Final Office Action, U.S. Appl. No. 14/184,177, 12 pages, dated Jun. 19, 2015.

U.S. Non-Final Office Action, U.S. Appl. No. 14/183,792, 23 pages, dated Jul. 8, 2015.

U.S. Non-Final Office Action, U.S. Appl. No. 14/183,674, 26 pages, dated Jul. 8, 2015.

U.S. Non-Final Office Action, U.S. Appl. No. 14/183,831, 18 pages, dated Jul. 9, 2015.

U.S. Non-Final Office Action, U.S. Appl. No. 14/183,738, 26 pages, dated Jul. 16, 2015.

U.S. Non-Final Office Action, U.S. Appl. No. 14/183,953, 27 pages, dated Jul. 31, 2015.

International Search Report and Written Opinion, Application No. PCT/US2015/016268, 9 pages, dated May 4, 2015.

U.S. Final Office Action, U.S. Appl. No. 14/184,331, 10 pages, dated Nov. 12, 2015.

International Search Report and Written Opinion, Application No. PCT/US2015/016259, 16 pages, dated May 6, 2015.

International Search Report and Written Opinion, Application No. PCT/US2015/016244, 11 pages, dated May 7, 2015.

International Search Report and Written Opinion, Application No. PCT/US2015/062758, 12 pages, dated Mar. 2, 2016.

U.S. Final Office Action, U.S. Appl. No. 14/183,831, 13 pages, dated Feb. 2, 2016.

International Search Report and Written Opinion, Application No. PCT/US2015/016334, 11 pages, dated Dec. 7, 2015.

International Search Report and Written Opinion, Application No. PCT/US2015/016321, 11 pages, dated Jul. 14, 2015.

Chinese Office Action, application No. 201480011426.5, 9 pages, dated Apr. 1, 2017.

U.S. Non-Final Office Action, U.S. Appl. No. 15/065,354, 22 pages, dated Feb. 24, 2017.

U.S. Non-Final Office Action, U.S. Appl. No. 14/952,559, 30 pages, dated Mar. 1, 2017.

U.S. Non-Final Office Action, U.S. Appl. No. 15/200,322, 16 pages, dated Mar. 1, 2017.

Taiwan Office Action, Application No. 103108885, 15 pages, dated Jun. 6, 2017.

U.S. Non-Final Office Action, U.S. Appl. No. 15/065,193, 33 pages, dated Jul. 14, 2017.

U.S. Final Office Action, U.S. Appl. No. 15/065,354, 21 pages, dated Aug. 28, 2017.

U.S. Notice of Allowance, U.S. Appl. No. 15/200,322, 27 pages, dated Oct. 4, 2017.

U.S. Non-Final Office Action, U.S. Appl. No. 15/262,923, 33 pages, dated Aug. 10, 2017.

U.S. Final Office Action, U.S. Appl. No. 15/262,923, 17 pages, dated Dec. 26, 2017.

(56) References Cited

OTHER PUBLICATIONS

European Office Action, Application No. 15707029.3, 7 pages, dated Jan. 8, 2018.
U.S. Final Office Action, U.S. Appl. No. 15/065,193, 19 pages, dated Jan. 11, 2018.
European Office Action, Application No. 15707484.0, 4 pages, dated Jan. 11, 2018.

* cited by examiner

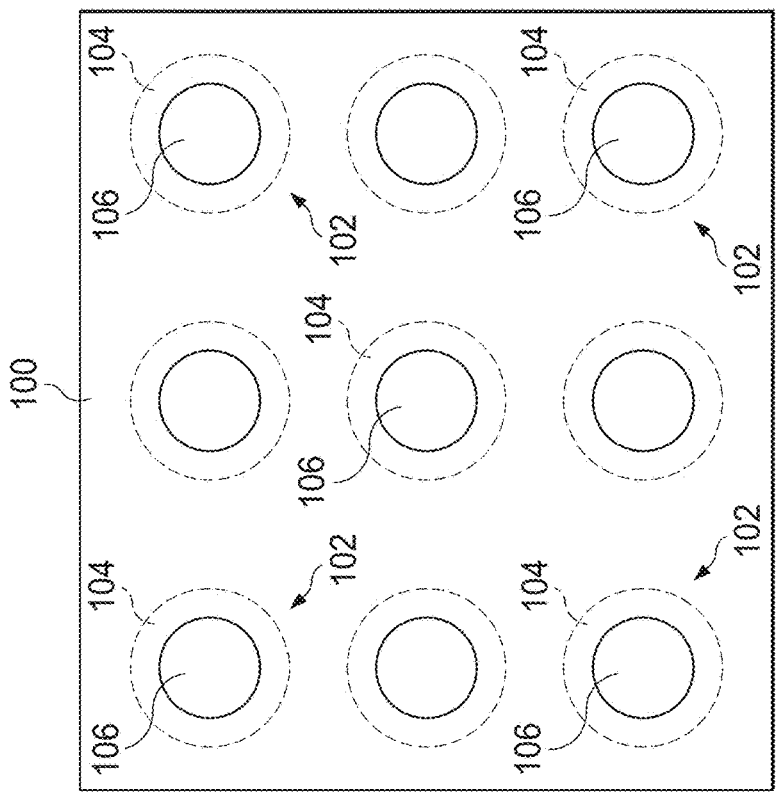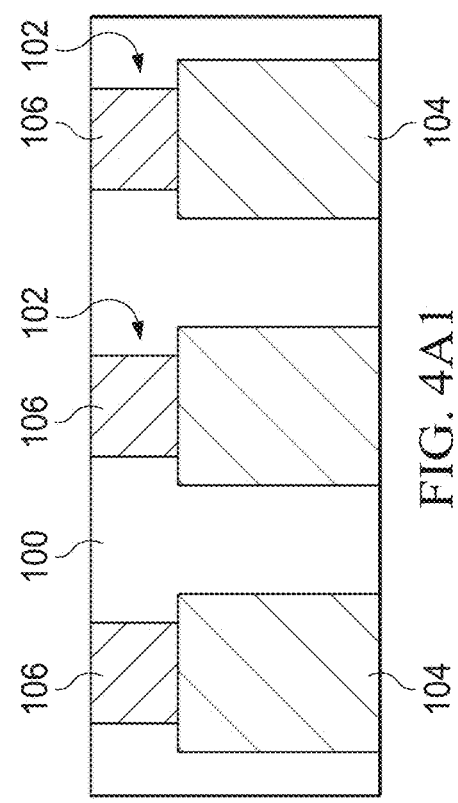

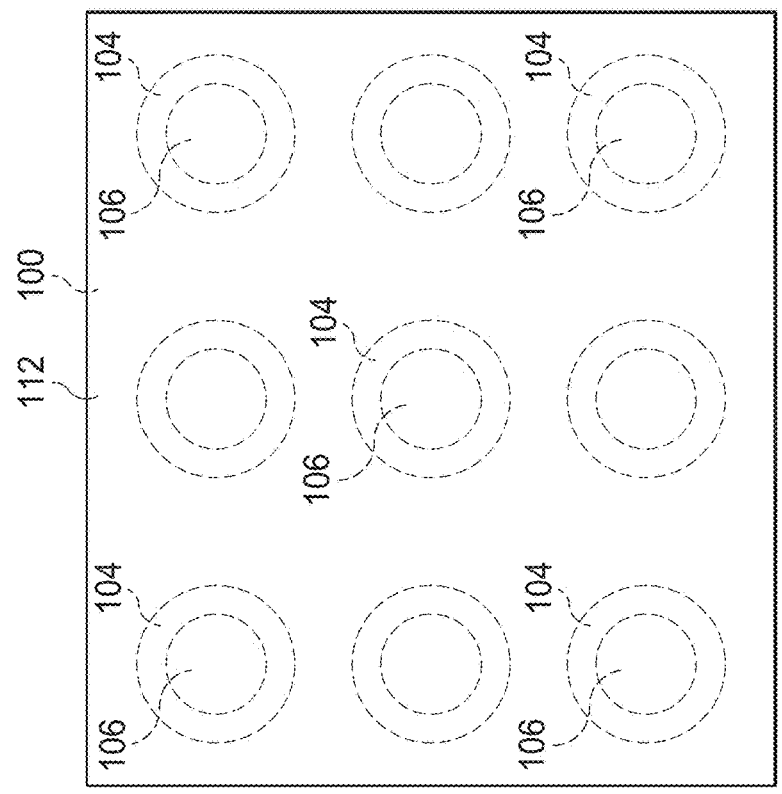
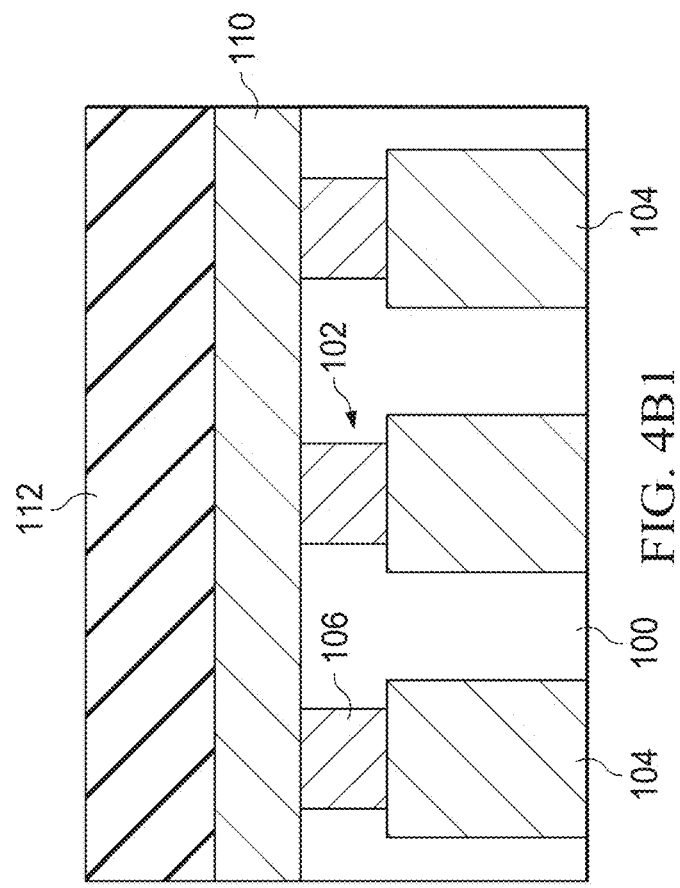

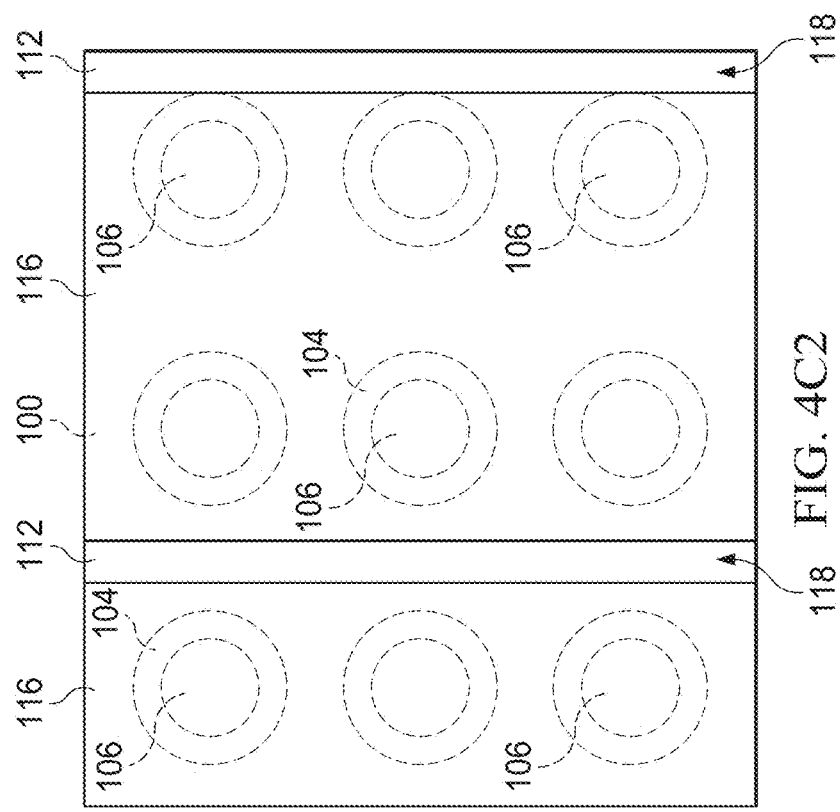
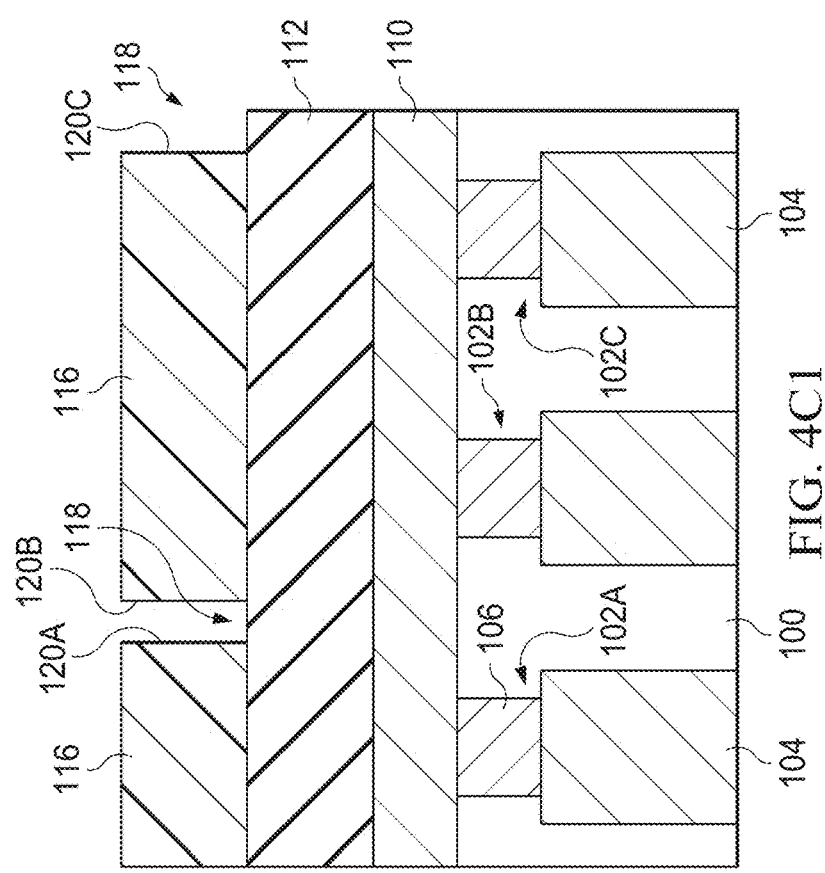

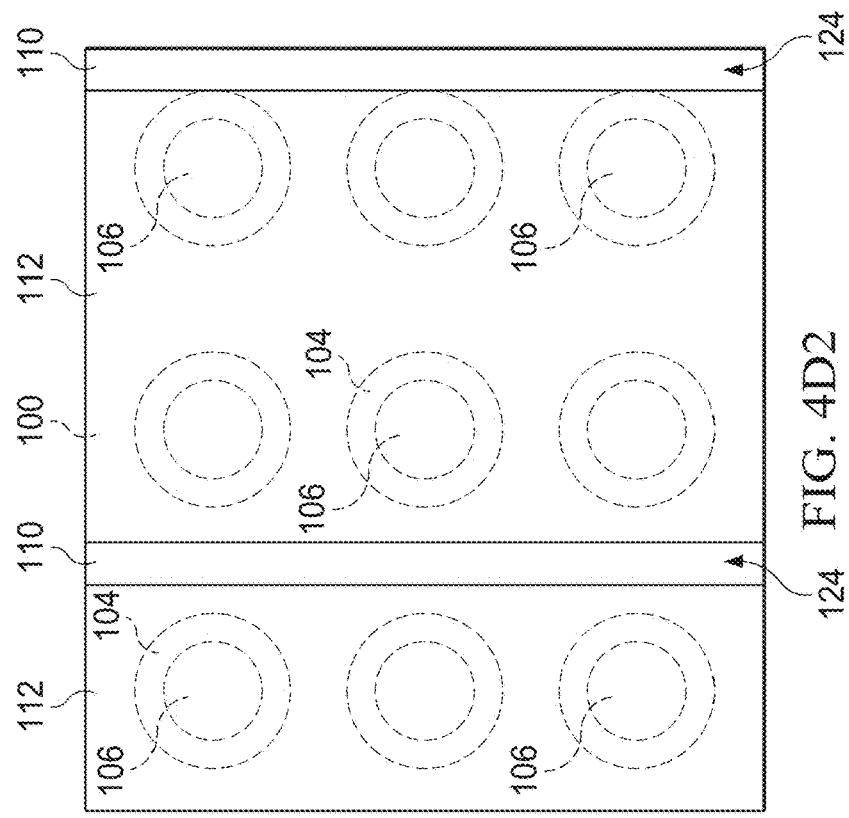
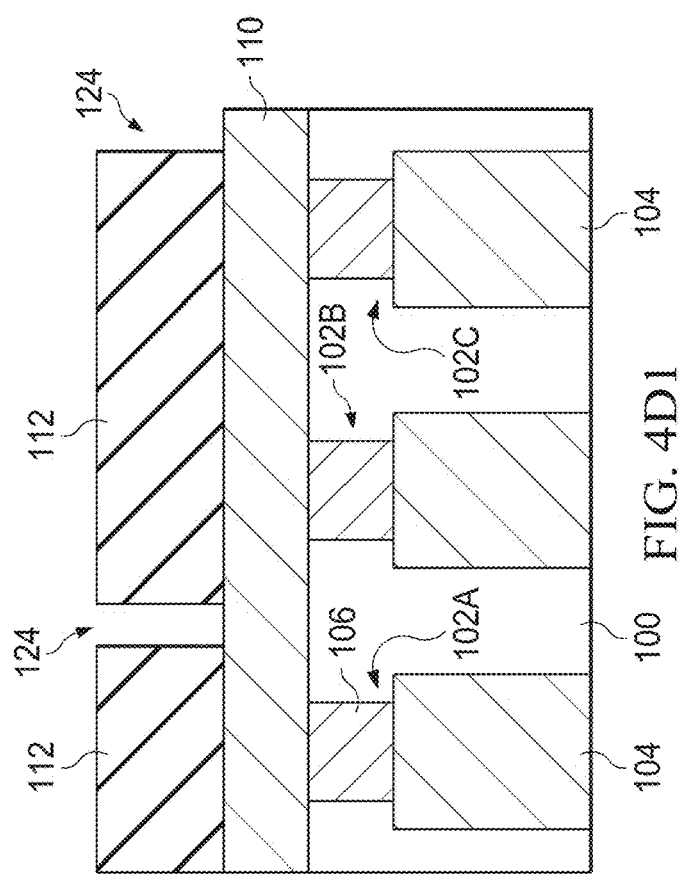
FIG. 4D2
FIG. 4D1

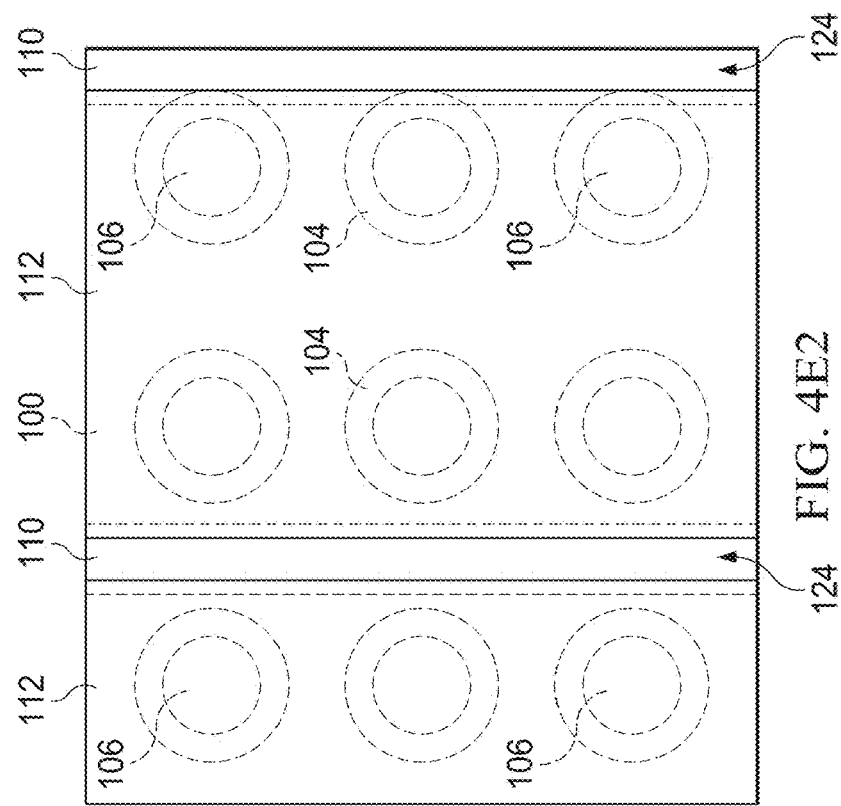
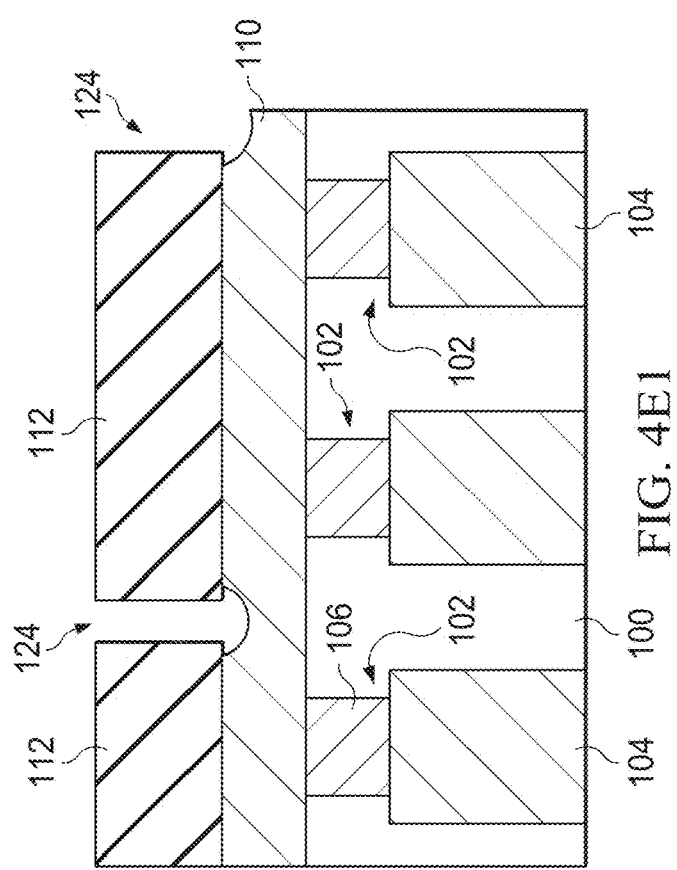
FIG. 4E1
FIG. 4E2

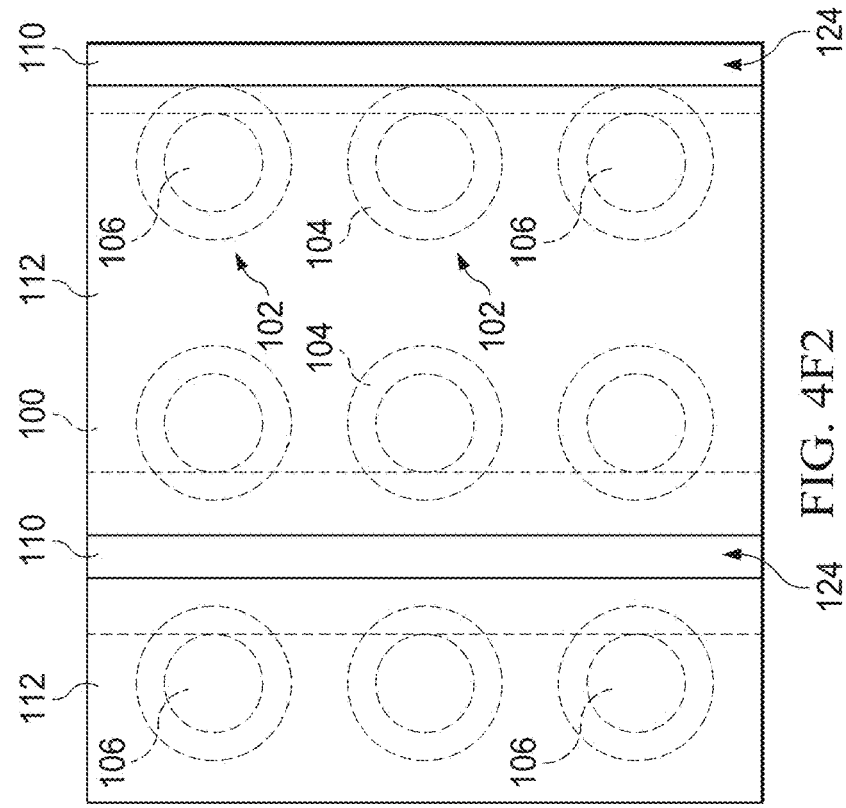
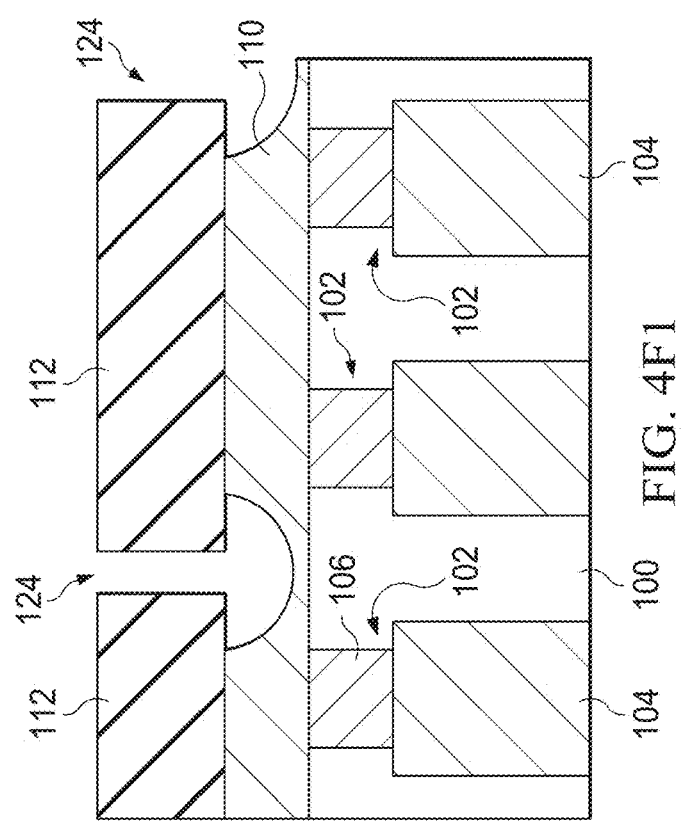

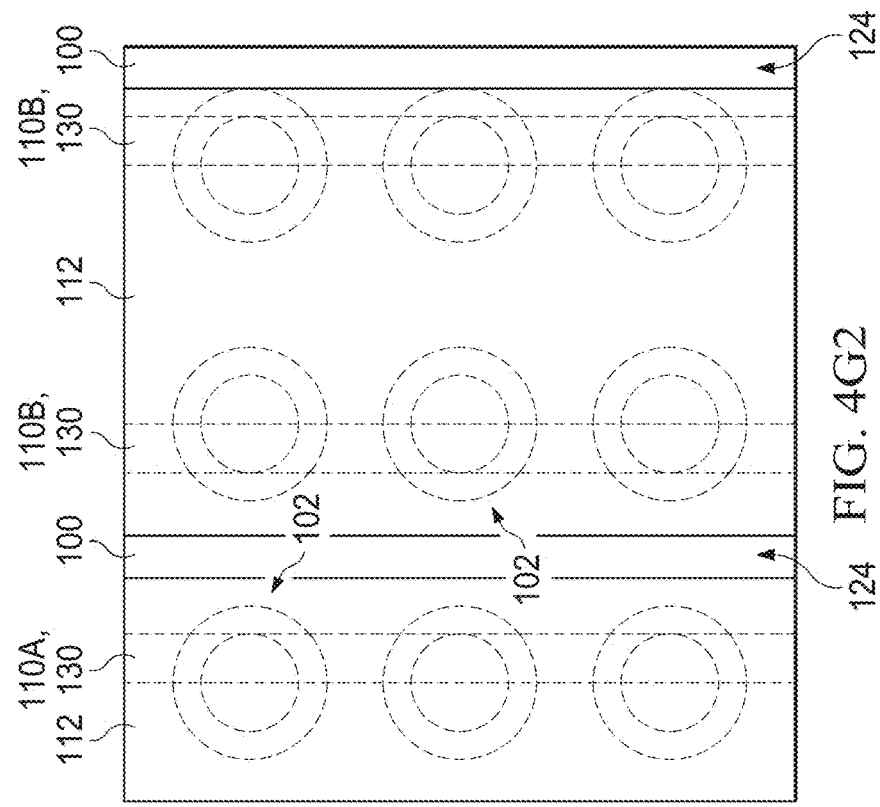
FIG. 4G2
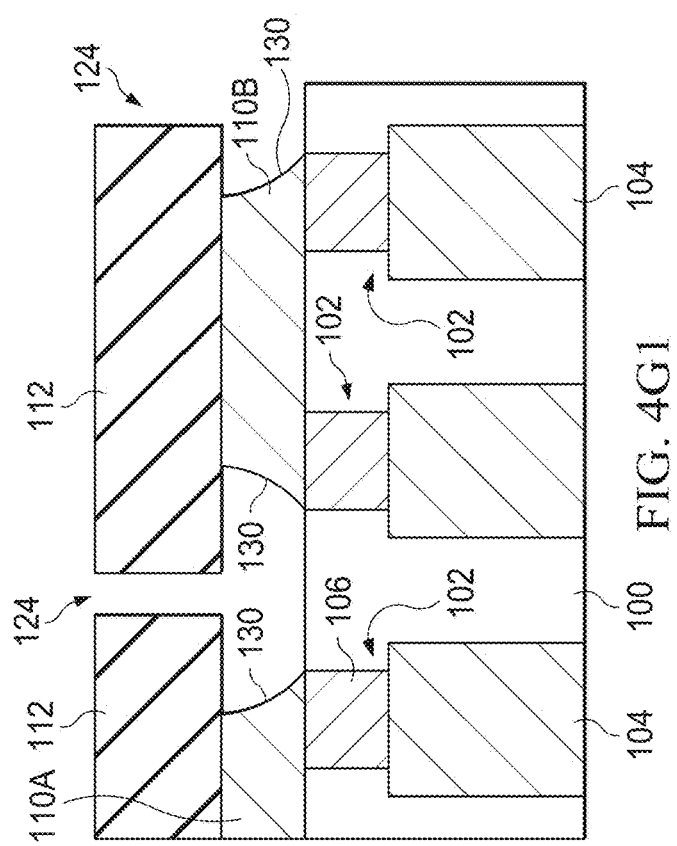
FIG. 4G1

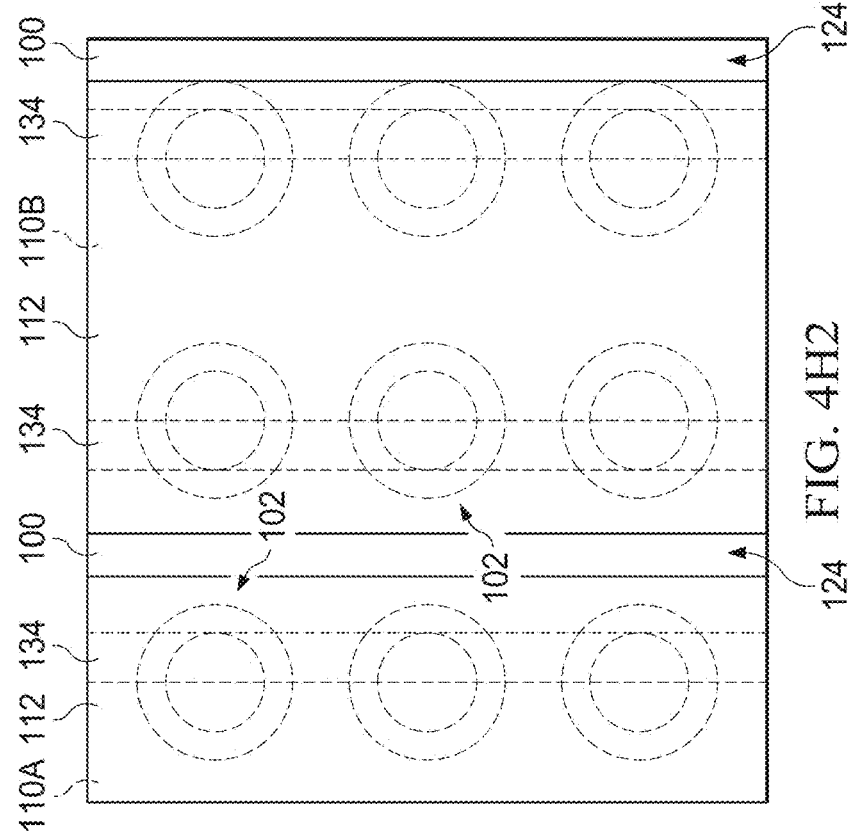
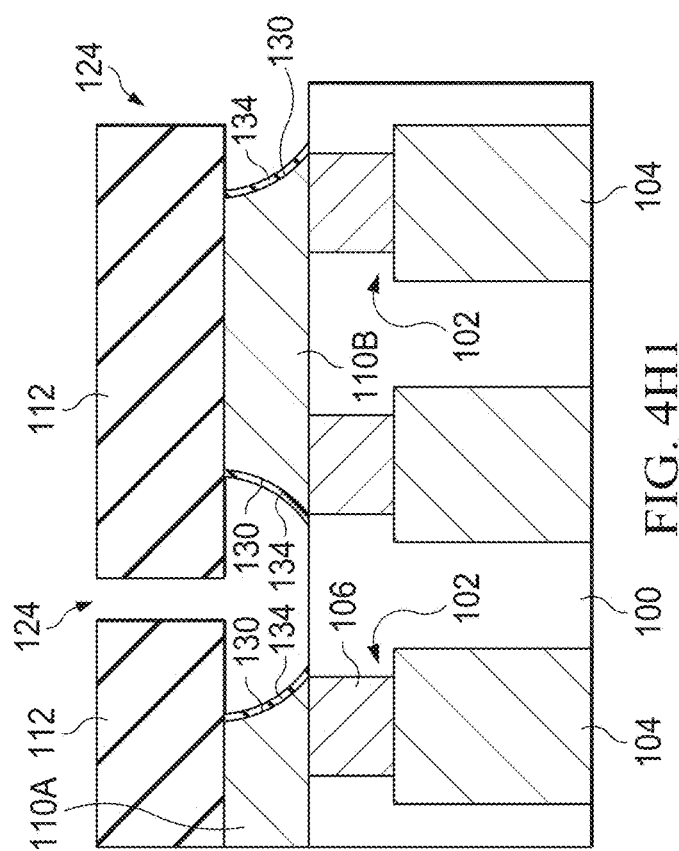
FIG. 4H2
FIG. 4H1

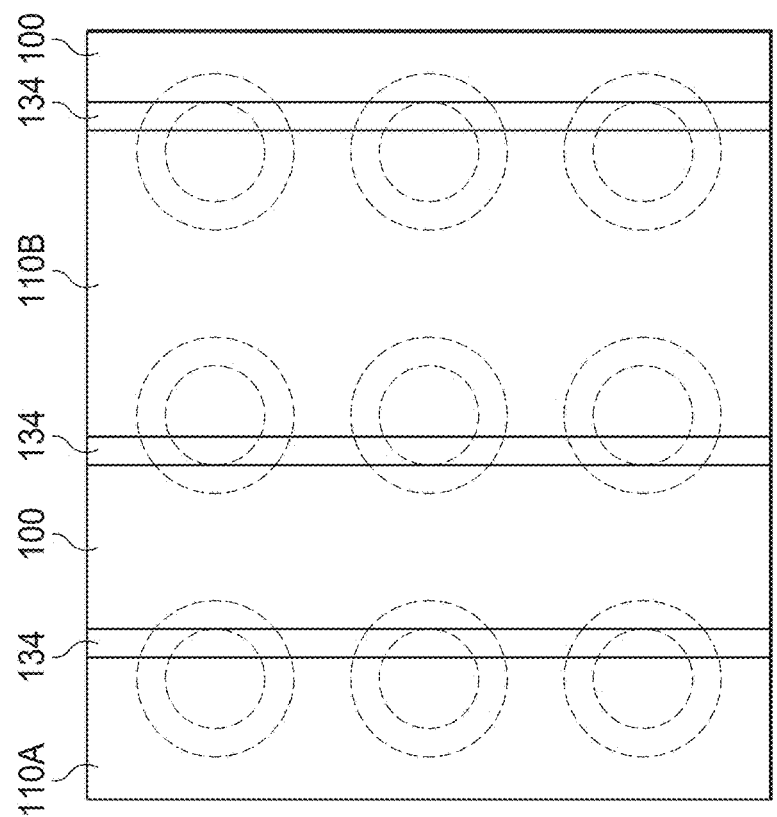
FIG. 4I2
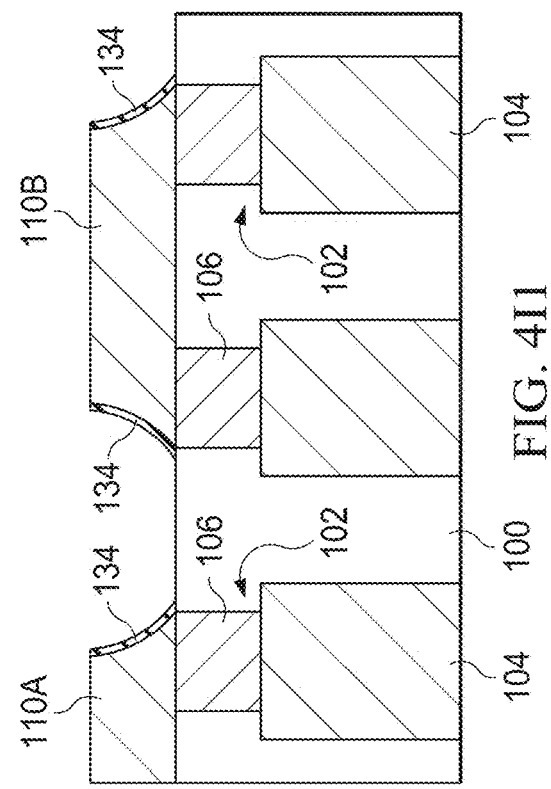
FIG. 4I1

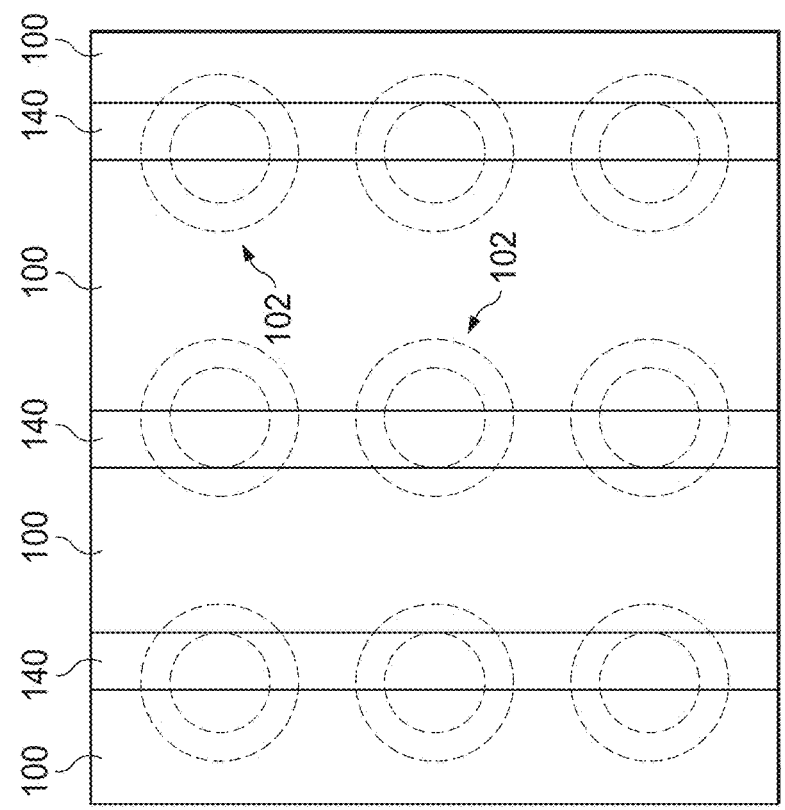
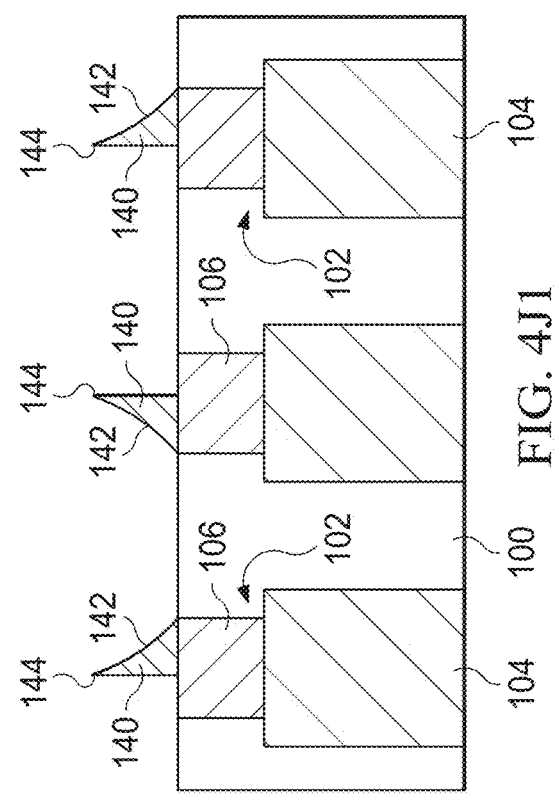
FIG. 4J2
FIG. 4J1

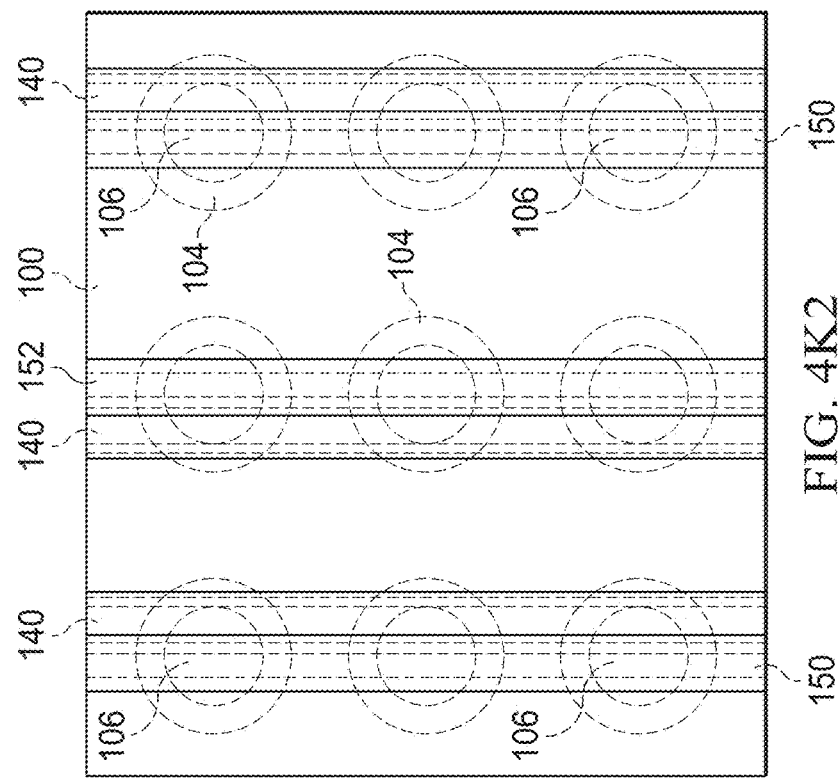
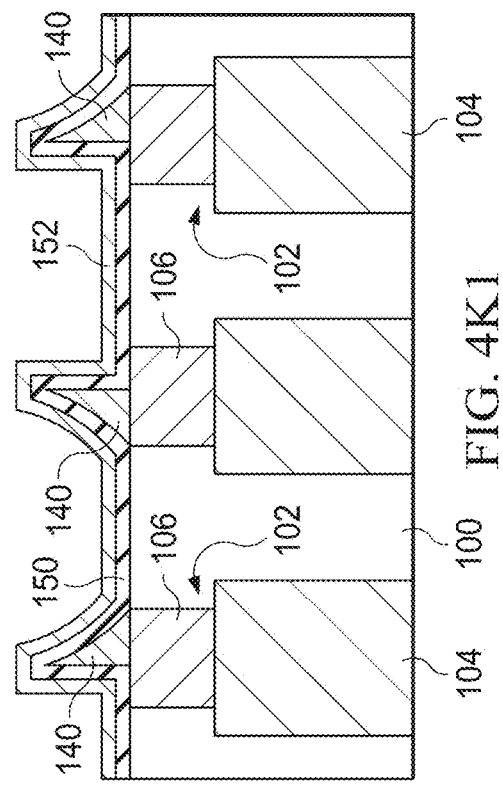

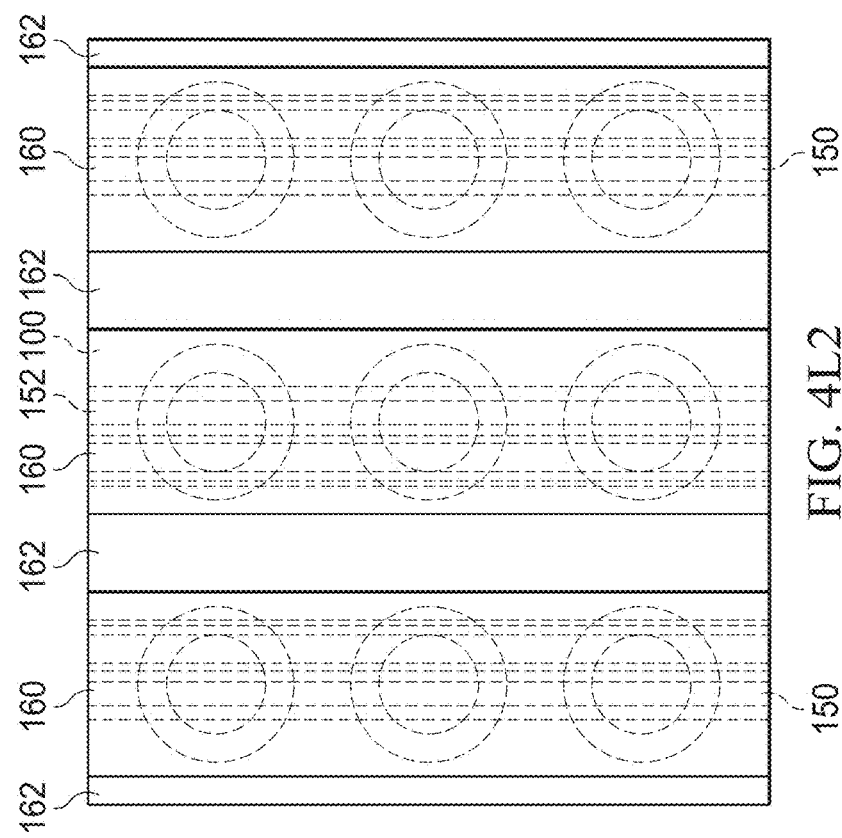
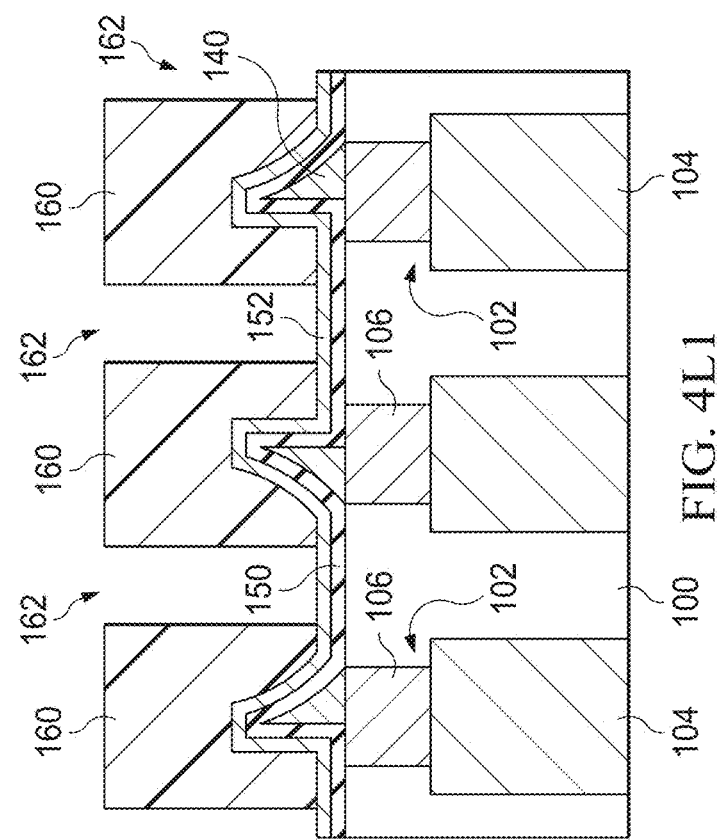
FIG. 4L1
FIG. 4L2

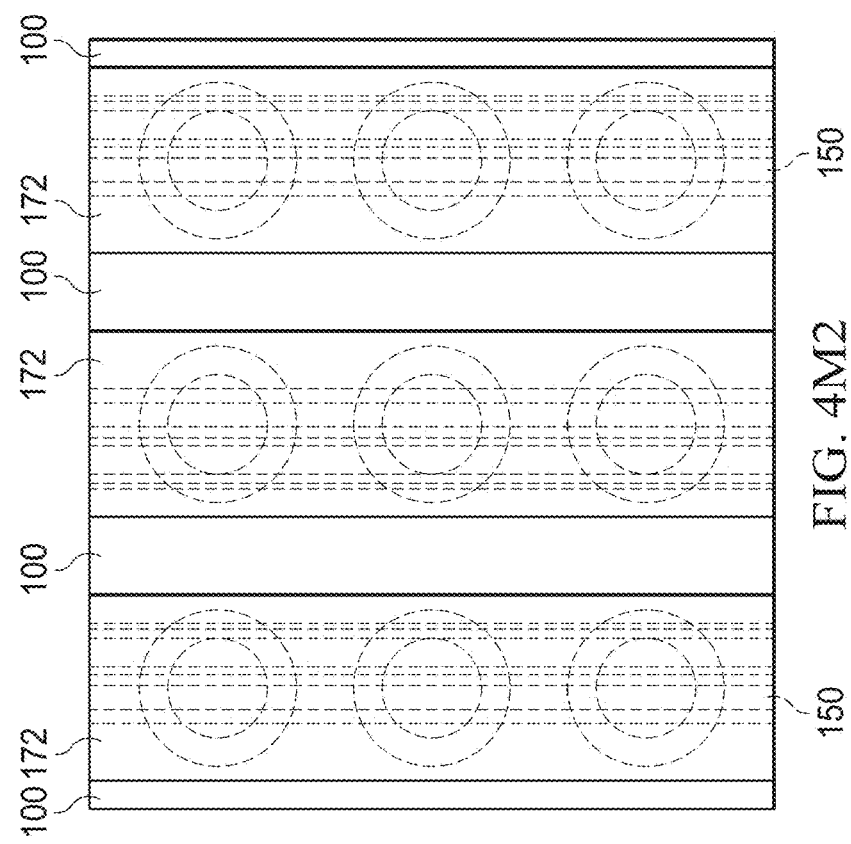
FIG. 4M2
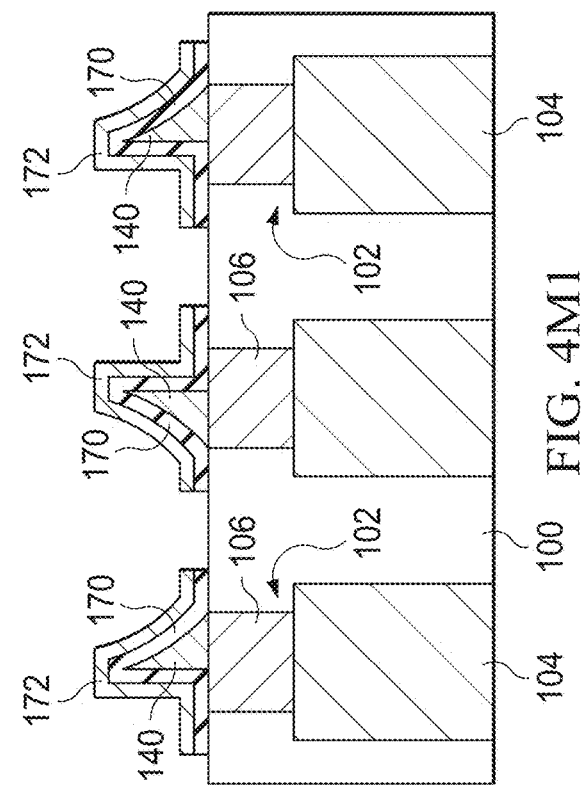
FIG. 4M1

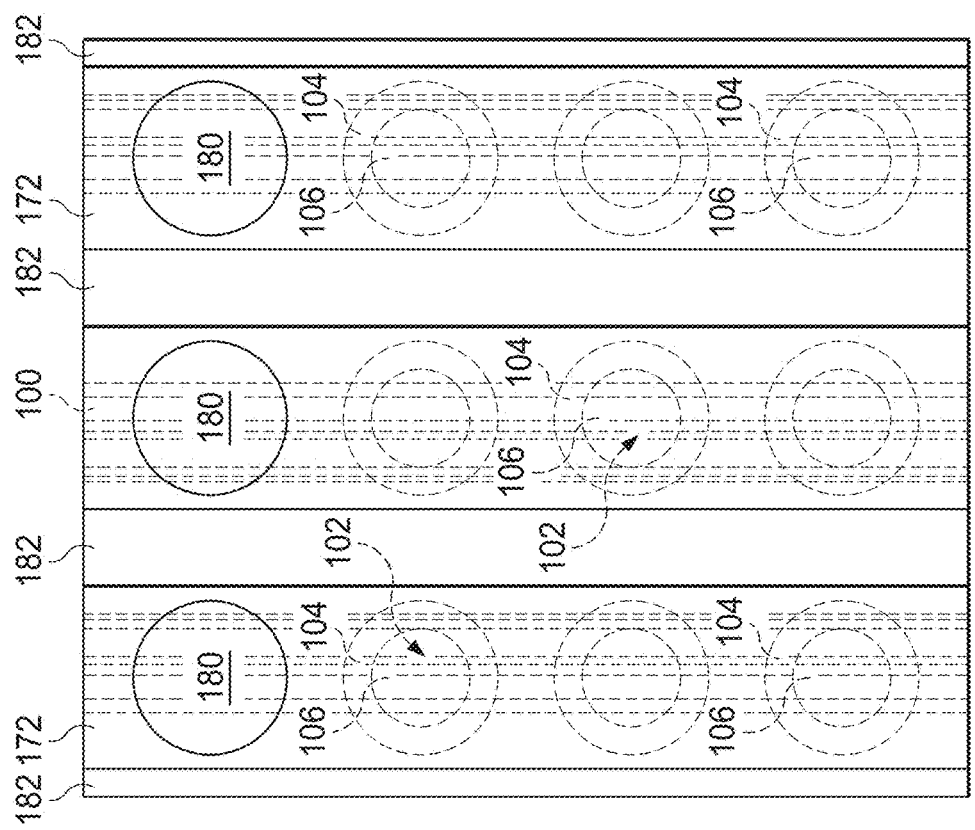
FIG. 4N2
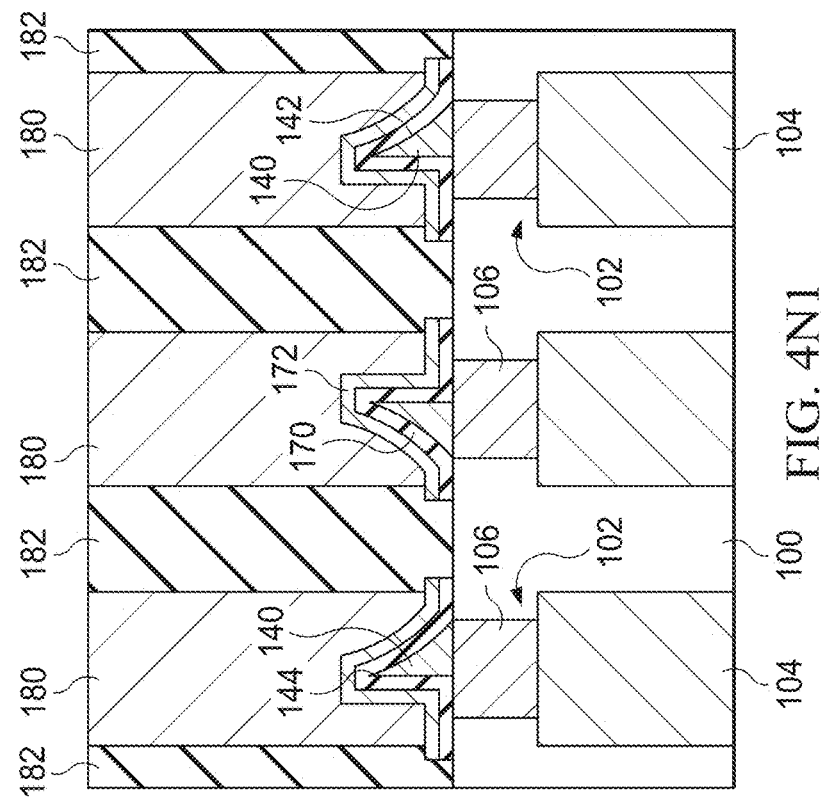
FIG. 4N1

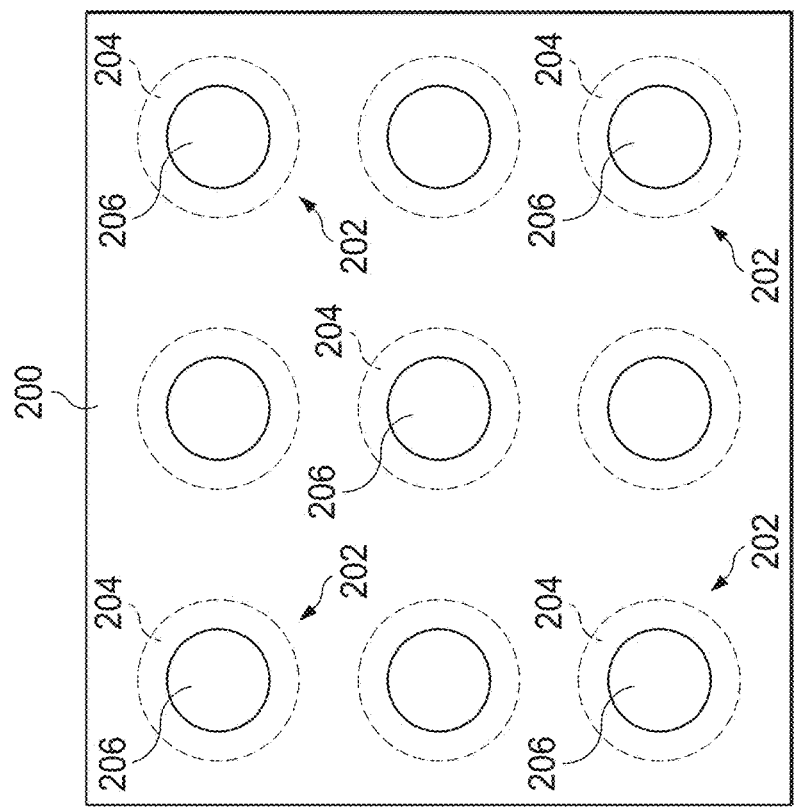
FIG. 5A2
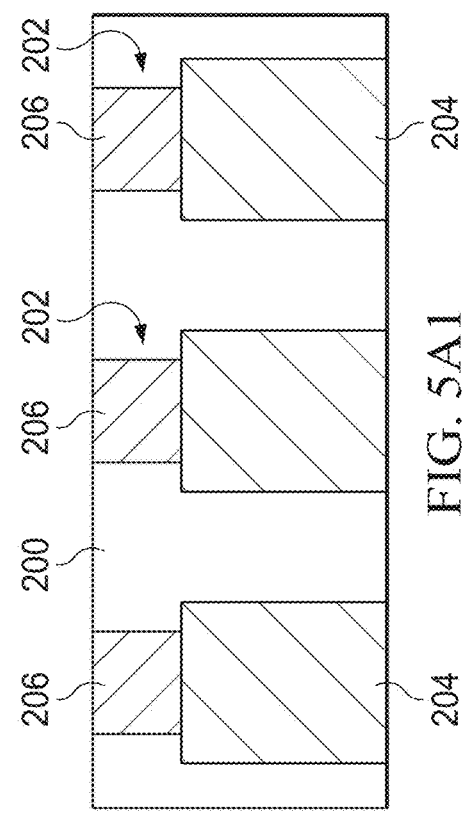
FIG. 5A1

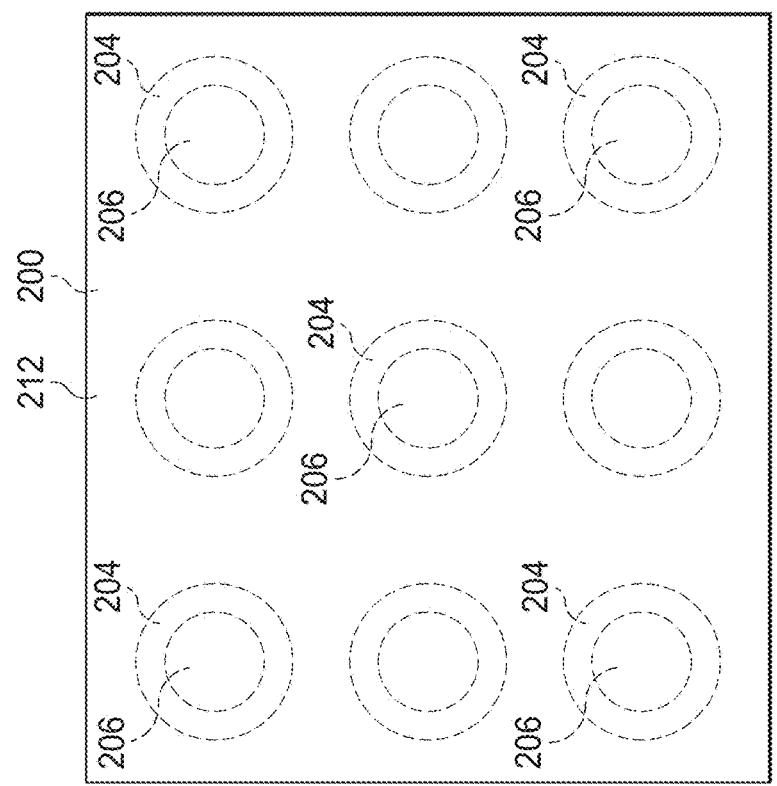
FIG. 5B2
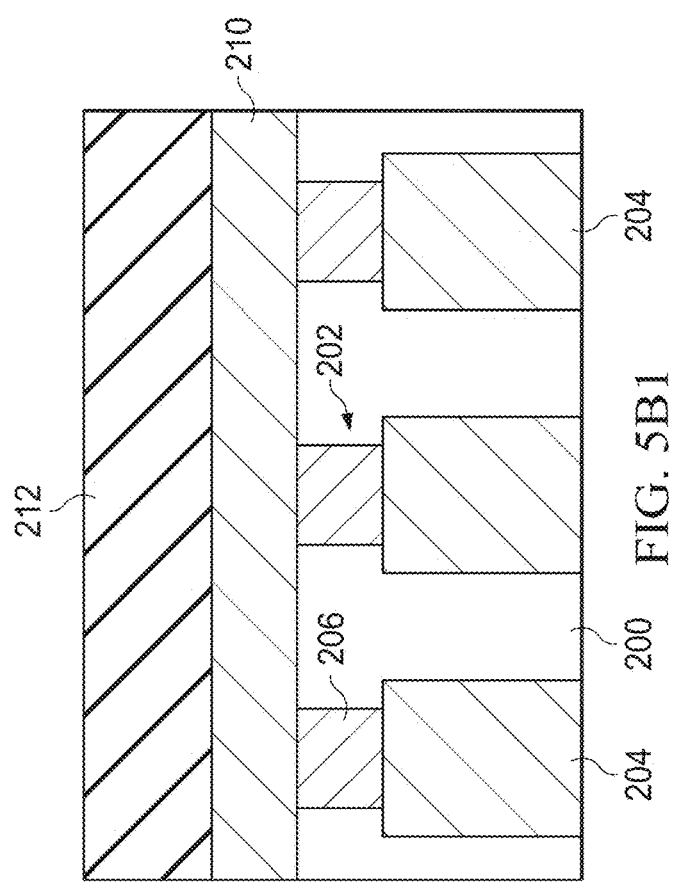
FIG. 5B1

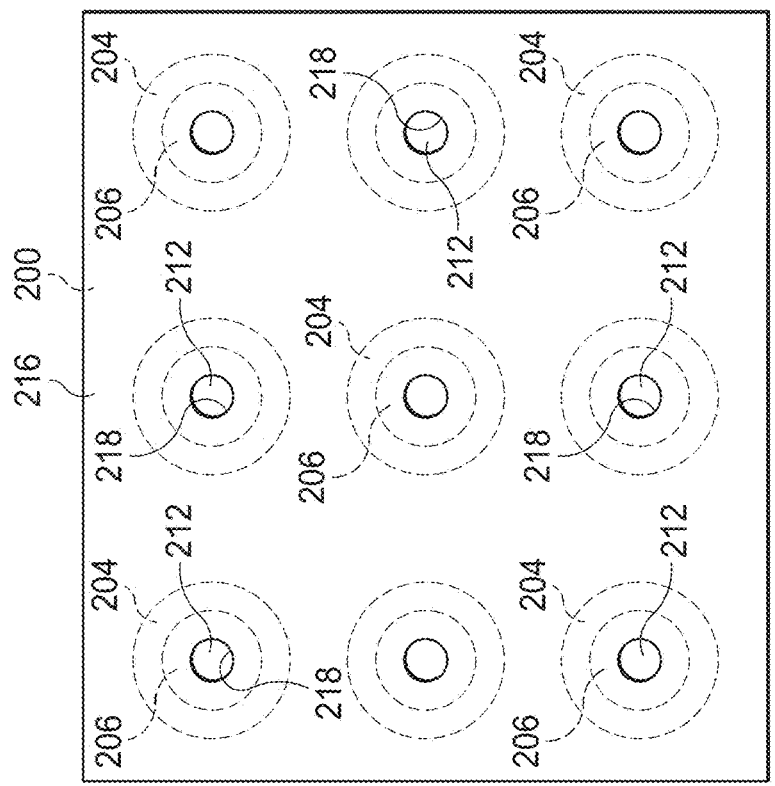
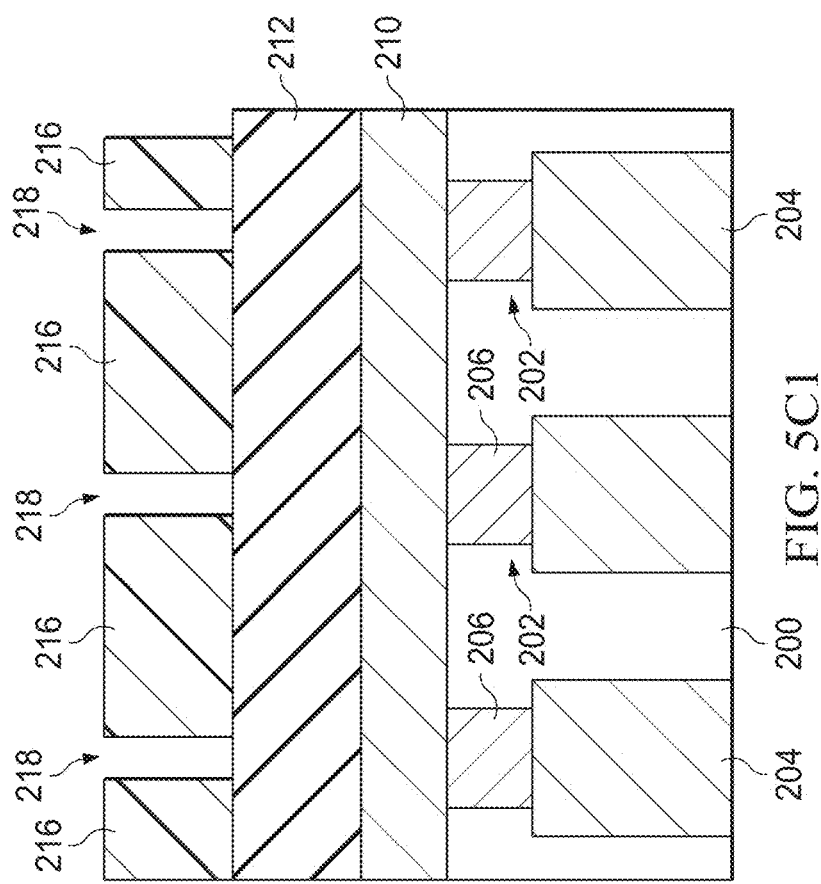
FIG. 5C2
FIG. 5C1

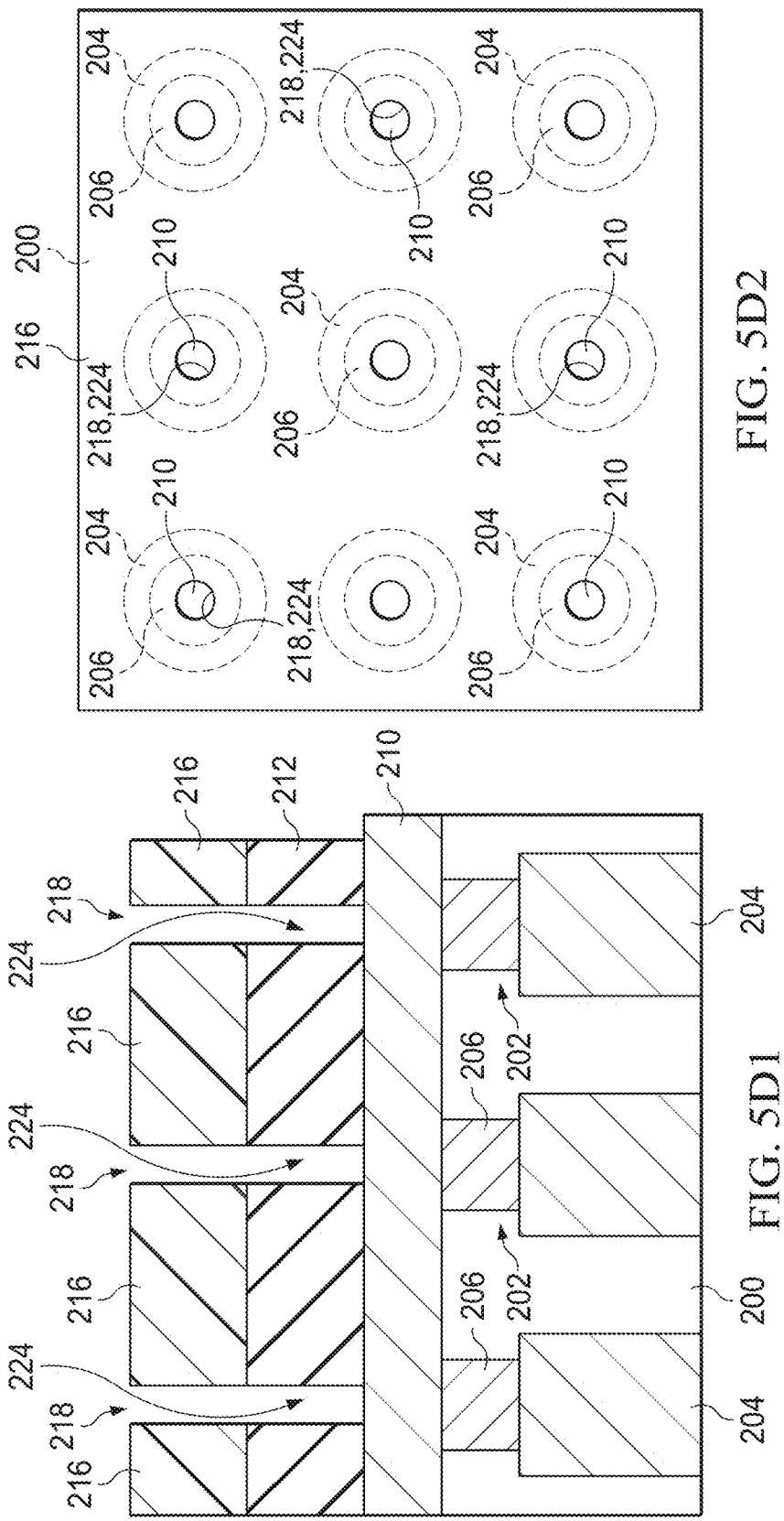

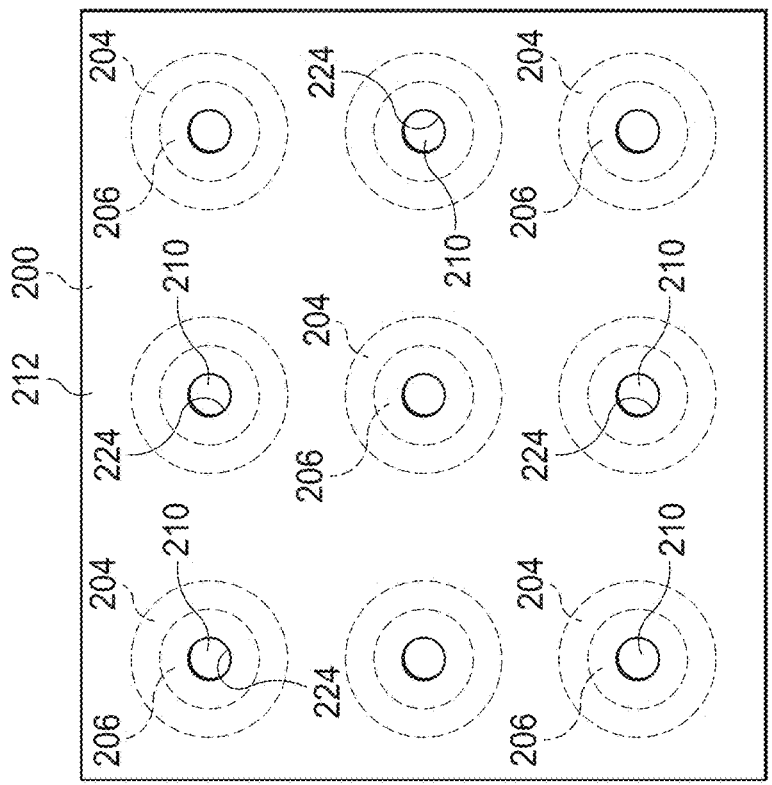
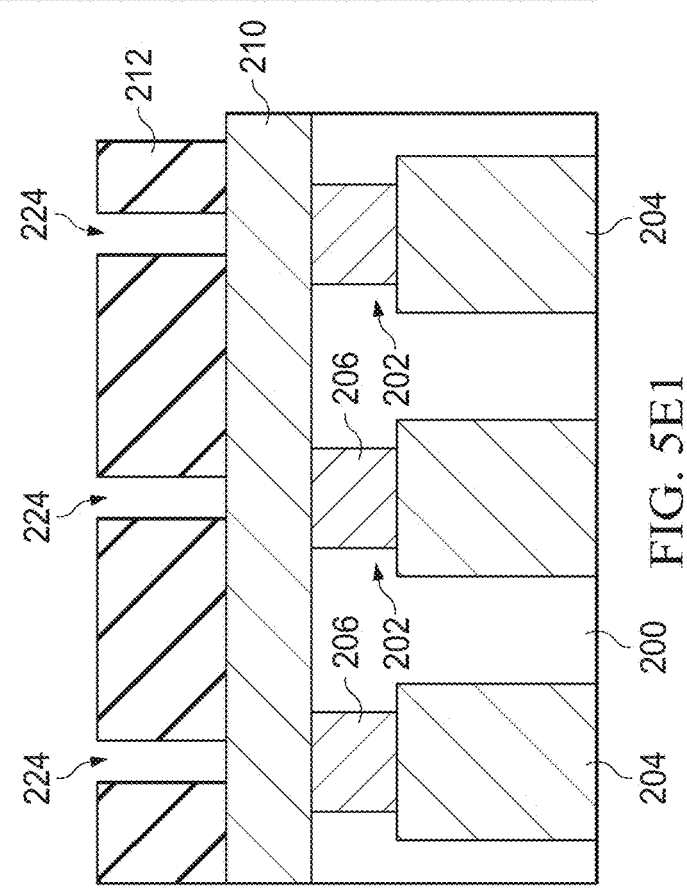
FIG. 5E1
FIG. 5E2

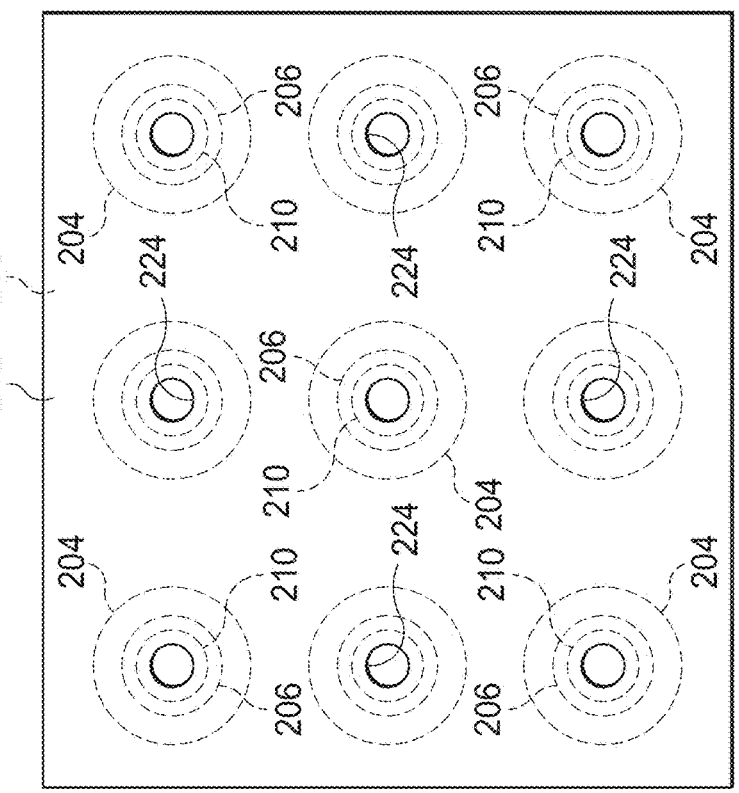
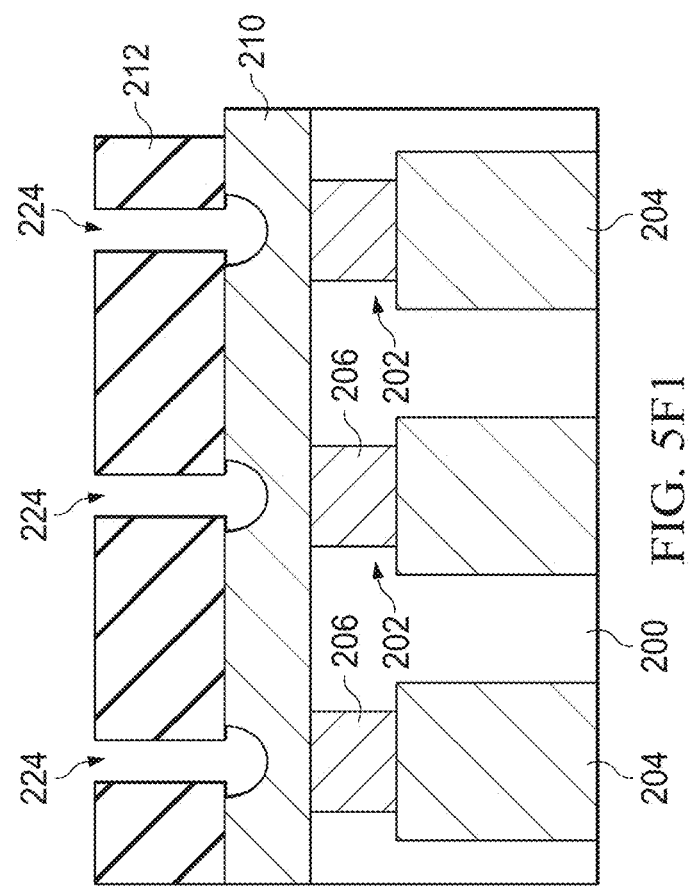
FIG. 5F1
FIG. 5F2

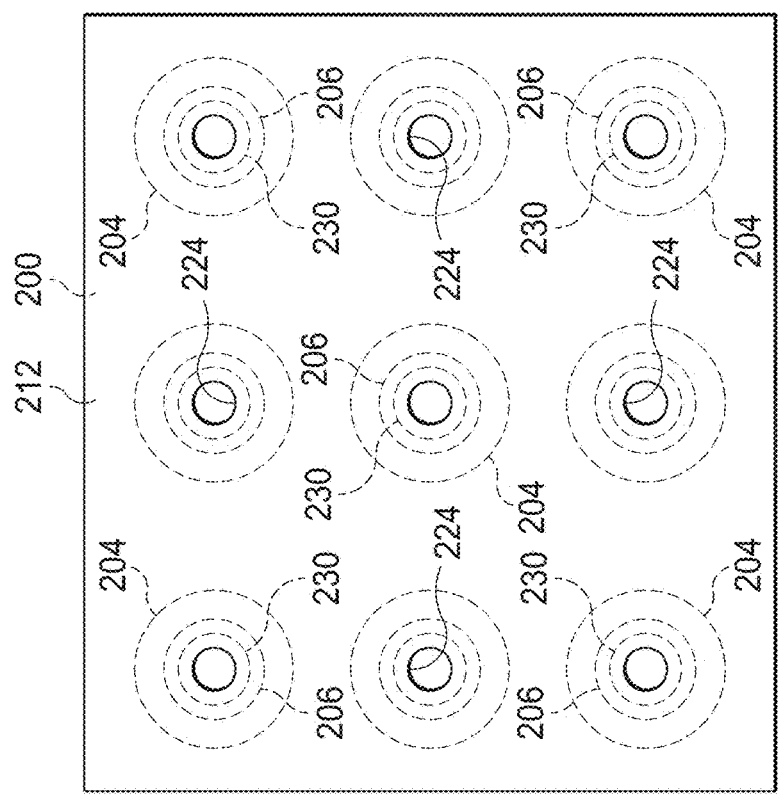
FIG. 5G2
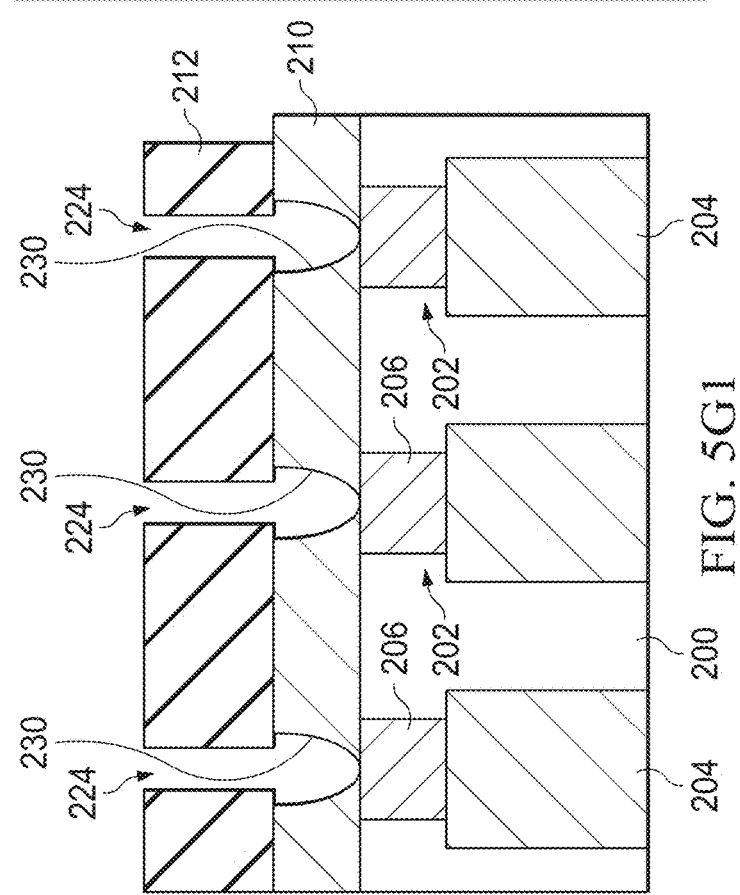
FIG. 5G1

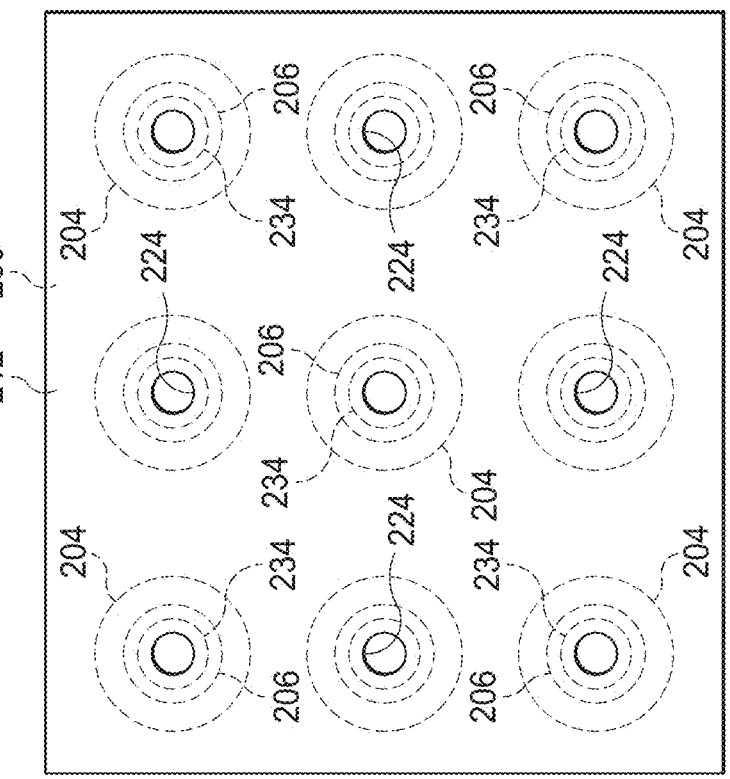
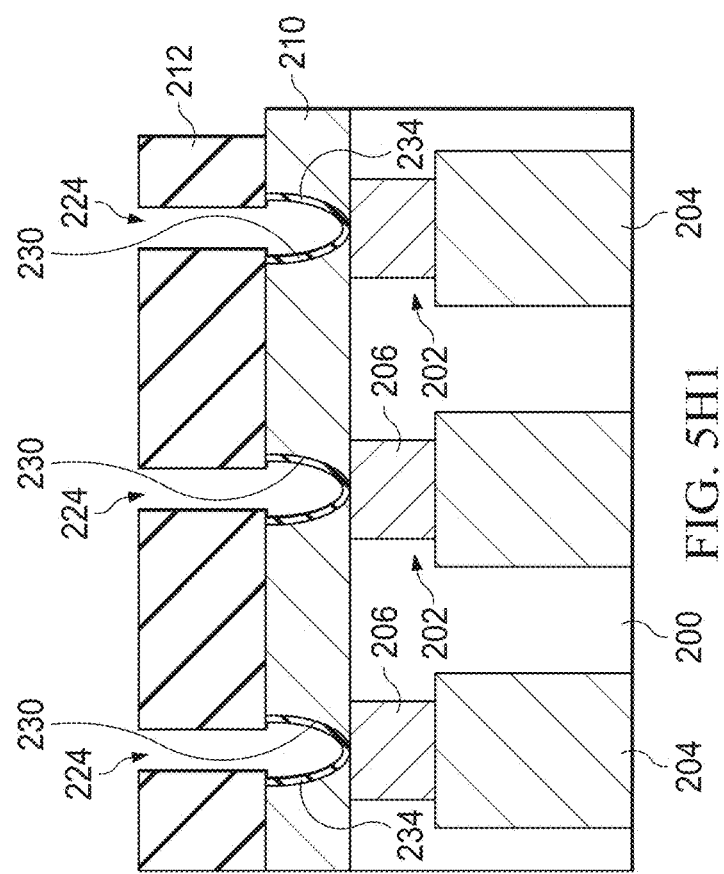
FIG. 5H2
FIG. 5H1

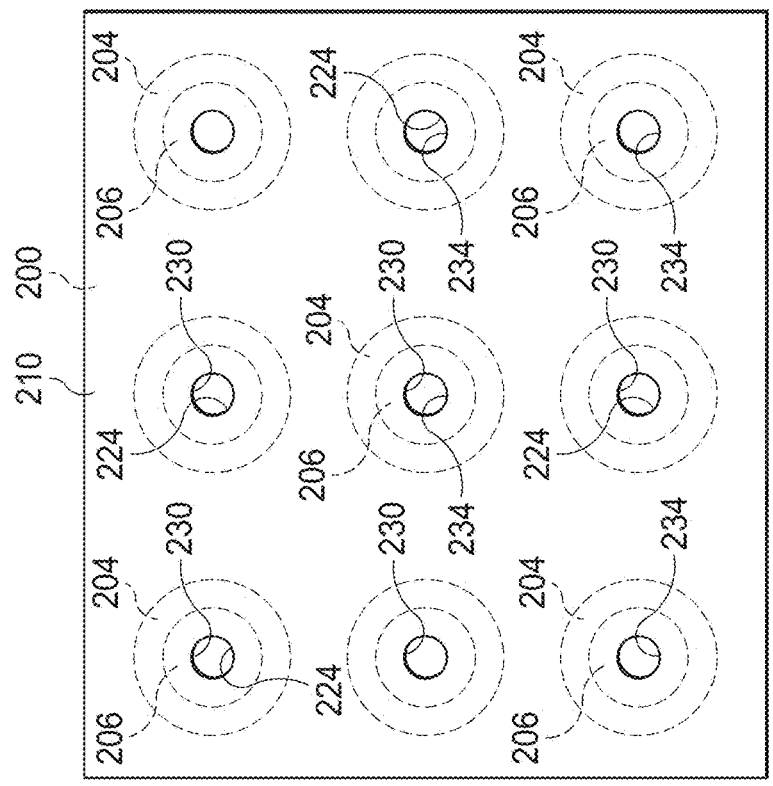
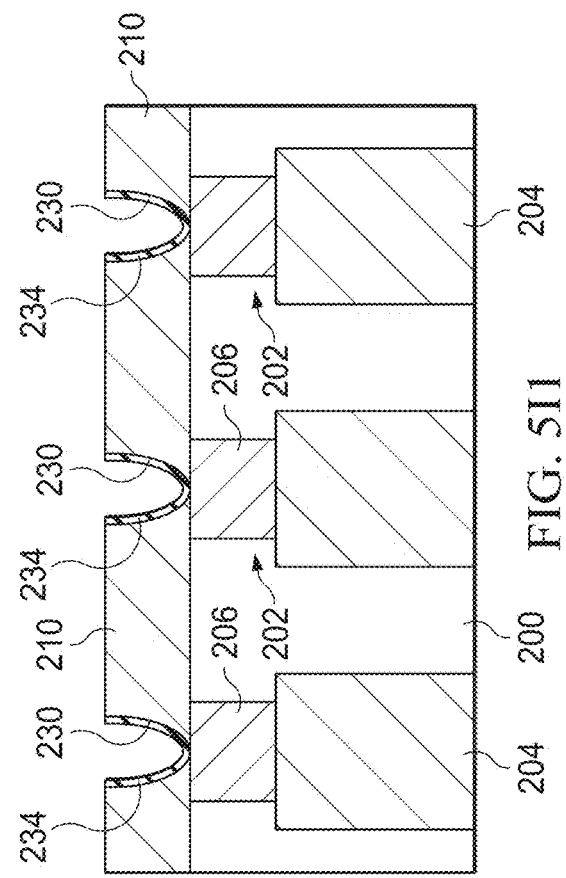
FIG. 5I2
FIG. 5I1

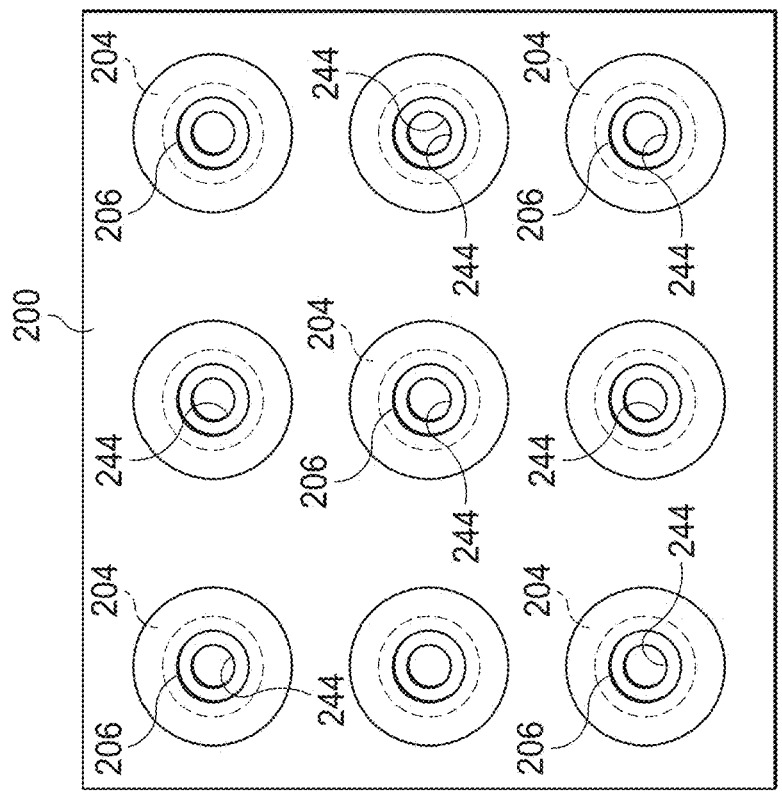

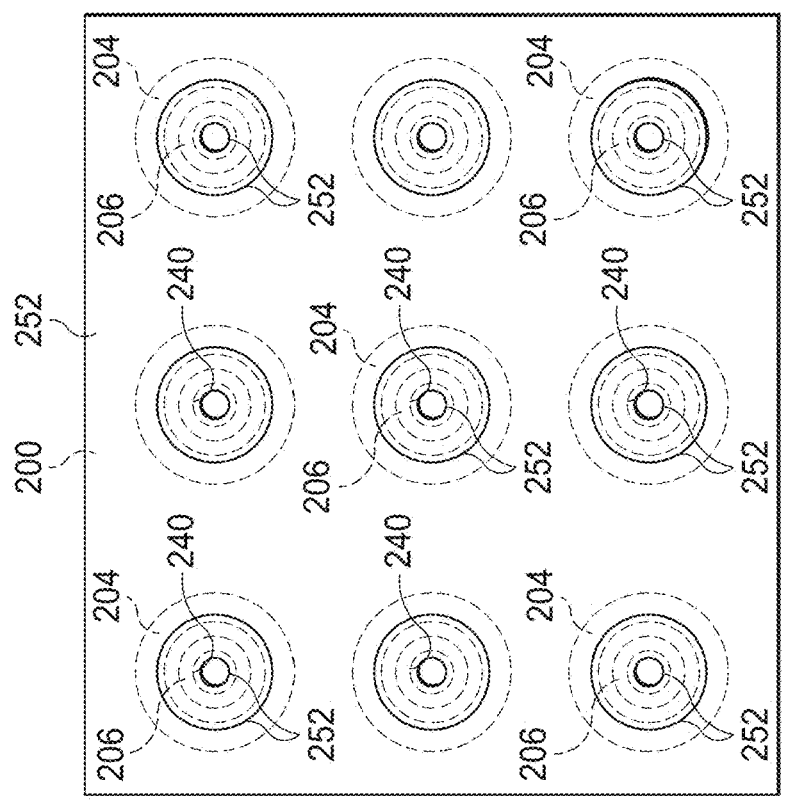
FIG. 5K2
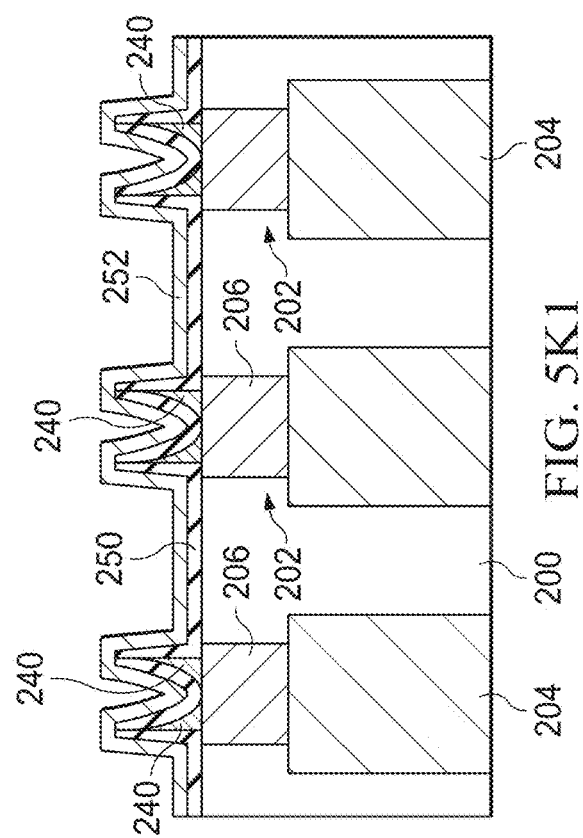
FIG. 5K1

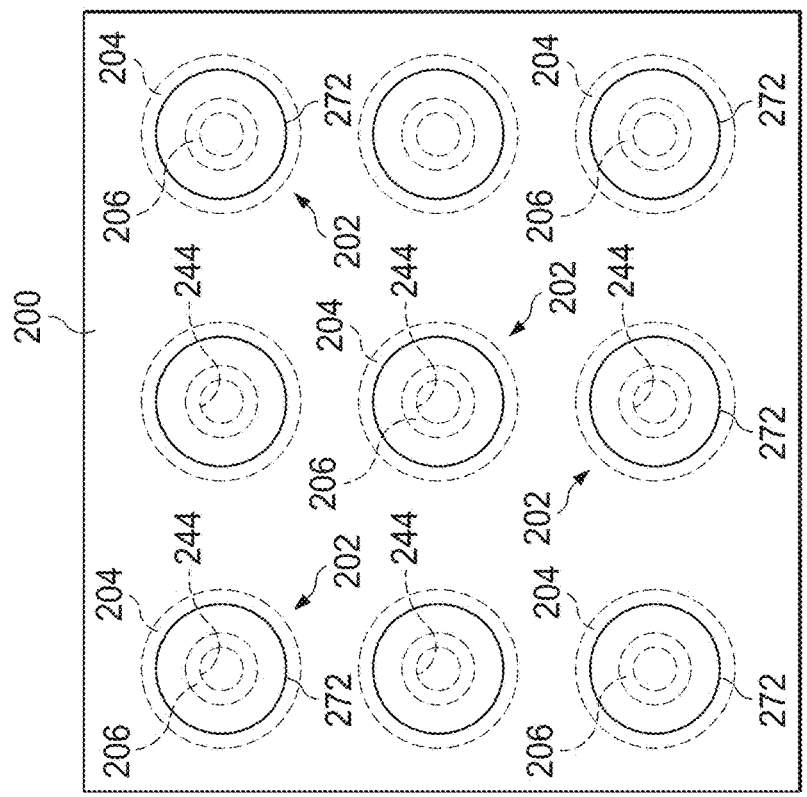
FIG. 5L2
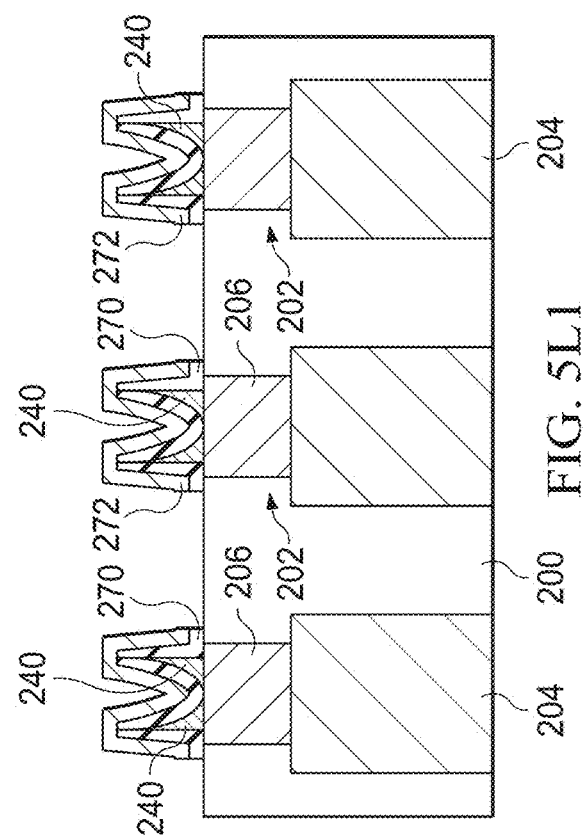
FIG. 5L1

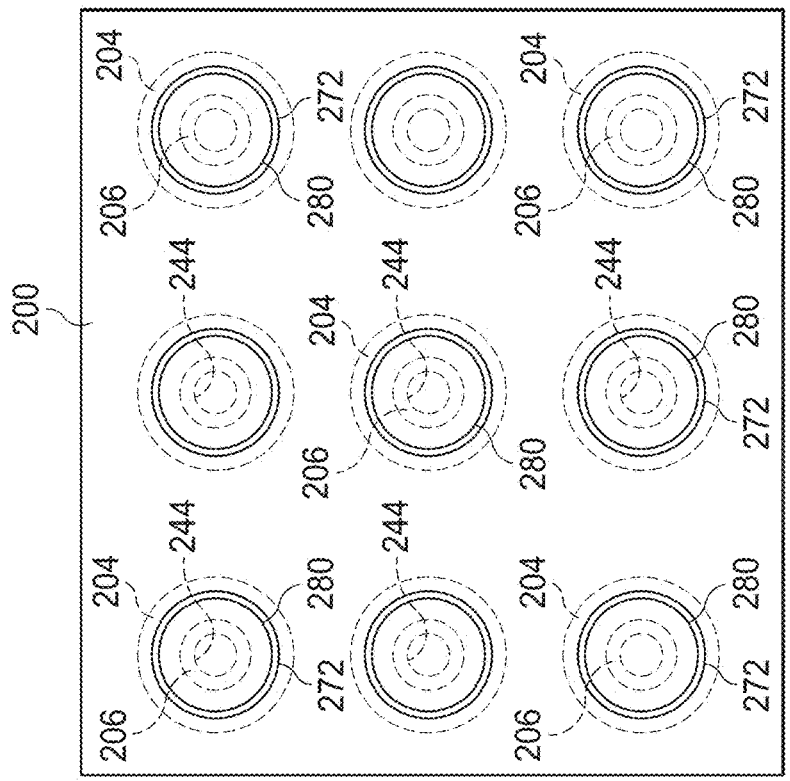
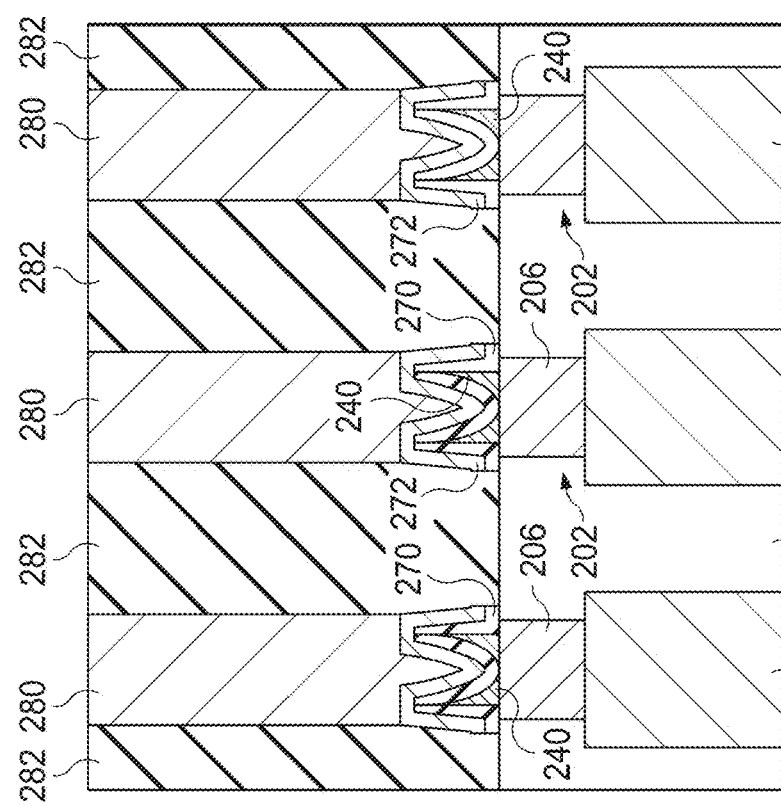
FIG. 5M1
FIG. 5M2

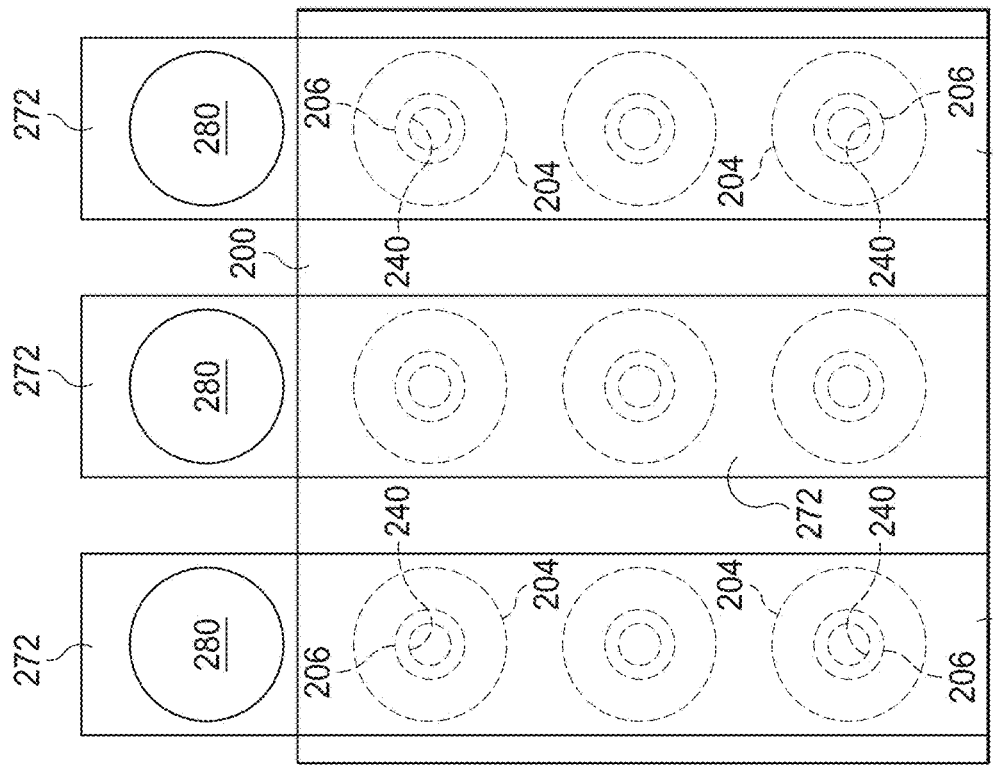
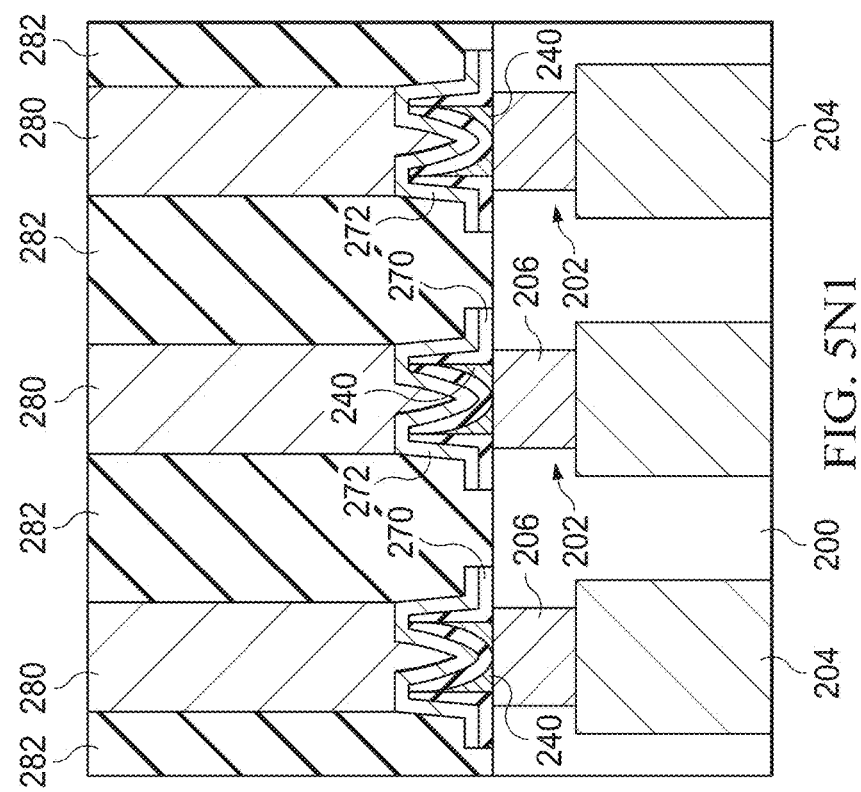
FIG. 5N1
FIG. 5N2

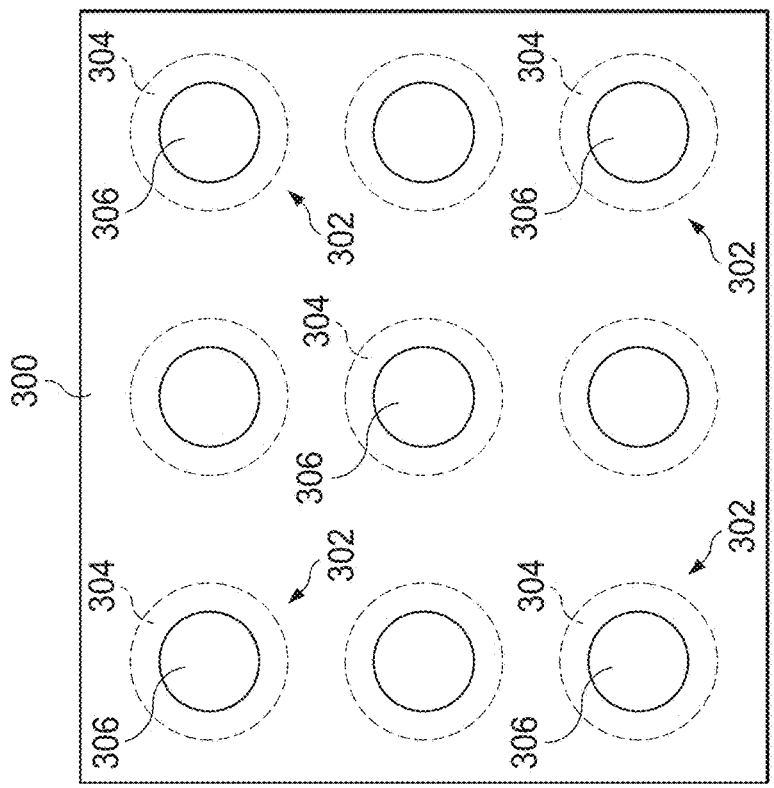
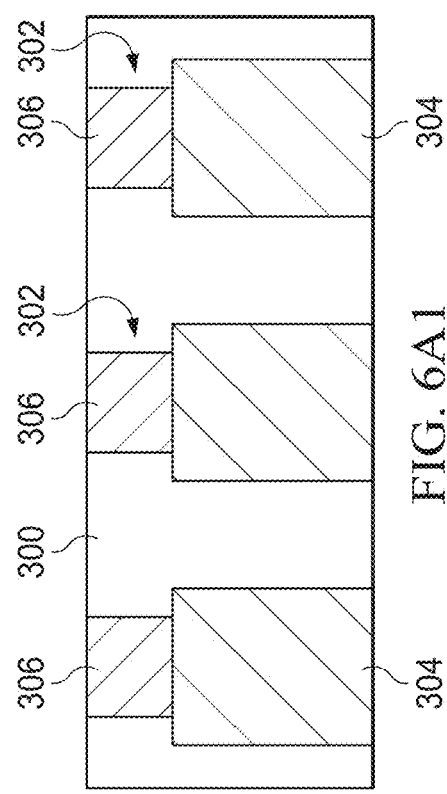
FIG. 6A2
FIG. 6A1

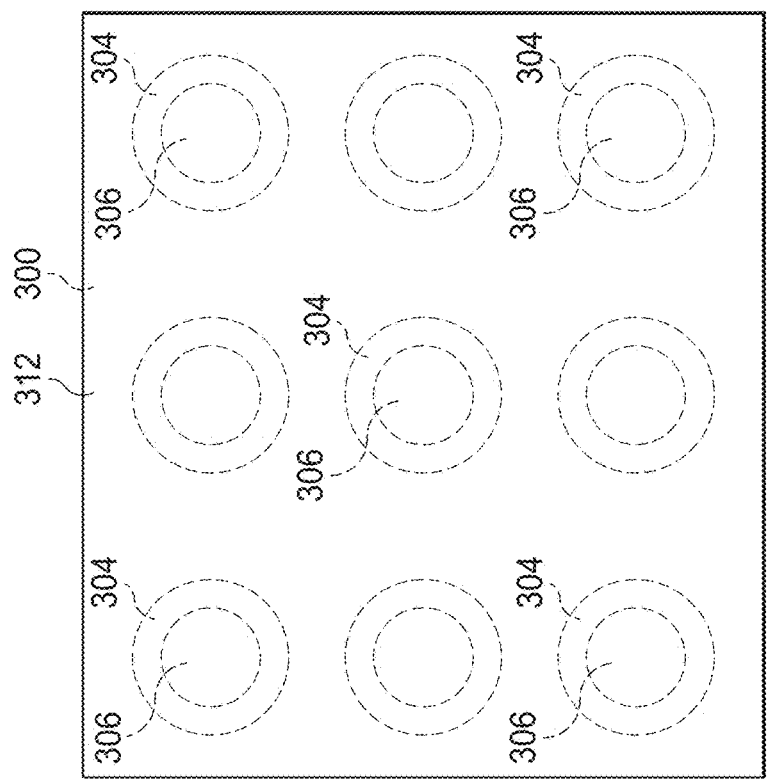
FIG. 6B2
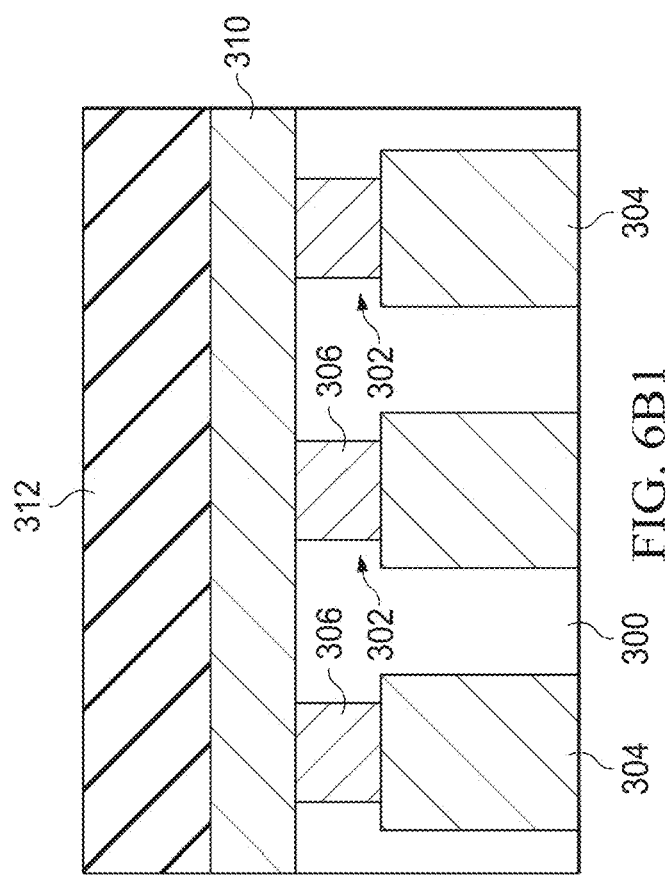
FIG. 6B1

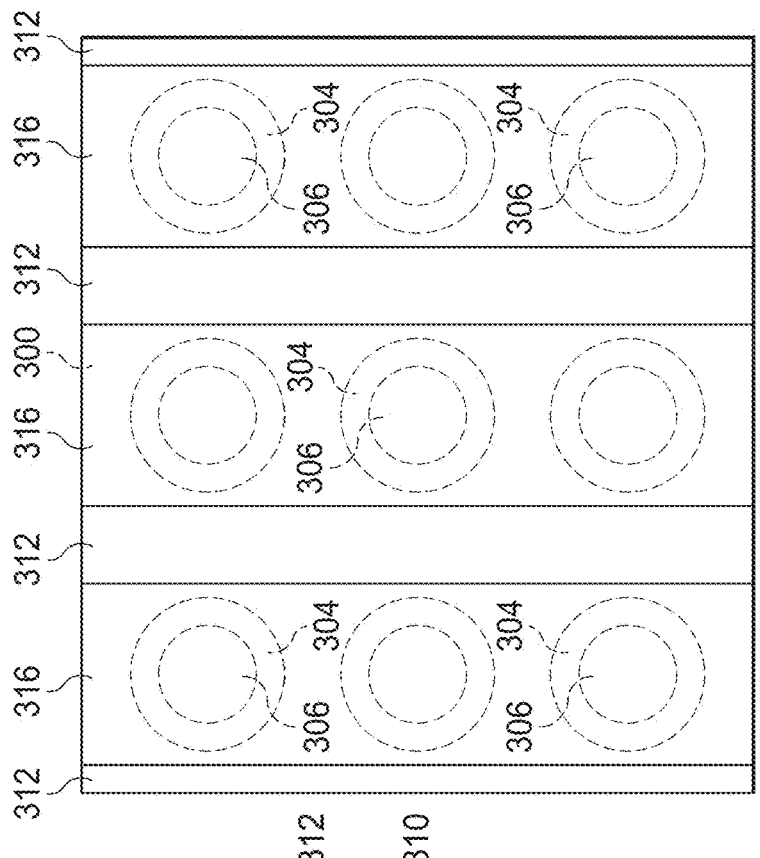
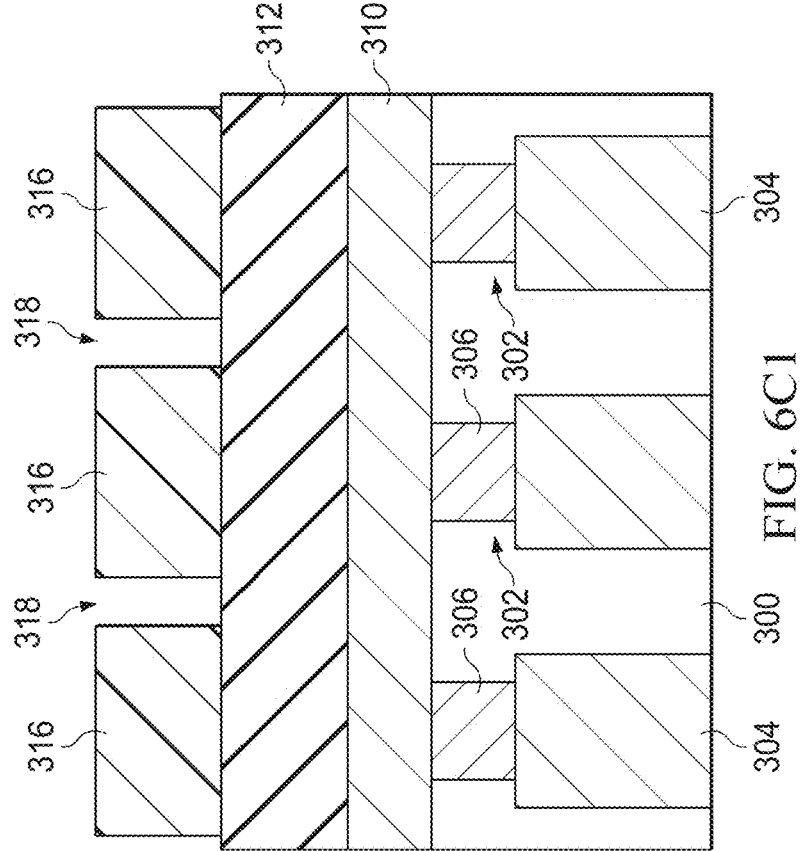
FIG. 6C2
FIG. 6C1

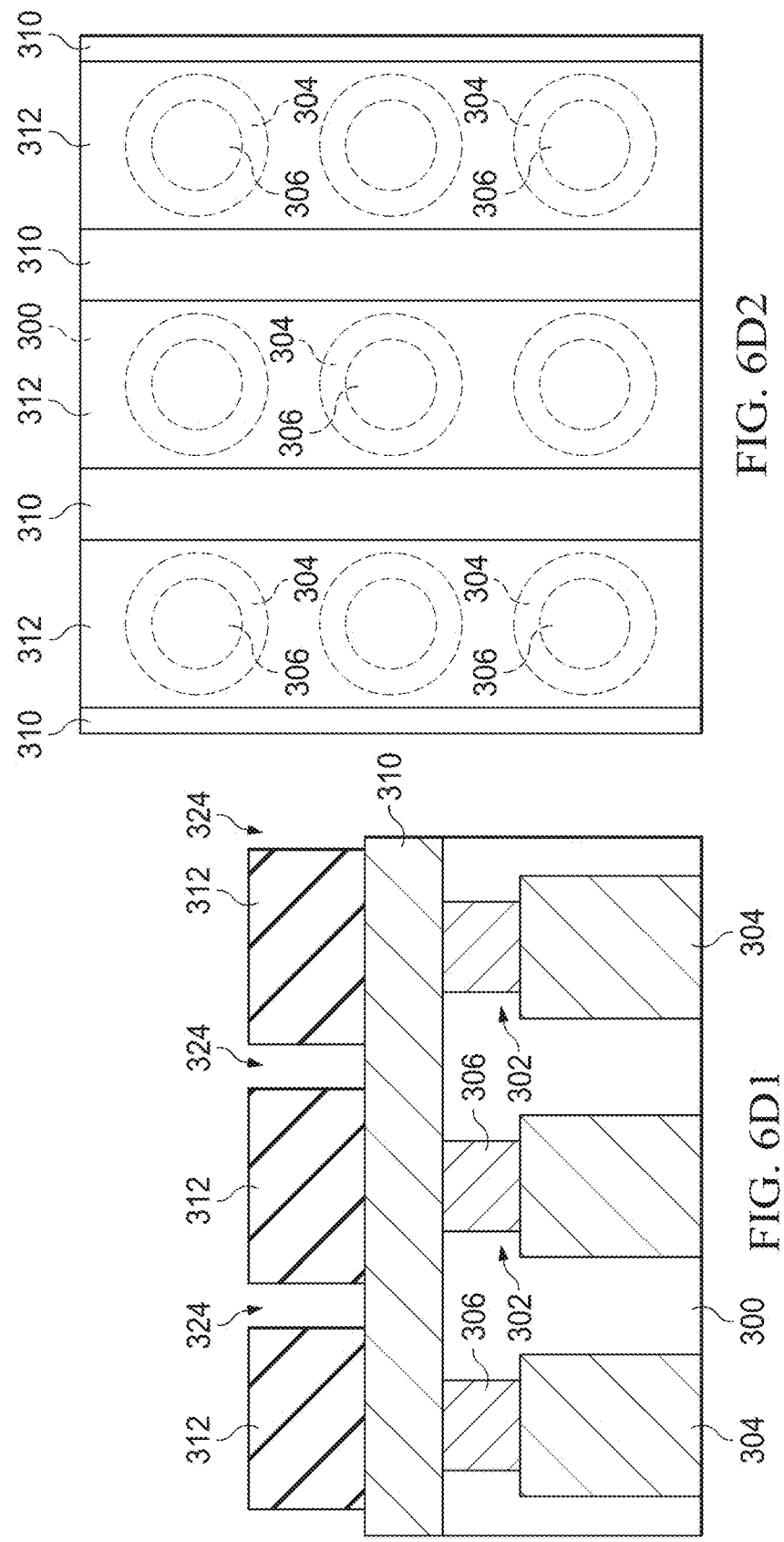

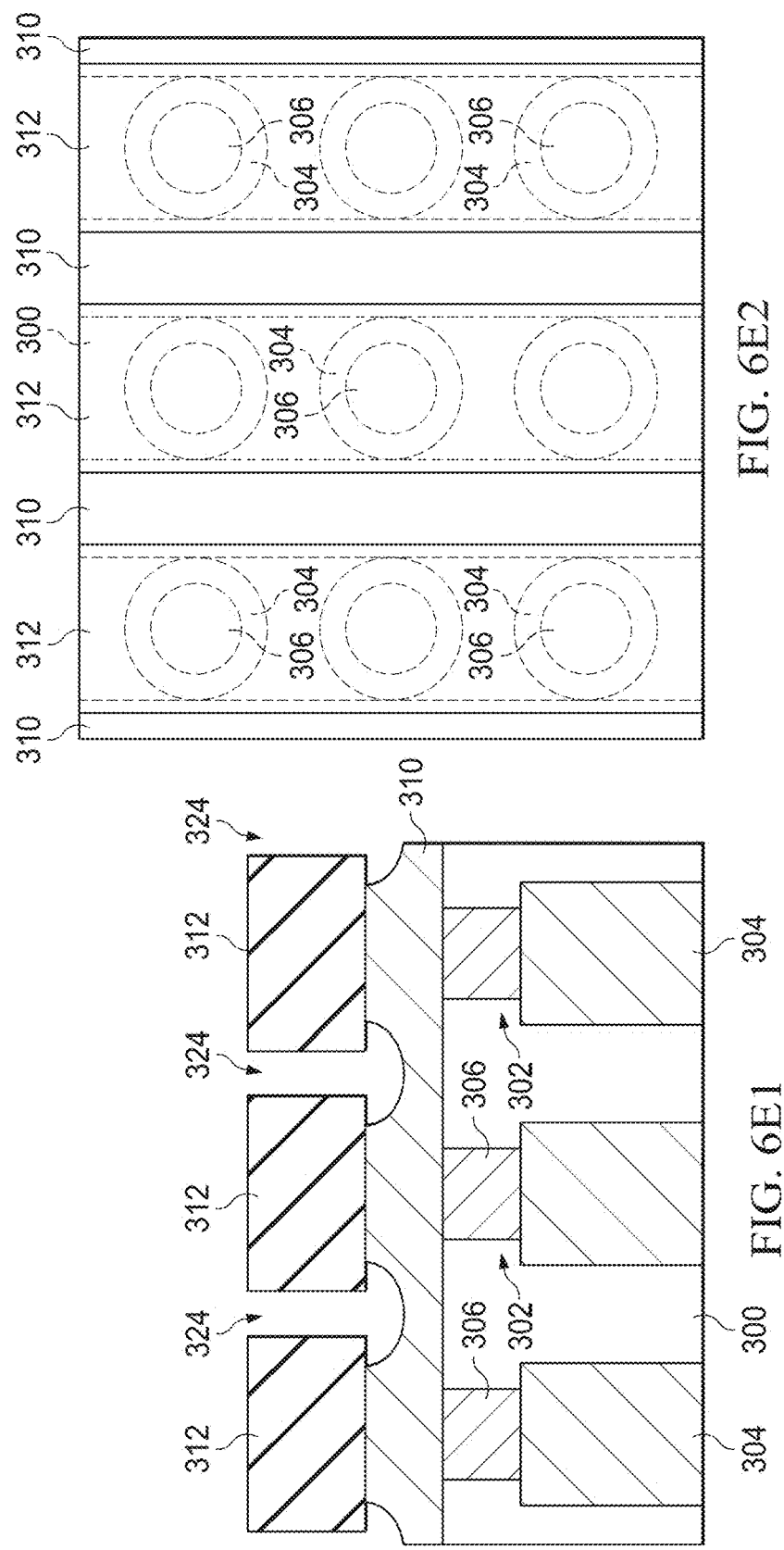

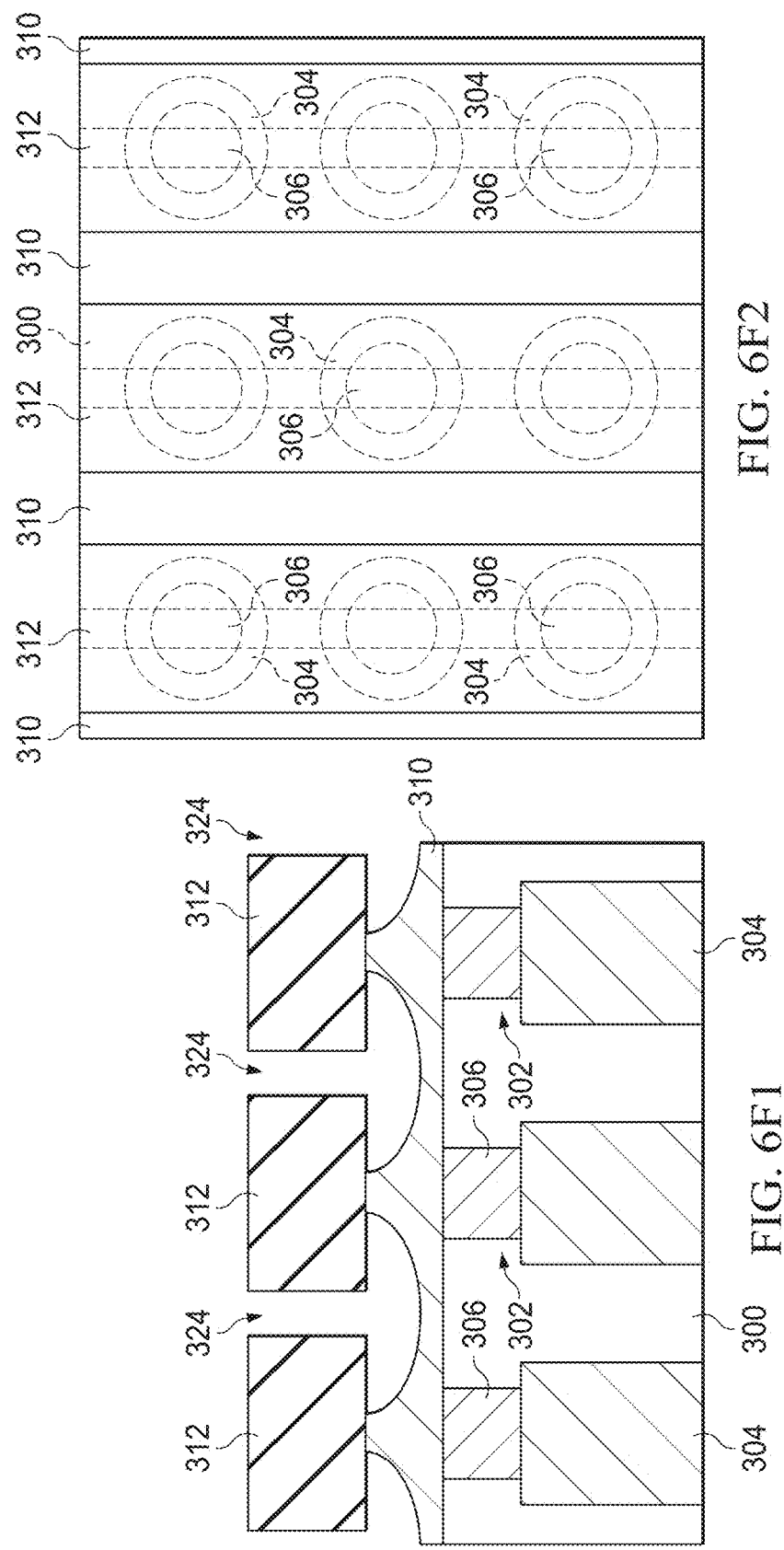

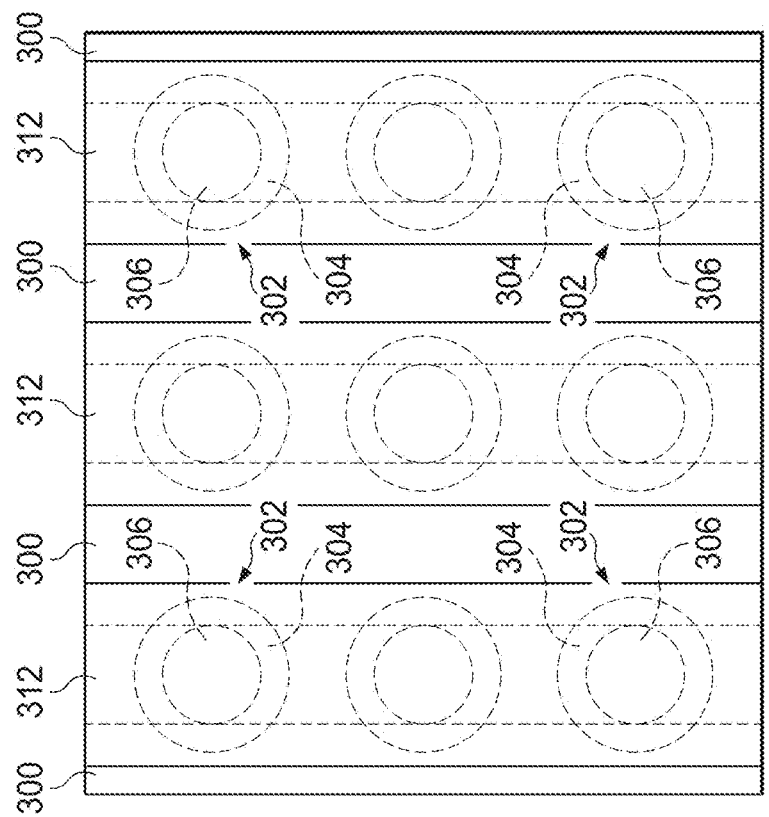
FIG. 6G2
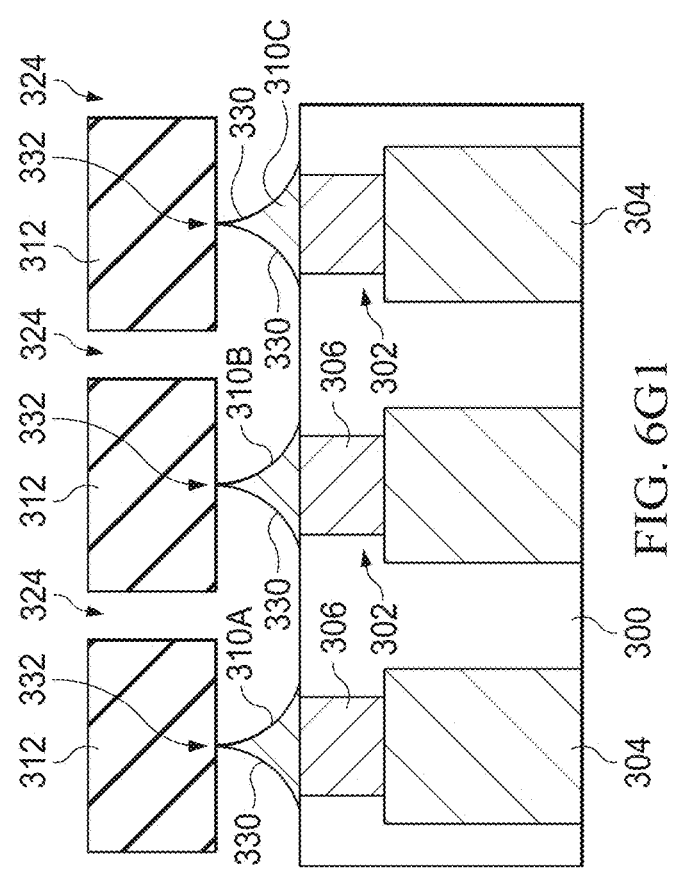
FIG. 6G1

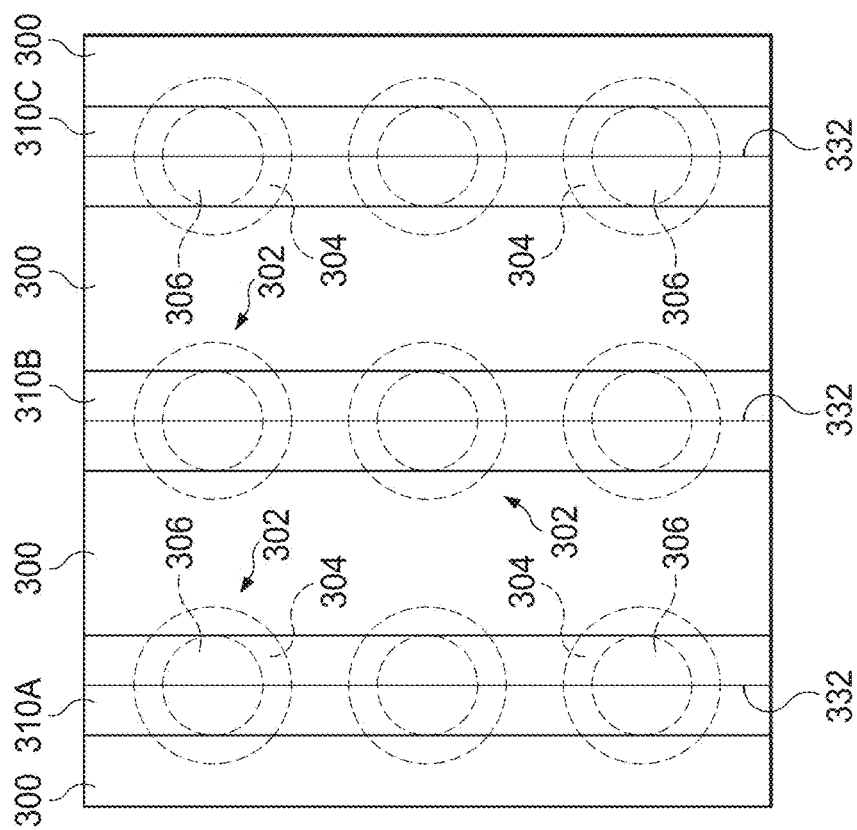
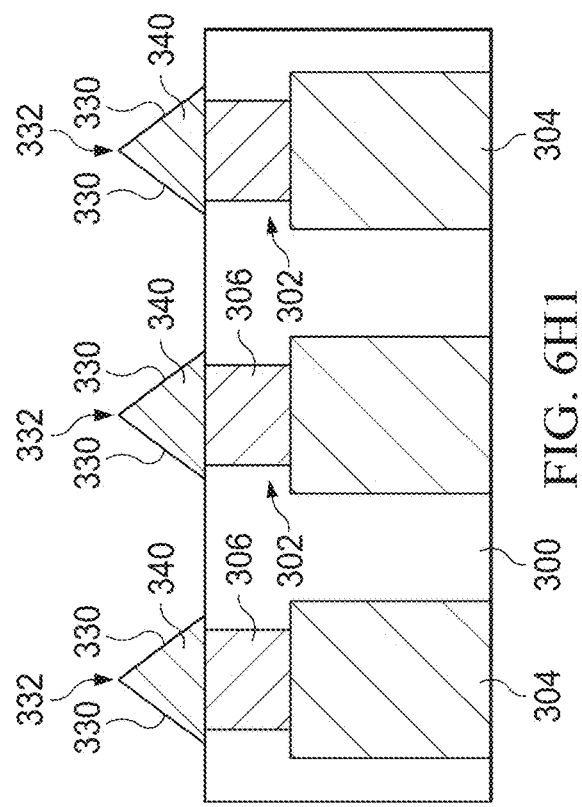
FIG. 6H2
FIG. 6H1

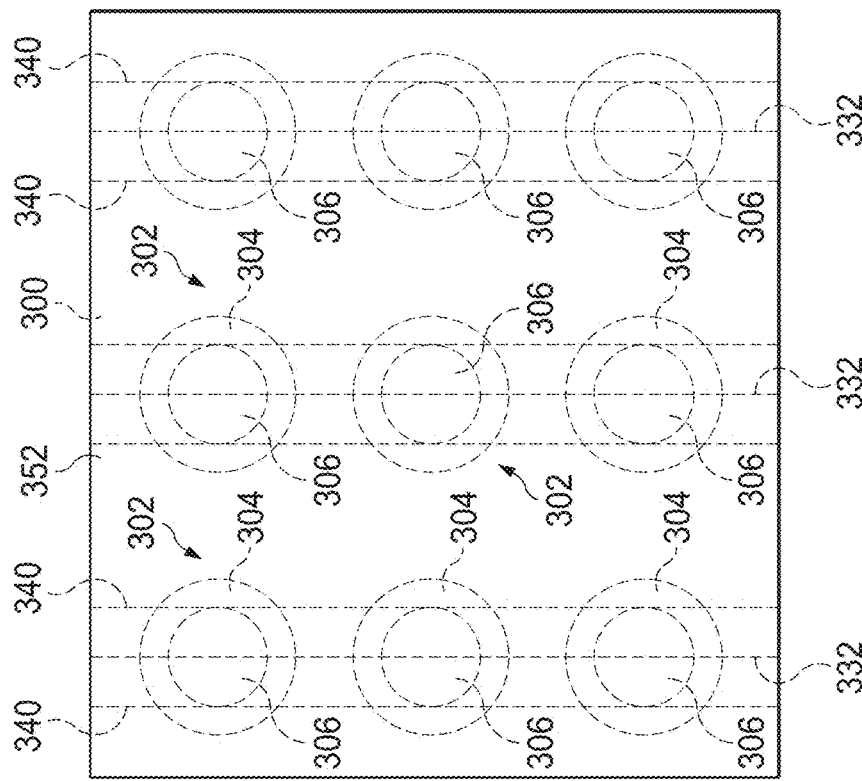
FIG. 6I2
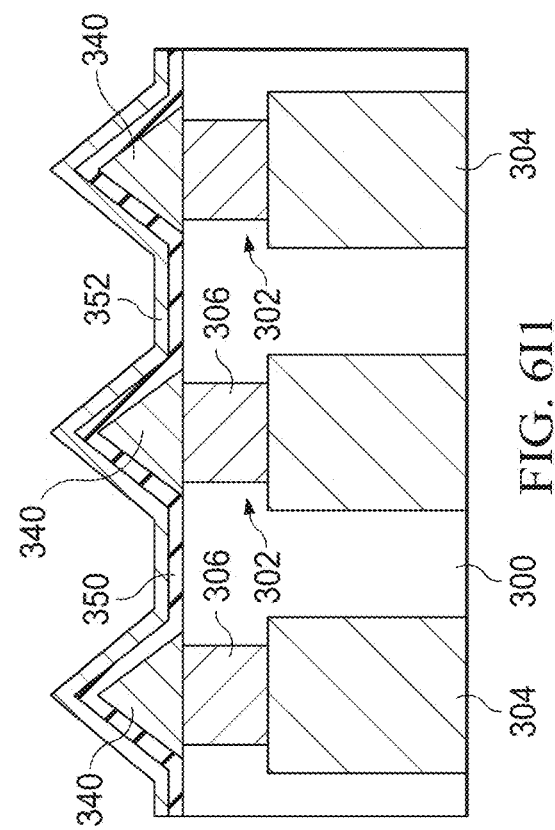
FIG. 6I1

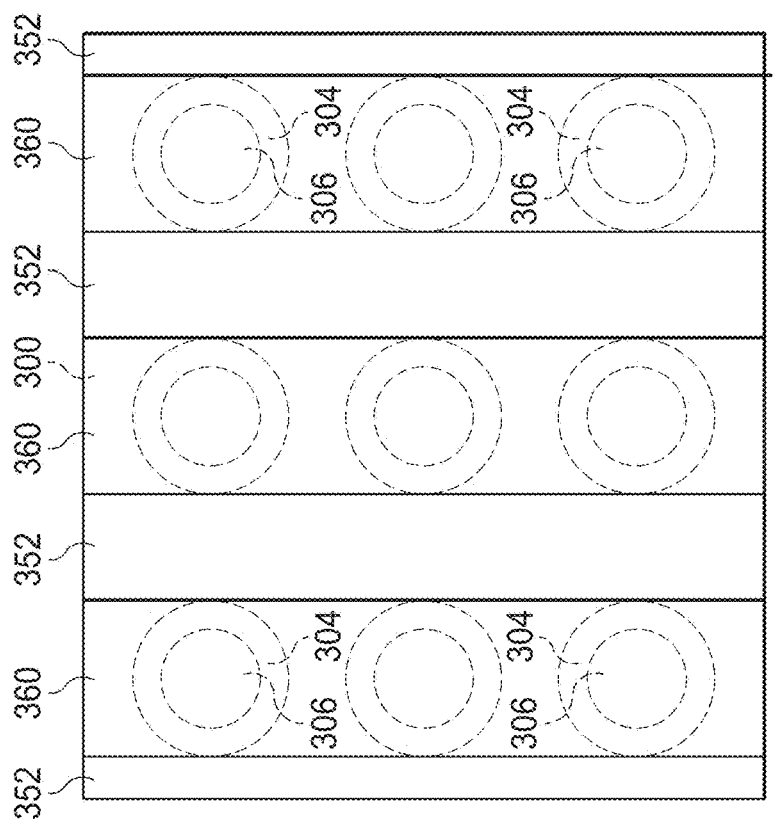
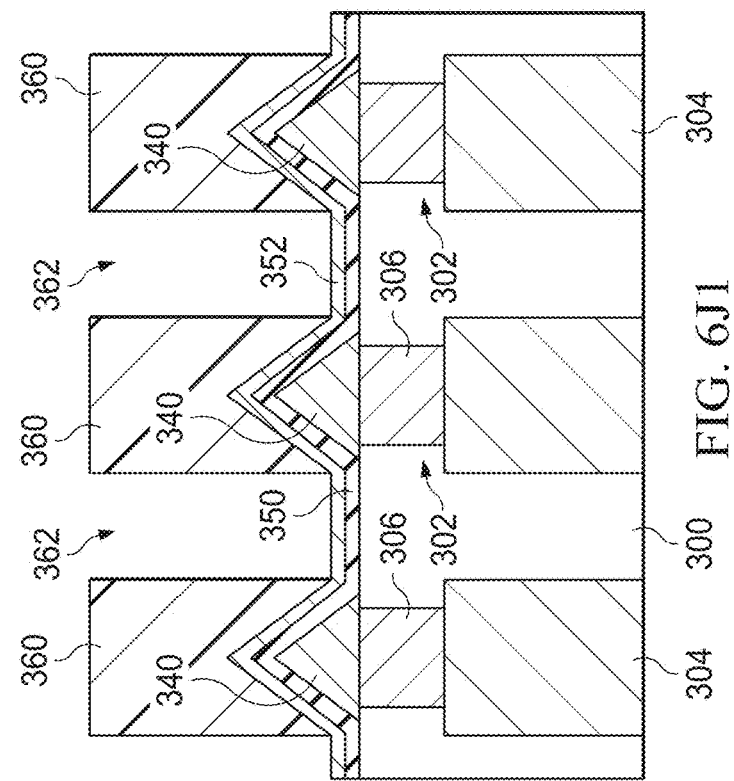
FIG. 6J2
FIG. 6J1

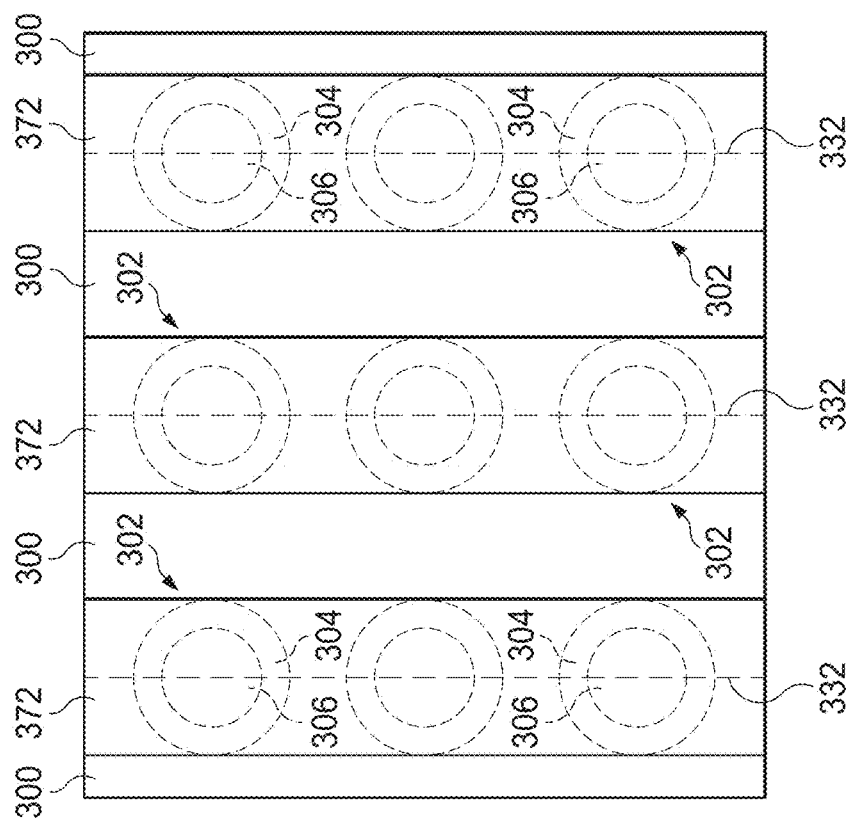
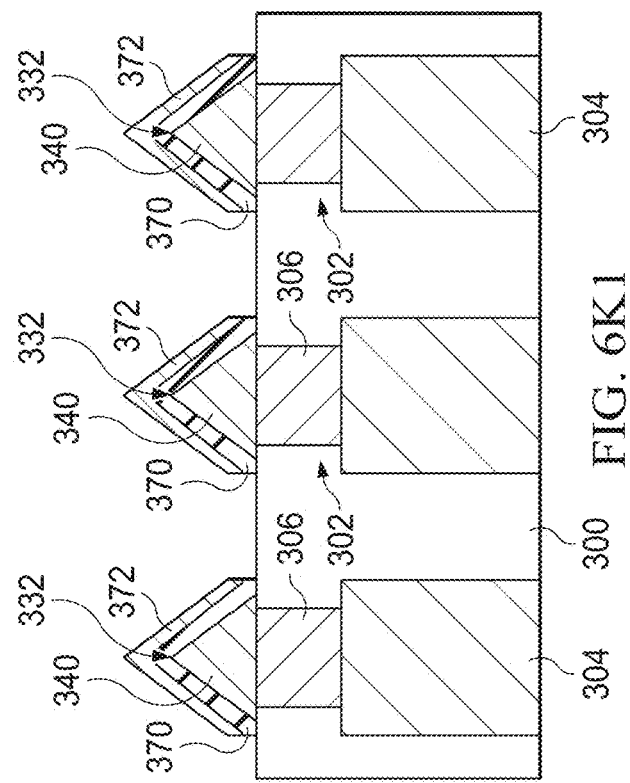
FIG. 6K2
FIG. 6K1

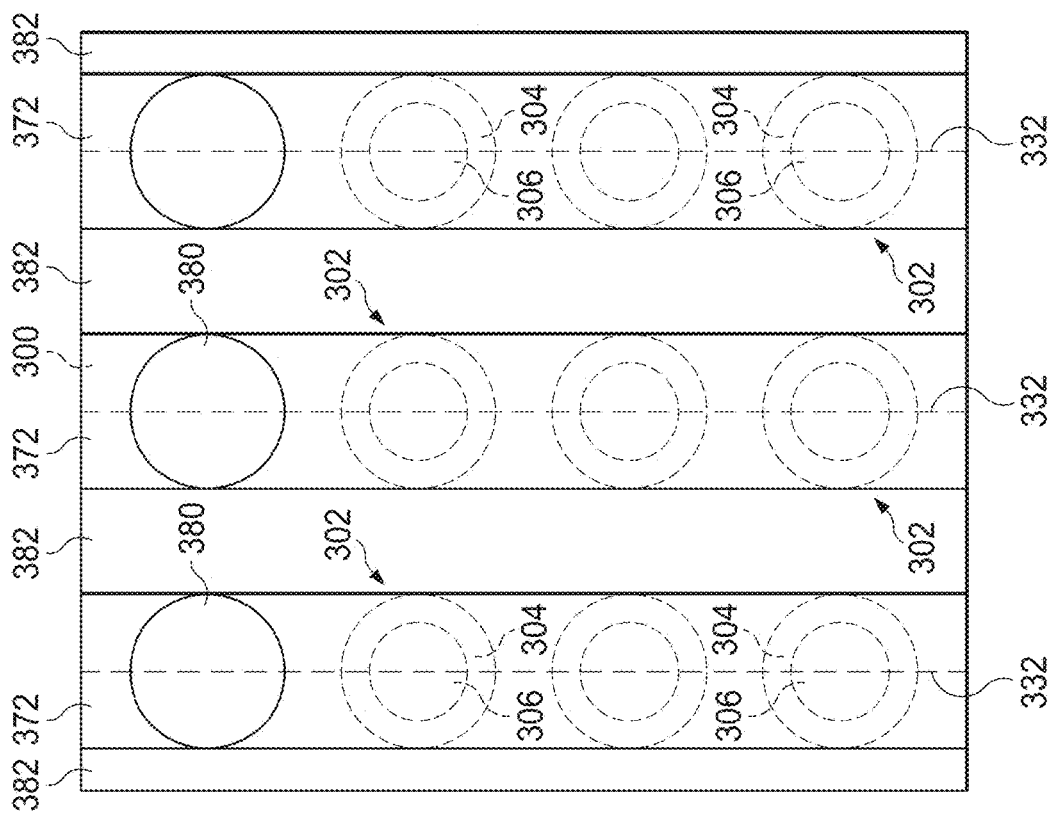
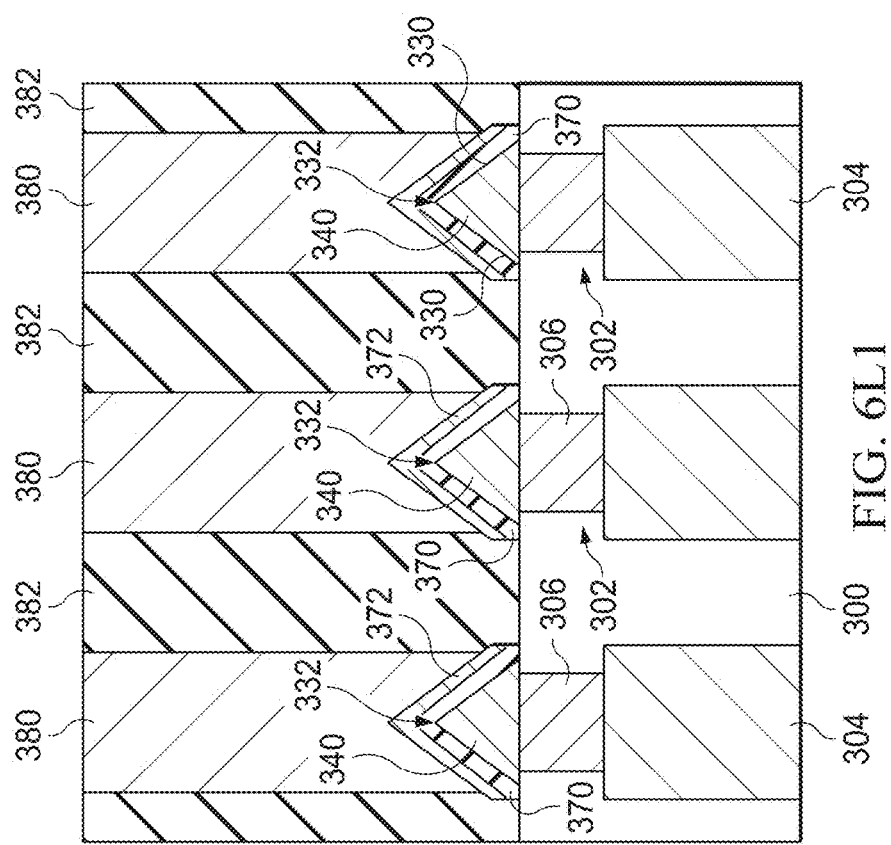
FIG. 6L2
FIG. 6L1

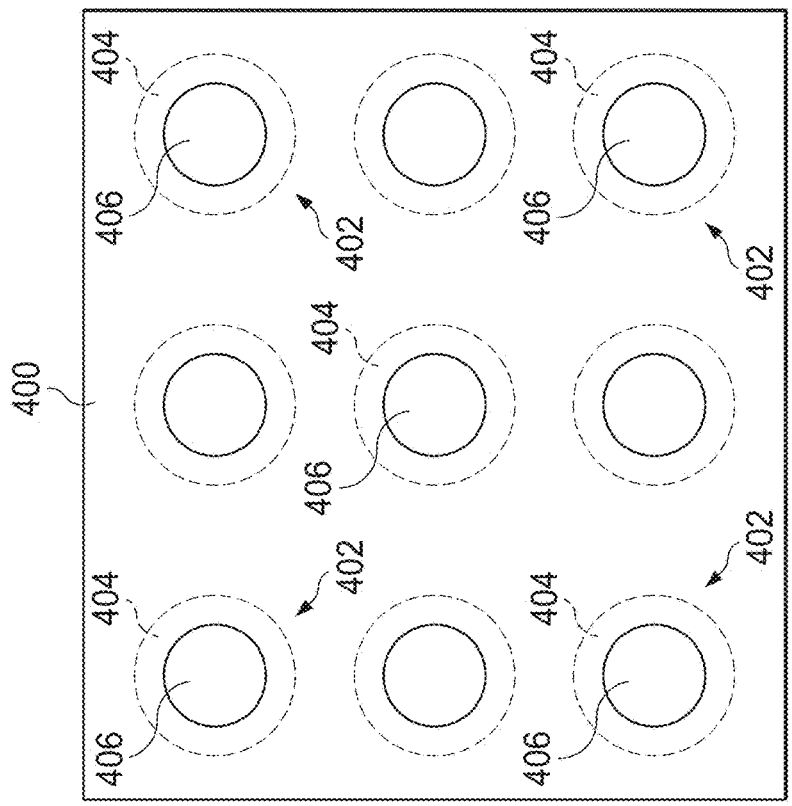
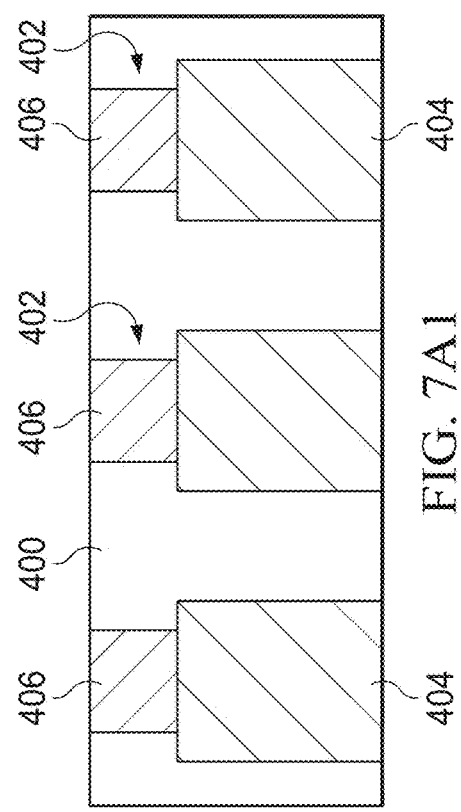

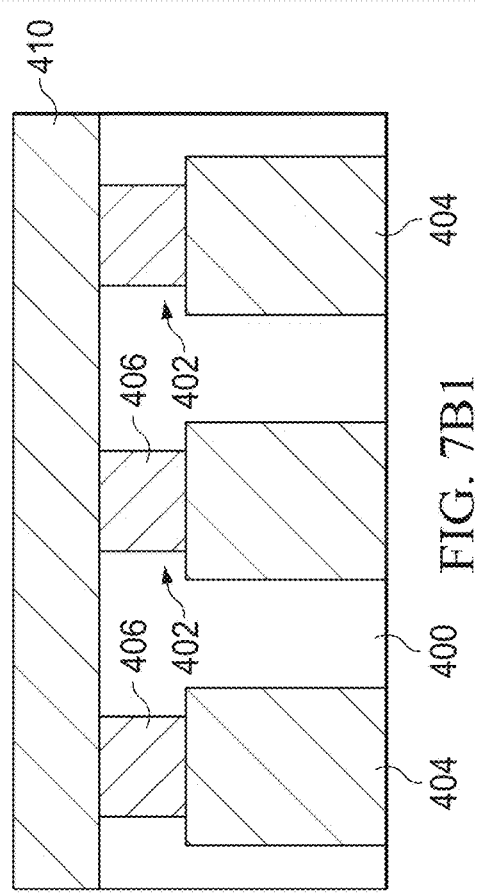
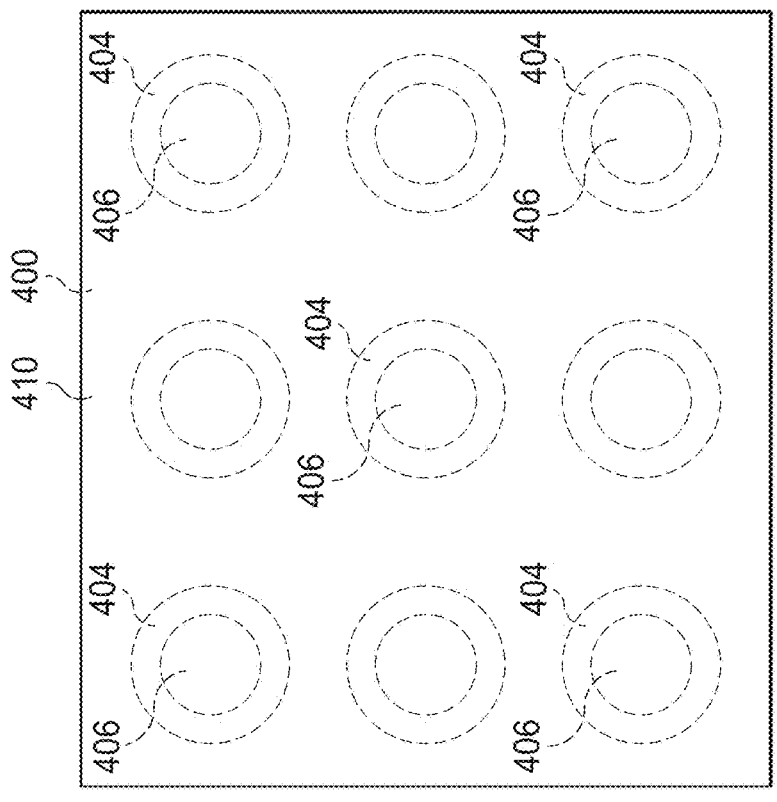
FIG. 7B1
FIG. 7B2

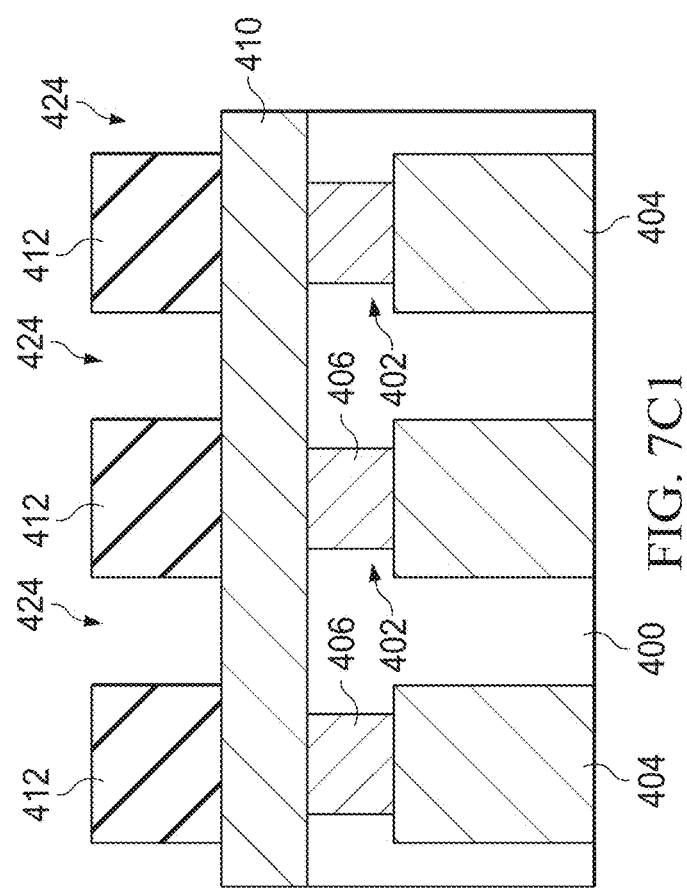
FIG. 7C2
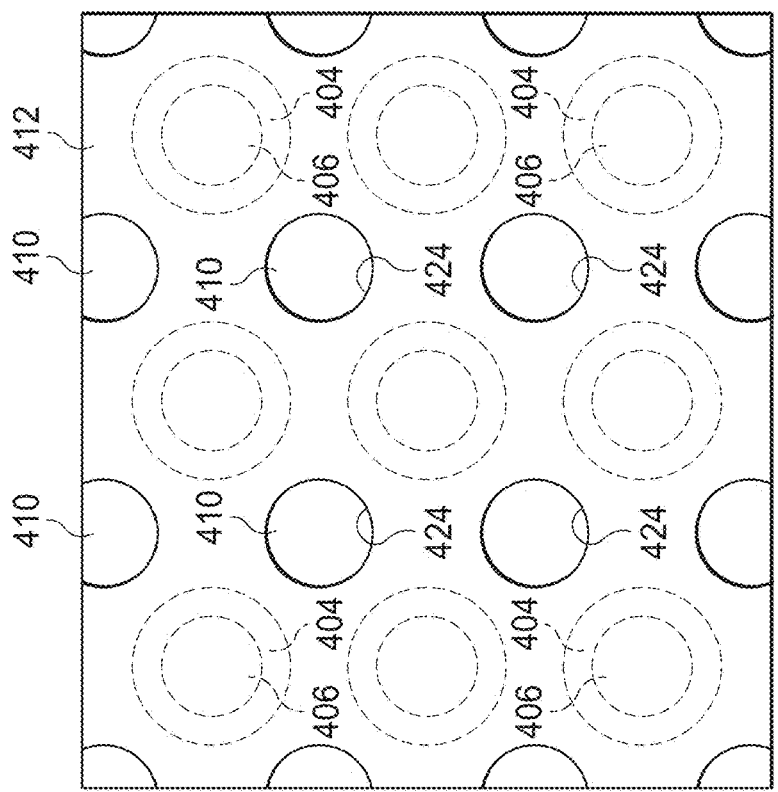
FIG. 7C1

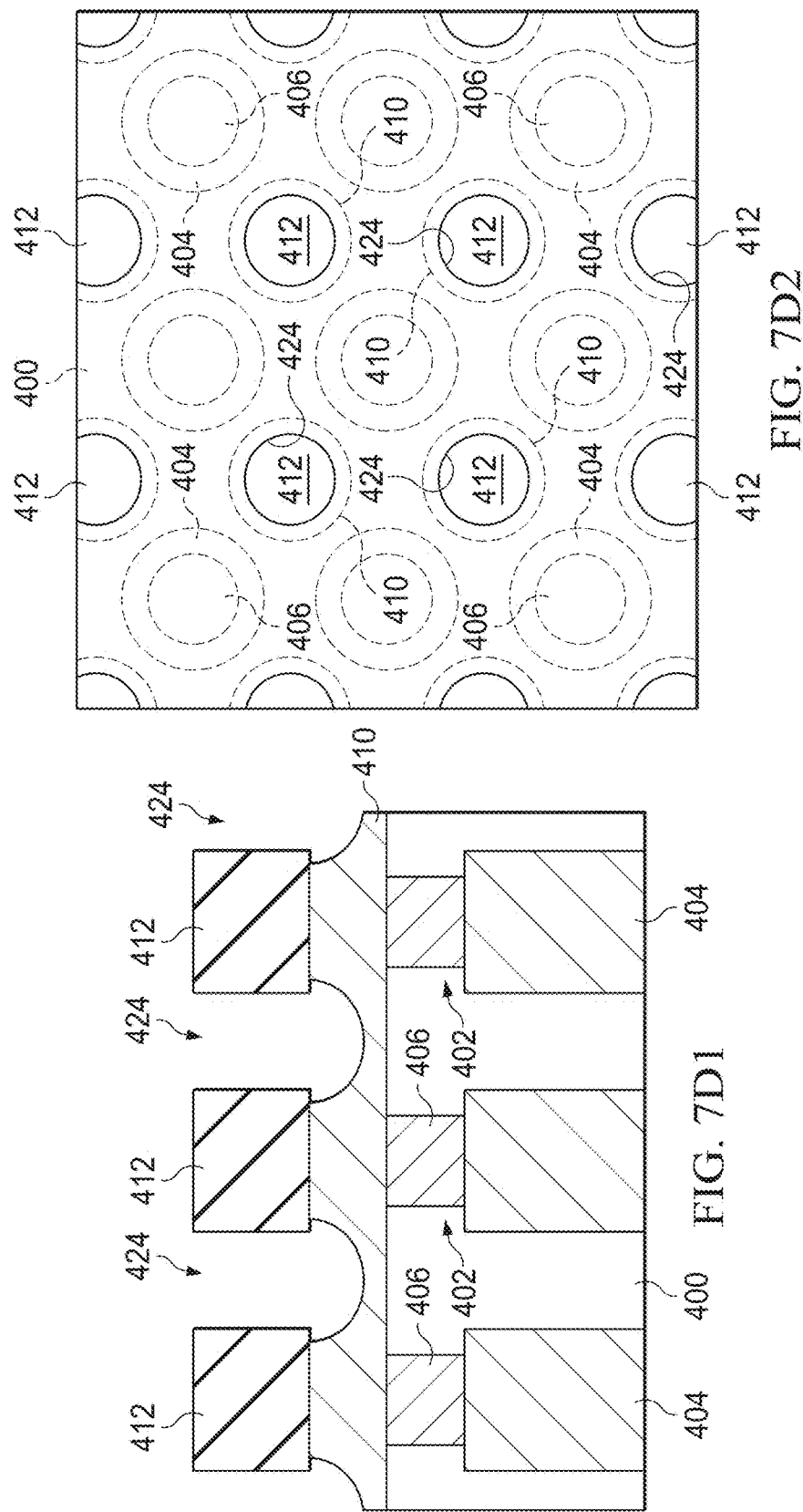

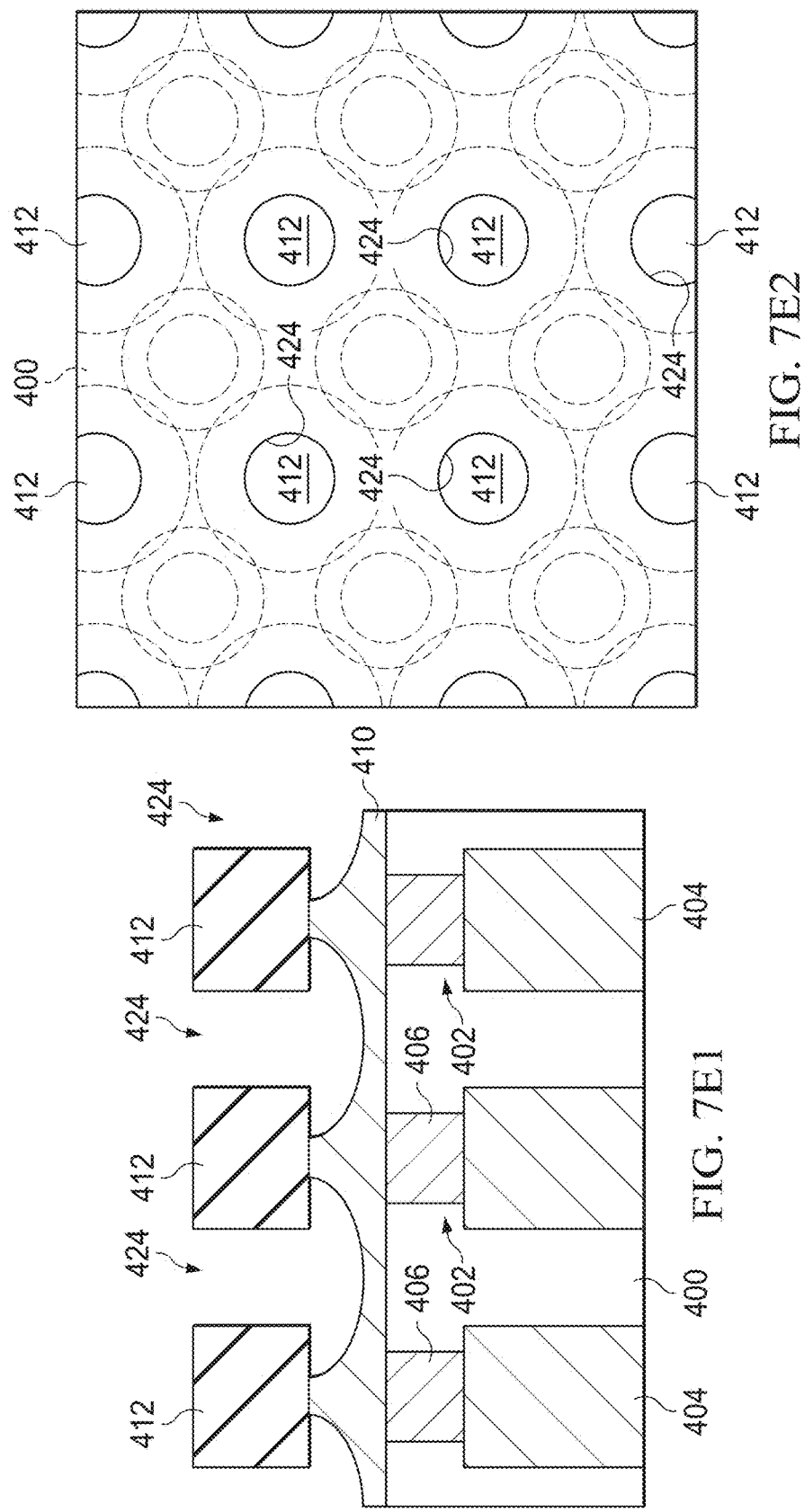

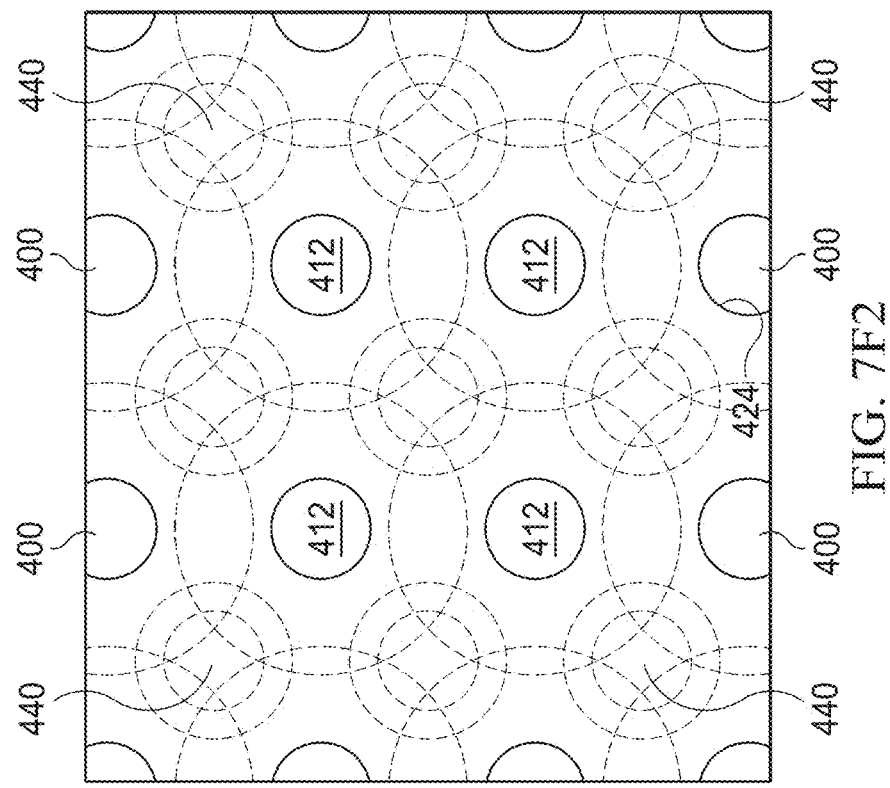
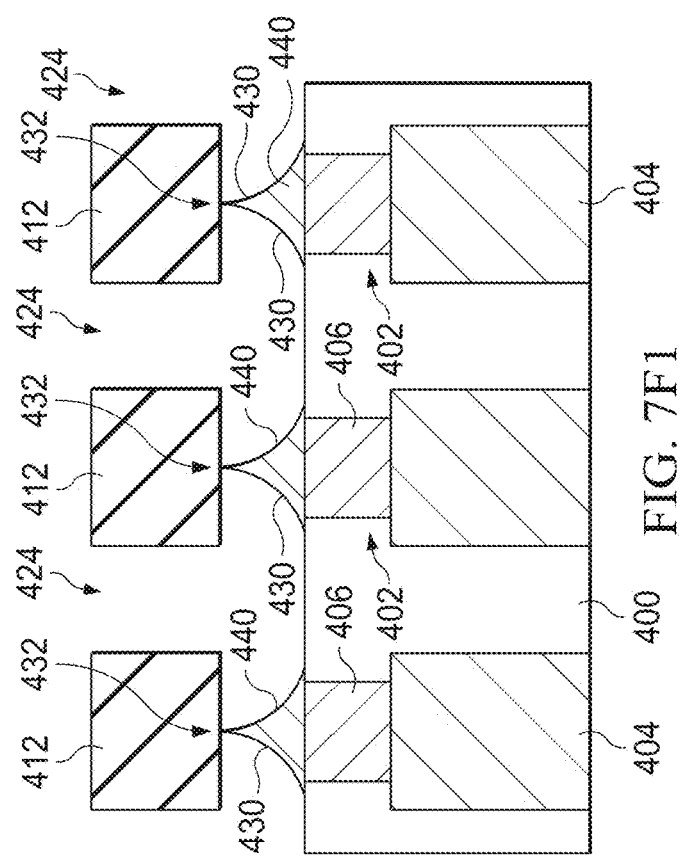
FIG. 7F2
FIG. 7F1

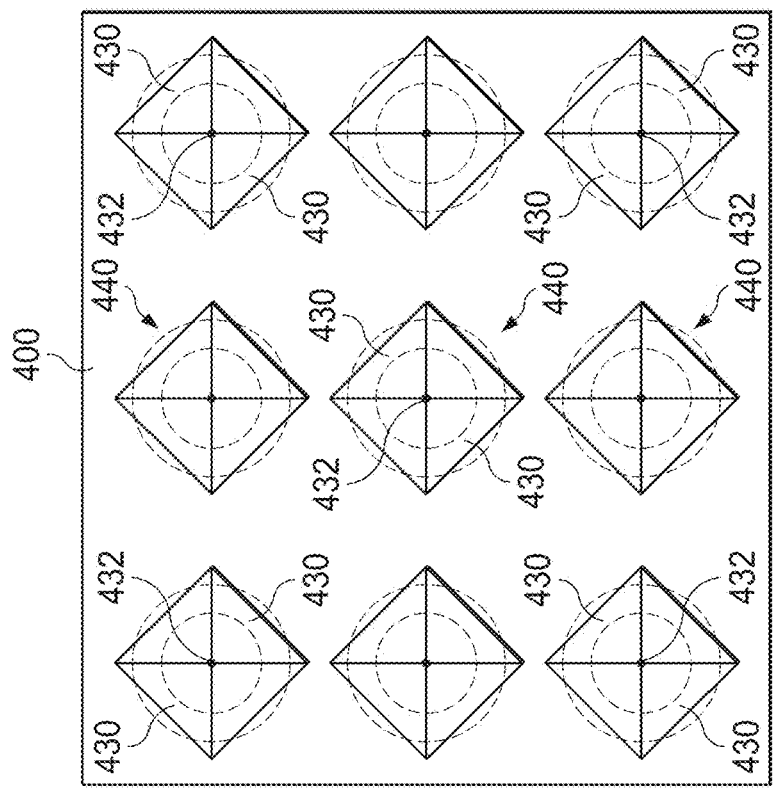
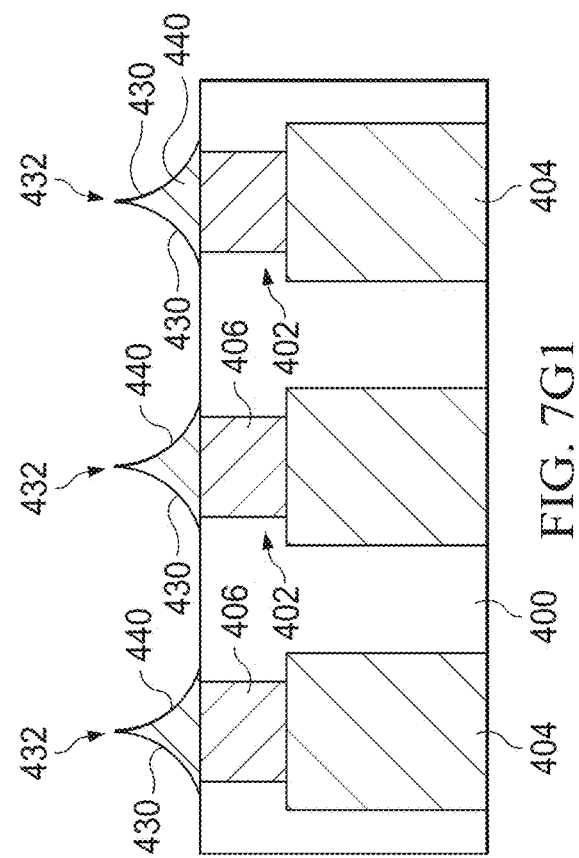
FIG. 7G2
FIG. 7G1

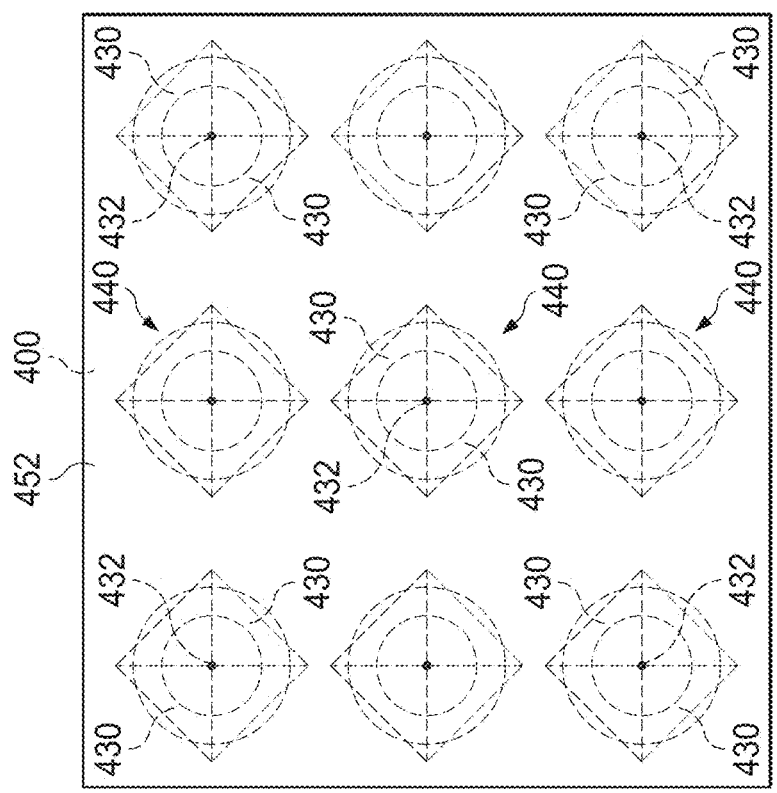
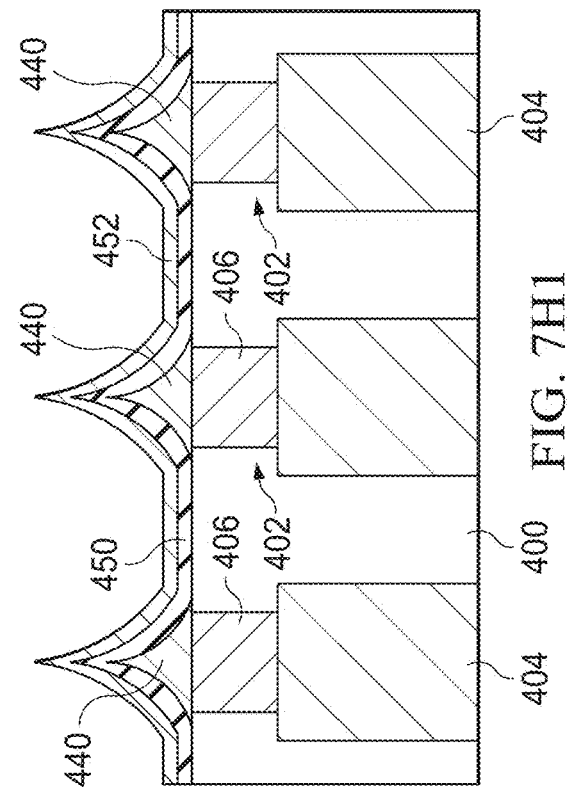
FIG. 7H2
FIG. 7H1

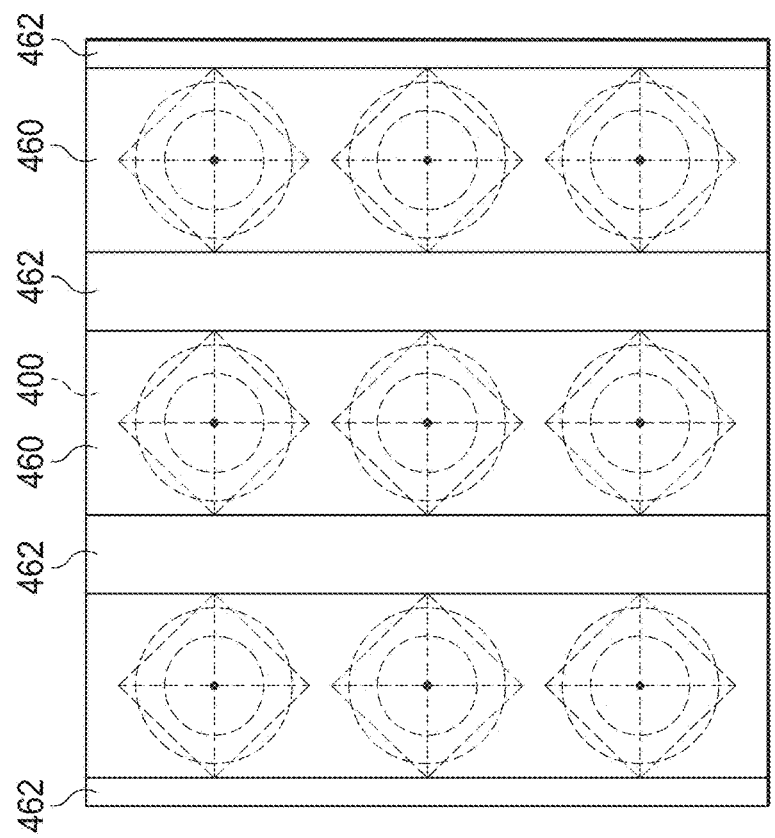
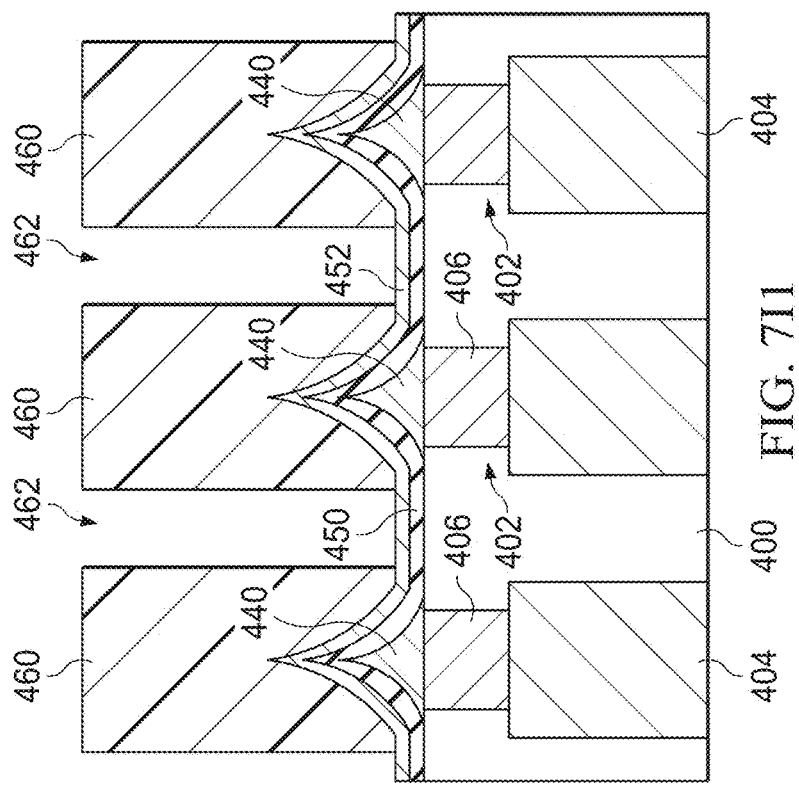
FIG. 7I2
FIG. 7I1

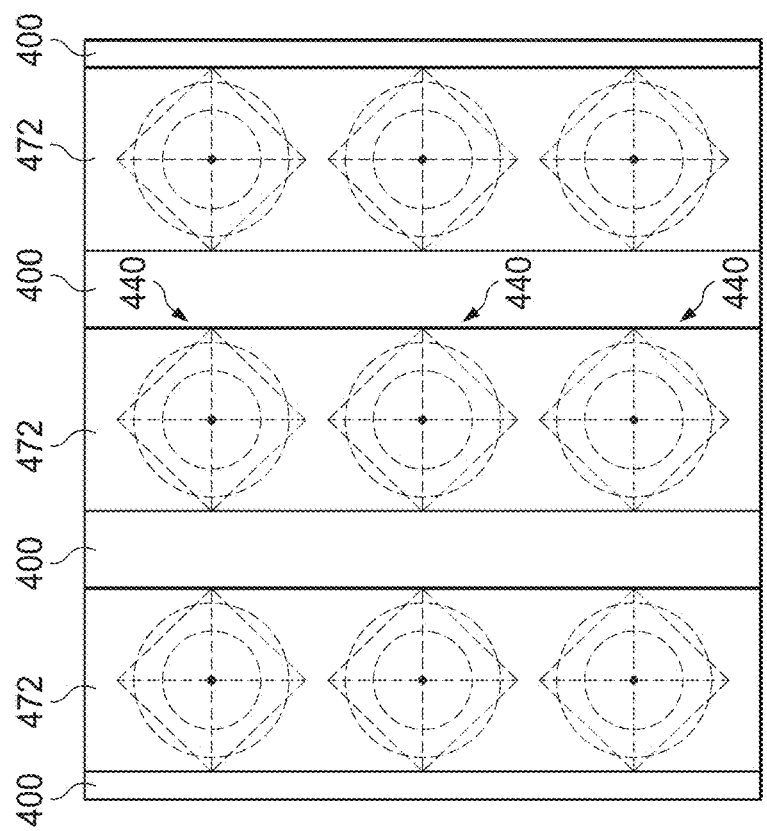
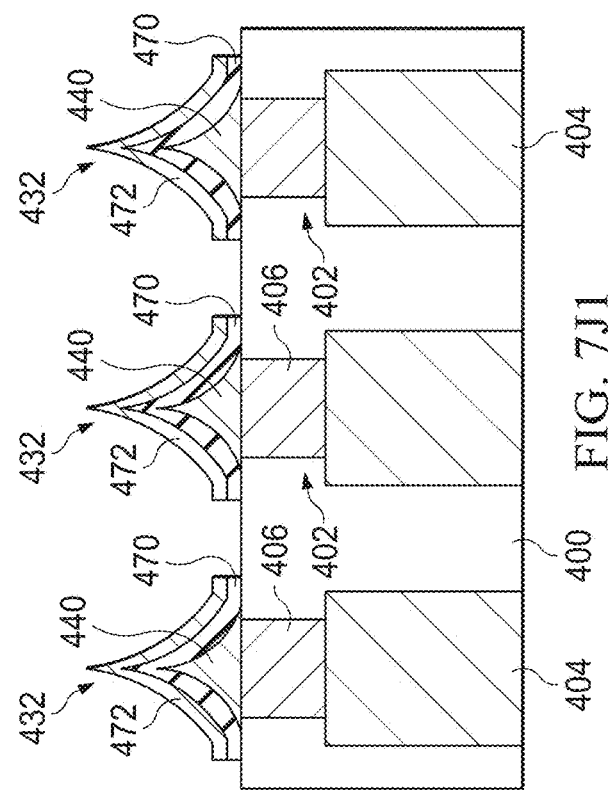
FIG. 7J2
FIG. 7J1

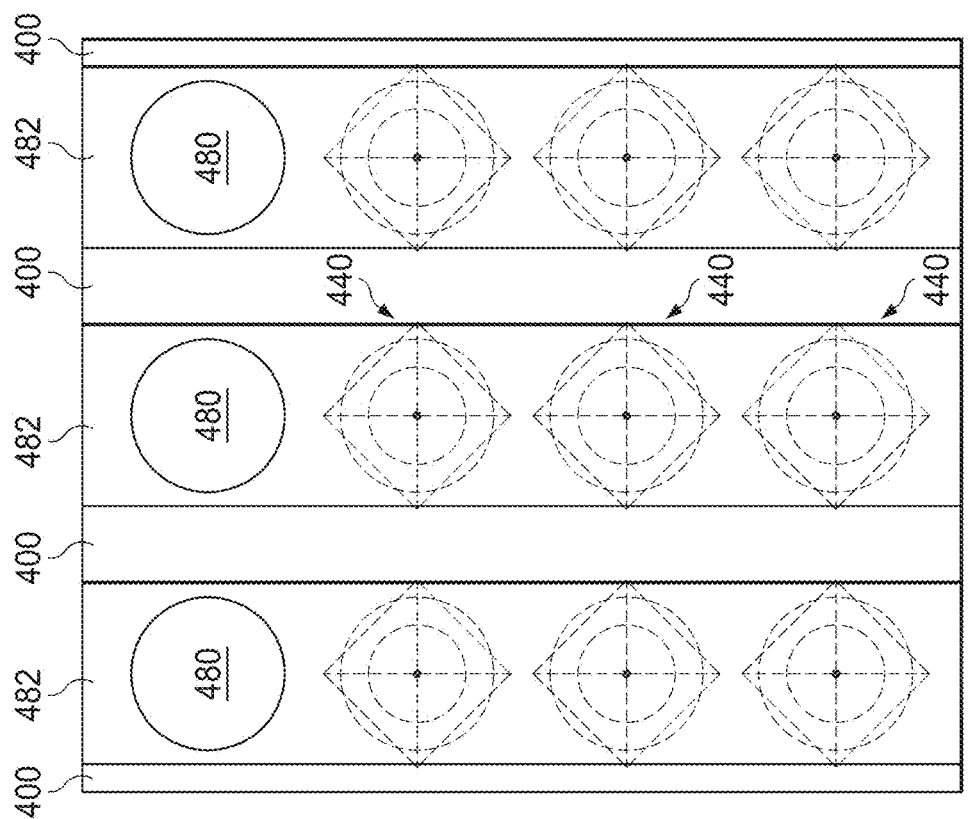
FIG. 7K2
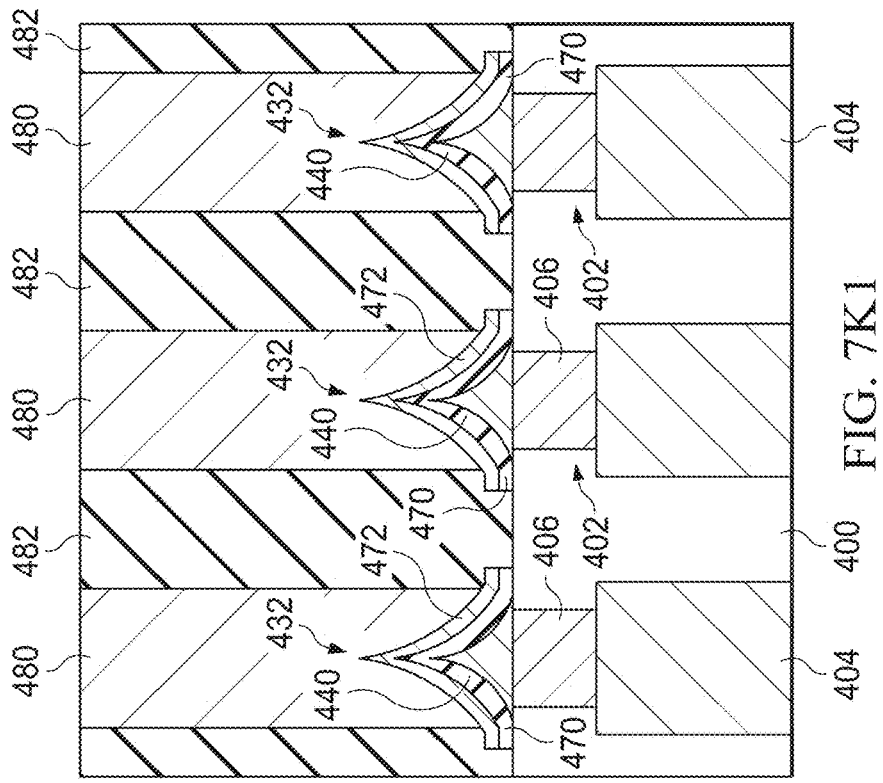
FIG. 7K1

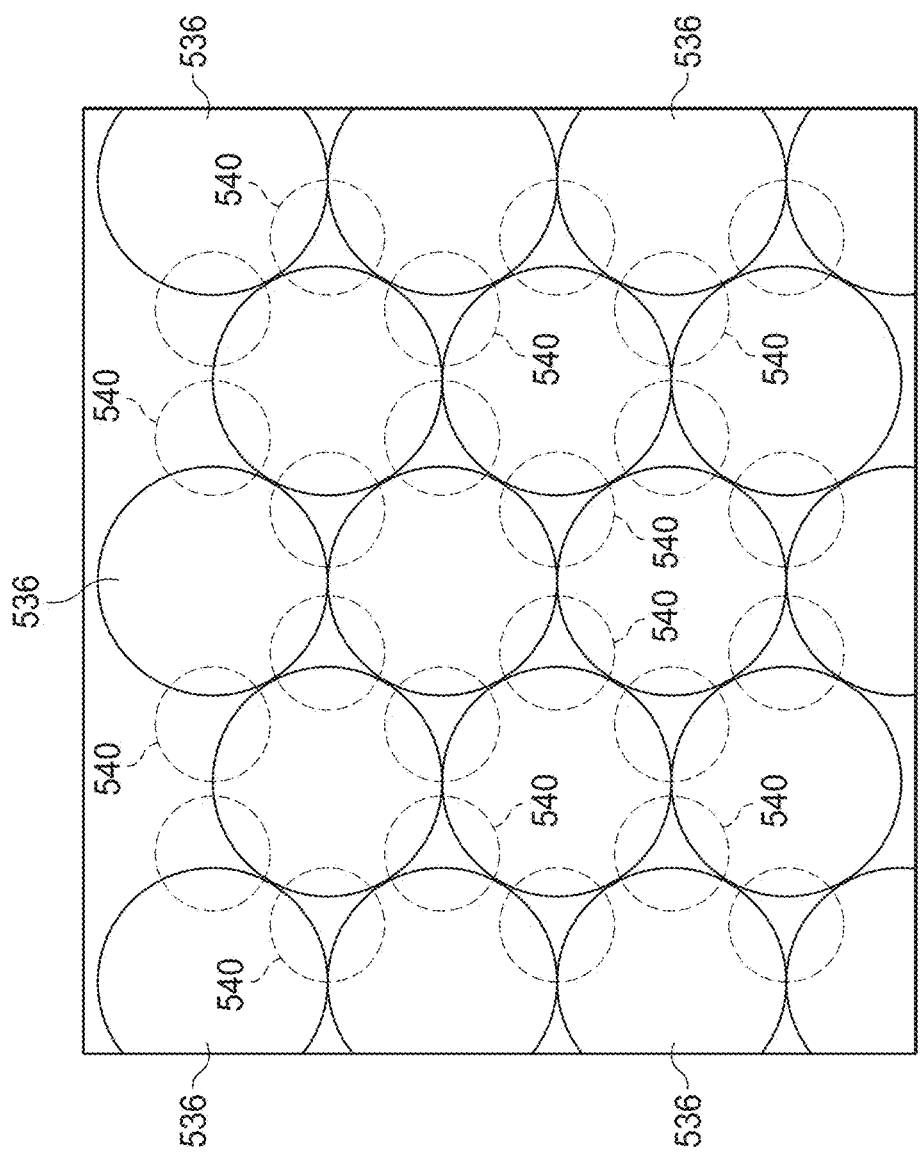

RESISTIVE MEMORY CELL WITH SLOPED BOTTOM ELECTRODE

TECHNICAL FIELD

The present disclosure relates to resistive memory cells, e.g., conductive bridging random access memory (CBRAM) or resistive random-access memory (ReRAM) cells, having a sloped bottom electrode.

BACKGROUND

Resistive memory cells, such as conductive bridging memory (CBRAM) and resistive RAM (ReRAM) cells are a new type of non-volatile memory cells that provide scaling and cost advantages over conventional Flash memory cells. A CBRAM is based on the physical re-location of ions within a solid electrolyte. A CBRAM memory cell can be made of two solid metal electrodes, one relatively inert (e.g., tungsten) the other electrochemically active (e.g., silver or copper), separated from each other by a thin layer or film of non-conducting material. The CBRAM cell generates programmable conducting filaments across the non-conducting film through the application of a bias voltage across the non-conducting film. The conducting filaments may be formed by single or very few nanometer-scale ions. The non-conducting film may be referred to as an electrolyte because it provides for the propagation of the conductive filament(s) across the film through an oxidation/reduction process much like in a battery. In a ReRAM cell, the conduction occurs through creation of a vacancy chain in an insulator. The generation of the conductive filament(s)/vacancy-chain(s) creates an on-state (high conduction between the electrodes), while the dissolution of the conductive filament(s)/vacancy-chain(s), e.g., by applying a similar polarity with Joule heating current or an opposite polarity but at smaller currents, reverts the electrolyte/insulator back to its nonconductive off-state. In this disclosure both the electrolyte film, layer, or region of a CBRAM cell and the insulator film, layer, or region of a ReRAM cell are referred to as an "electrolyte," for the sake of simplicity.

A wide range of materials have been demonstrated for possible use in resistive memory cells, both for the electrolyte and the electrodes. One example is the Cu/SiOx based cell in which the Cu is the active metal-source electrode and the SiOx is the electrolyte.

One common problem facing resistive memory cells is the on-state retention, i.e., the ability of the conductive path (filament or vacancy chain) to be stable, especially at the elevated temperatures that the memory parts may typically be qualified to (e.g., 85 C/125 C).

FIG. 1 shows a conventional CBRAM cell 1A, having a top electrode 10 (e.g., copper) arranged over a bottom electrode 12 (e.g., tungsten), with the electrolyte or middle electrode 14 (e.g., $SiO_2$) arranged between the top and bottom electrodes. Conductive filaments 18 propagate from the bottom electrode 12 to the top electrode 10 through the electrolyte 14 when a bias voltage is applied to the cell 1A. This structure has various potential limitations or drawbacks. For example, the effective cross-sectional area for filament formation, which may be referred to as the "confinement zone" or the "filament formation area" indicated as $A_{FF}$, is relatively large and unconfined, making the filament formation area susceptible to extrinsic defects. Also, multi-filament root formation may be likely, due to a relatively large area, which may lead to weaker (less robust) filaments. In general, the larger the ratio between the diameter or width of the filament formation area $A_{FF}$ (indicated by "x") to the filament propagation distance from the bottom electrode 12 to the top electrode 10 (in this case, the thickness of the electrolyte 14, indicated by "y"), the greater the chance of multi-root filament formation. Further, a large electrolyte area surrounds the filament, which provides diffusion paths for the filament and thus may provide poor retention. Thus, restricting the volume of the electrolyte material in which the conductive path forms may provide a more robust filament due to spatial confinement. The volume of the electrolyte material in which the conductive path forms may be restricted by reducing the area in contact between the bottom electrode 12 and the electrolyte 14.

As used herein, "conductive path" refers a conductive filament (e.g., in a CBRAM cell), vacancy chain (e.g., in an oxygen vacancy based ReRAM cell), or any other type of conductive path for connecting the electrodes of a non-volatile memory cell, typically through an electrolyte layer or region arranged between the electrodes. As used herein the "electrolyte layer" or "electrolyte region" refers to an electrolyte/insulator/memory layer or region between the bottom and top electrodes through which the conductive path propagates.

FIG. 2 shows certain principles of a CBRAM cell formation. Conductive paths 18 may form and grow laterally, or branch into multiple parallel paths. Further, locations of the conductive paths may change with each program/erase cycle. This may contribute to a marginal switching performance, variability, high-temp retention issues, and/or switching endurance. Restricting switching volume has shown to benefit the operation. These principles apply to ReRAM and CBRAM cells. A key obstacle for adoption of these technologies is switching uniformity.

FIGS. 3A and 3B show a schematic view and an electron microscope image of an example known bottom electrode configuration 1B for a CBRAM cell (e.g., having a 1T1R architecture). In this example, the bottom electrode 12 is a cylindrical via, e.g., a tungsten-filled via with a Ti/TiN liner. A top contact and/or anode 20 may be connected to the top electrode 10 as shown. The bottom electrode 12 may provide a relatively large filament formation area $A_{FF}$ of about 30,000 $nm^2$, for example, which may lead to one or more of the problems or disadvantages discussed above.

SUMMARY

Some embodiments provide resistive memory cells, e.g., CBRAM or ReRAM cells, and methods of forming such resistive memory cells, having a bottom electrode formed with one or more sloped surfaces that define an upwardly-pointed tip, which may be a point, edge, or surface, depending on the embodiment. The bottom electrode may have any shape that defines an upwardly-pointed tip. For example, the bottom electrode may have an elongated prism shape with a triangular cross-section that extends across one or multiple bottom electrode connections, or a concave bowl shape defining an upwardly-pointed ring-shaped tip edge, or an upwardly-pointed pyramid shape.

When a voltage bias is applied to such resistive memory cell, the upwardly-pointing tip of the bottom electrode may focus the electric field more precisely than in known cells, which may provide more consistent filament formation, thus improving the consistency of programming voltage and cell predictability, e.g., as compared with certain conventional designs.

According to one embodiment, a method of forming a resistive memory cell comprises forming a plurality of bottom electrode connections; depositing a bottom electrode layer over the bottom electrode connections; performing a first etch to remove portions of the bottom electrode layer such that the remaining bottom electrode layer defines at least one sloped surface; forming an oxidation layer on each sloped surface of the remaining bottom electrode layer; performing a second etch on the remaining bottom electrode layer and oxidation layer on each sloped surface to define at least one upwardly-pointing bottom electrode region above each bottom electrode connection, each upwardly-pointing bottom electrode region defining a bottom electrode tip; and forming an electrolyte region and a top electrode over each bottom electrode tip such that the electrolyte region is arranged between the top electrode and the respective bottom electrode top.

According to another embodiment, a resistive memory cell comprises a plurality of bottom electrode connections; at least one bottom electrode region formed over and conductively coupled to the bottom electrode connections, each bottom electrode region having at least one sloped sidewall and defining an upwardly-pointing tip; an electrolyte region and a top electrode over each bottom electrode tip such that the electrolyte region is arranged between the top electrode and the respective bottom electrode top; and a top electrode connection conductively coupled to each top electrode.

According to another embodiment, a method of forming a resistive memory cell comprises forming a plurality of bottom electrode connections; depositing a bottom electrode layer over the bottom electrode connections; performing an etch to remove portions of the bottom electrode layer to form at least one upwardly-pointing bottom electrode region above the bottom electrode connections, each upwardly-pointing bottom electrode region defining a bottom electrode tip; and forming an electrolyte region and a top electrode over each bottom electrode tip such that the electrolyte region is arranged between the top electrode and the respective bottom electrode top.

According to another embodiment, a resistive memory cell comprises a plurality of bottom electrode connections; at least one bottom electrode region formed over and conductively coupled to the bottom electrode connections, each bottom electrode region having at least two sloped sidewalls and defining an upwardly-pointing tip; an electrolyte region and a top electrode over each bottom electrode tip such that the electrolyte region is arranged between the top electrode and the respective bottom electrode top; and a top electrode connection conductively coupled to each top electrode.

BRIEF DESCRIPTION OF THE FIGURES

Example embodiments are discussed below with reference to the drawings, in which:

FIGS. 4A1-4N2 illustrate an example method for forming a resistive memory cell structure, e.g., a CBRAM or ReRAM cell structure, including bottom electrodes having a sloped surface defining a pointed upper-edge, according to one embodiment of the present invention;

FIGS. 5A1-5N2 illustrate another example method for forming a resistive memory cell structure, e.g., a CBRAM or ReRAM cell structure, including sloped ring-shaped bottom electrodes defining a ring-shaped pointed upper-edge, according to one embodiment of the present invention;

FIGS. 6A1-6L2 illustrate an another example method for forming a resistive memory cell structure, e.g., a CBRAM or ReRAM cell structure, including bottom electrodes having a pair of sloped side walls defining a pointed upper-edge, according to one embodiment of the present invention;

FIGS. 7A1-7K2 illustrate an another example method for forming a resistive memory cell structure, e.g., a CBRAM or ReRAM cell structure, including pyramid shaped bottom electrodes having four sloped sides meeting at an upwardly pointed tip, according to one embodiment of the present invention; and FIGS. 8A-8C illustrate an another example method for forming a resistive memory cell structure, e.g., a CBRAM or ReRAM cell structure, including pyramid shaped bottom electrodes having three sloped sides meeting at an upwardly pointed tip, according to one embodiment of the present invention.

DETAILED DESCRIPTION

As discussed above, embodiments of the present invention may provide resistive memory cells, e.g., CBRAM or ReRAM cells, and methods of forming such resistive memory cells, having a bottom electrode formed with one or more sloped surfaces that define an upwardly-pointed tip, e.g., a triangular shaped bottom electrode, a concave bowl-shaped bottom electrode with a ring-shaped tip edge, or a pyramid shaped bottom electrode. In operation, the upwardly-pointed tip of the bottom electrode may focus the electric field and provide a reduced filament formation area $A_{FF}$, which may provide more consistent filament formation, thus improving the consistency of programming voltage and cell predictability, e.g., as compared with certain conventional designs.

FIGS. 4A1-4N2 illustrate an example method for forming a resistive memory cell structure, e.g., a CBRAM or ReRAM cell structure, including bottom electrodes having a sloped surface defining a pointed upper-edge, according to one embodiment of the present invention.

Figure 1:
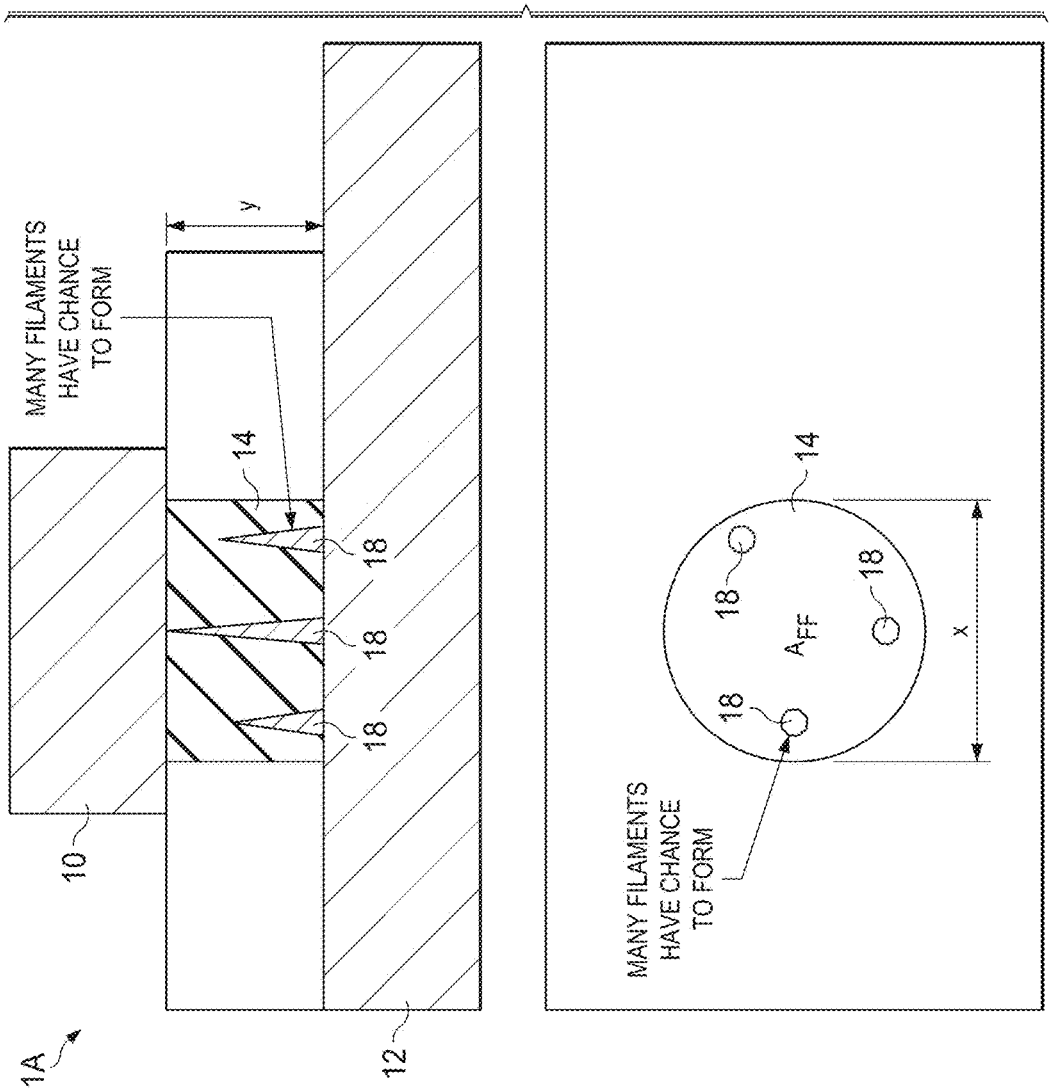
FIG. 1 shows an example conventional CBRAM cell.
Figure 2:
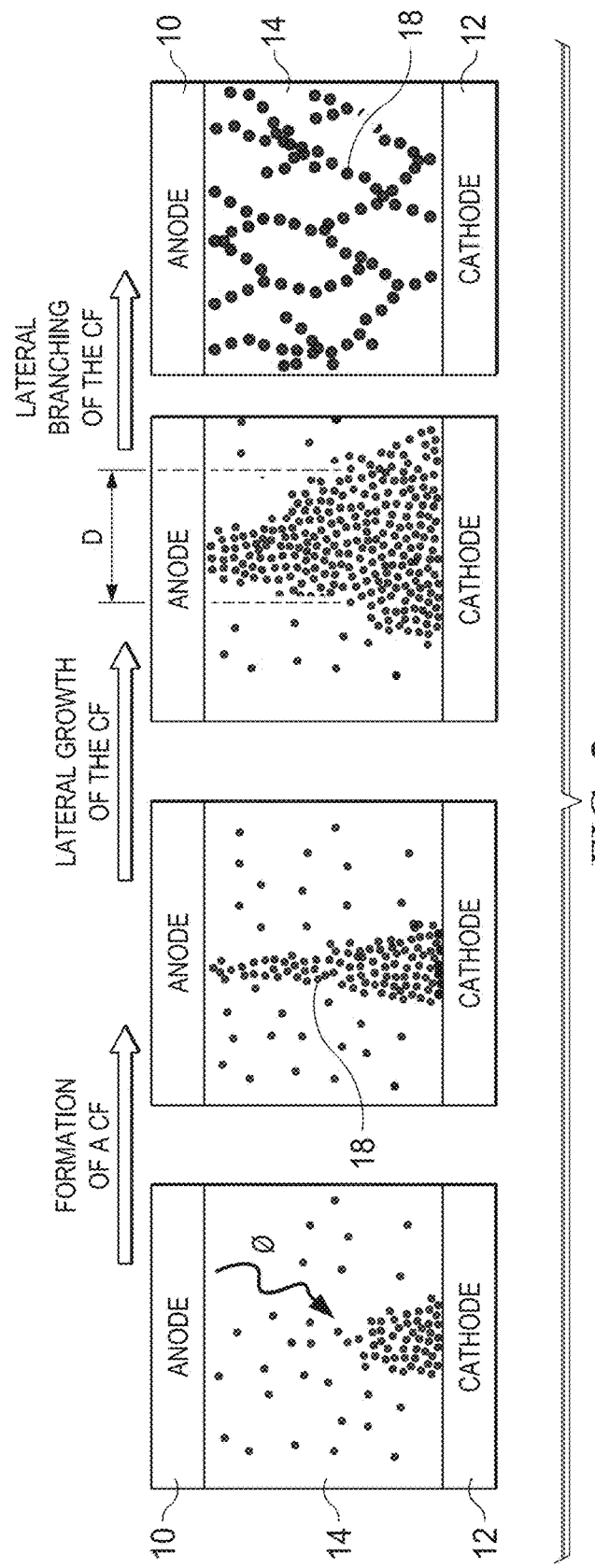
FIG. 2 shows certain principles of CBRAM cell formation.
Figure 3B:
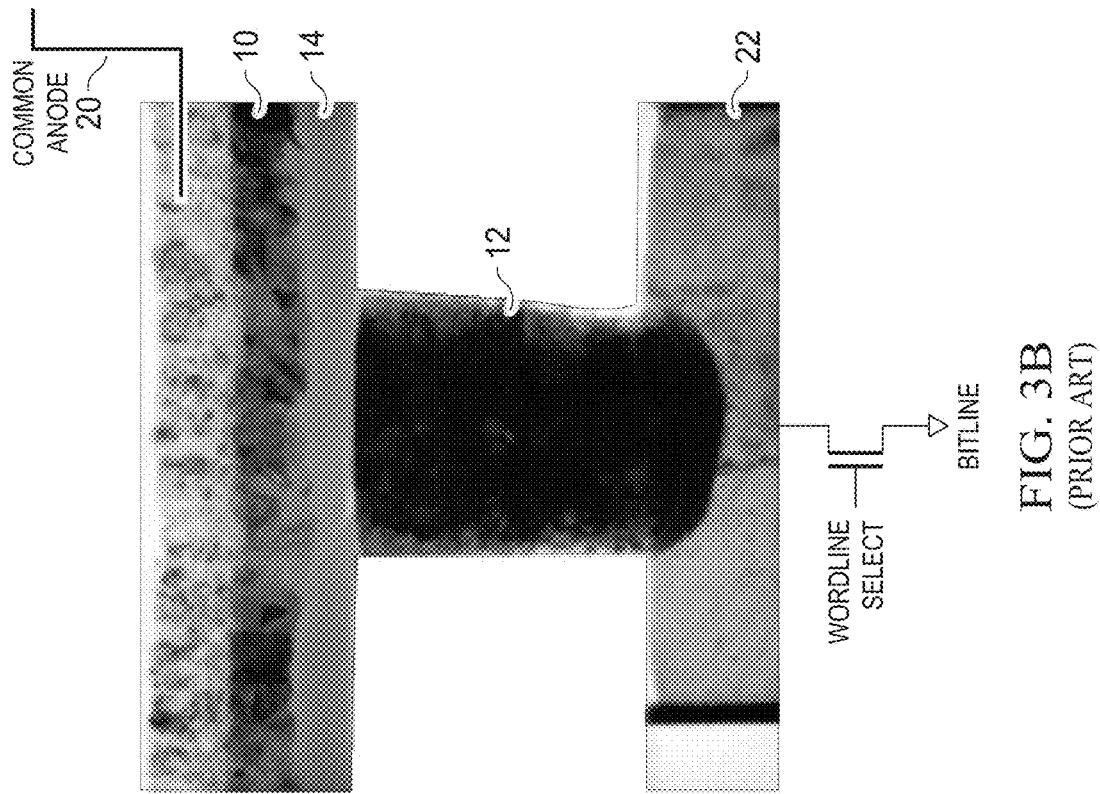
FIGS. 3A and 3B show a schematic view and an electron microscope image of an example known CBRAM cell configuration.
Figure 3A:
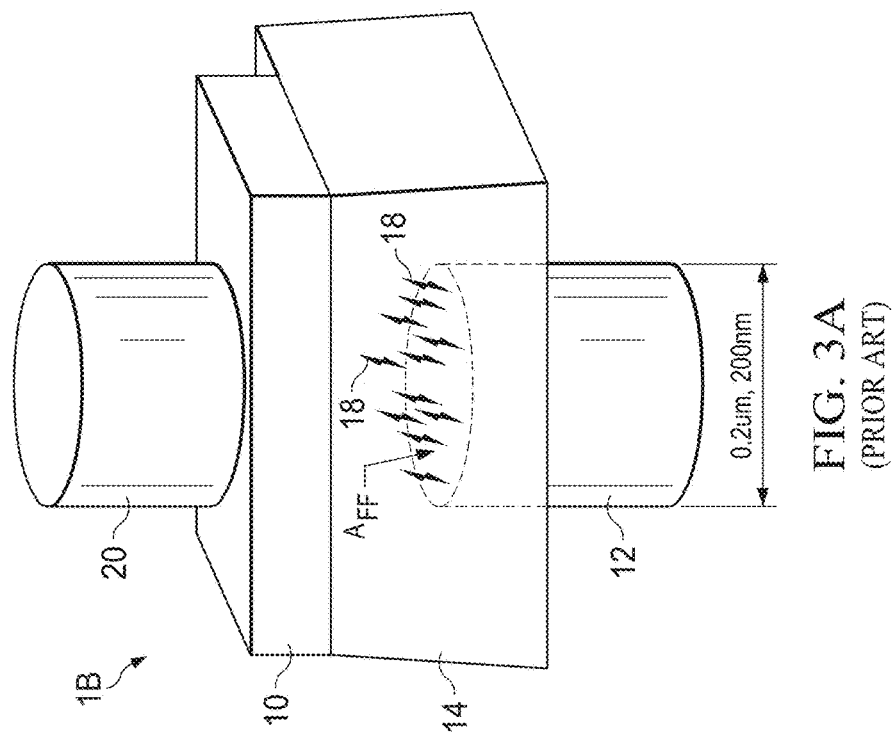

As shown in FIG. 4A1 (cross-sectional side view) and FIG. 4A2 (top view), an array of bottom electrode connectors 102 are formed in a substrate 100. Bottom electrode connectors 102 and substrate 100 may be formed in any suitable manner (e.g., using conventional semiconductor fabrication techniques) and from any suitable materials. For example, substrate 100 may be formed from an insulator, e.g., $SiO_2$, and each bottom electrode connector 102 may have a conductor region 104 formed from copper (Cu) or other conductive material, and a connection region 106 formed from tungsten (W) or other suitable material. In this example, each bottom electrode connector 102 is formed with a circular via-type shape. However, each bottom electrode connector 102 may be formed with any other suitable shape, e.g., an elongated line or elongated rectangular shape, a square shape, etc.

Next, as shown in FIG. 4B1 (cross-sectional side view) and FIG. 4B2 (top view), a bottom electrode (or cathode) layer 110 and a hard mask 112 are deposited or formed over the substrate 100 and bottom electrode connectors 102. Bottom electrode layer 110 may comprise any suitable conductive material or materials, e.g., polysilicon, doped polysilicon, amorphous silicon, doped amorphous silicon, or any other suitable material, and may be deposited or formed in any suitable manner. Hard mask layer 112 may be formed from any suitable materials (e.g., SiN, SiON, or other dielectric material) and may be deposited or formed in any suitable manner as known in the art.

Next, as shown in FIG. 4C1 (cross-sectional side view) and FIG. 4C2 (top view), the hard mask 112 is patterned, e.g., by forming and patterning a photoresist layer 116 over the hard mask 112, using any suitable photolithography techniques. As shown, the photoresist layer 116 is patterned with openings 118 that expose particular areas of the underlying hard mask 112. In this embodiment, openings 118 are formed as elongated trenches extending between or alongside rows of underlying bottom electrode connectors 102, as shown in FIG. 4C2. However, openings 118 may alternatively be formed with any other shape, e.g., circular via-type openings, and/or may correspond with underlying bottom electrode connectors 102 in a one-to-one manner (as opposed to the illustrated one-to-multiple arrangement). Also, in the illustrated embodiment, the openings 118 are located such that each underlying bottom electrode connector 102 has a single corresponding opening wall 120 overlying that bottom electrode connector 102, wherein the single corresponding opening wall 120 for bottom electrode connector 102 provides the basis for a single sloped bottom electrode sidewall formed over that bottom electrode connector 102 according to the following process steps. In particular, opening wall 120A overlies bottom electrode connector 102A, opening wall 120B overlies bottom electrode connector 102B, and opening wall 120C overlies bottom electrode connector 102C. In other embodiments, the openings 118 are shaped and/or located such that multiple opening walls 120 overly each bottom electrode connector 102, e.g., such that multiple sloped bottom electrode sidewalls may be formed over each bottom electrode connector 102.

Next, as shown in FIG. 4D1 (cross-sectional side view) and FIG. 4D2 (top view), etch and strip/removal processes are performed to transfer the photoresist pattern into the hard mask 112 and remove the remaining photoresist, thereby forming a patterned hard mask 112 having an array of openings 124.

Next, bottom electrode layer 110 may be etched through the openings 124 in the patterned hard mask 112 using any suitable isotropic etch process. FIGS. 4E1-4G2 illustrate a progression of the etch process, in particular showing "snapshots" of the structure at three different points in time along the progression of the etch. Thus, FIGS. 4E1 and 4E2 show a snapshot at a first instant in time during the etch; FIGS. 4F1 and 4F2 show a snapshot at a second instant in time during the etch; and FIGS. 4G1 and 4G2 show a snapshot at or after completion of the etch. As shown in these figures, the etch process may continue to remove material from bottom electrode layer 110 until the remaining portions of the bottom electrode layer 110 define a sloped sidewall surface 130 above each bottom electrode connector 102. In some embodiments, the etch process may separate bottom electrode layer 110 into discrete bottom electrode layer regions, e.g., regions 110A and 110B shown in FIGS. 4G1 and 4G2.

Next, as shown in FIG. 4H1 (cross-sectional side view) and FIG. 4H2 (top view), the exposed sloped sidewall surfaces 130 of bottom electrode layer regions 110A and 110B are oxidized using any suitable process, to form an oxidized layer 134 on each sloped region 130.

Next, as shown in FIG. 4I1 (cross-sectional side view) and FIG. 4I2 (top view), the hard mask 112 is removed using any suitable process, e.g., by etching or stripping.

Next, as shown in FIG. 4J1 (cross-sectional side view) and FIG. 4J2 (top view), the bottom electrode layer regions 110A and 110B are etched utilizing the oxidized regions as a hardmask to block the etching of bottom electrode underneath. And the oxidized layers 134 are removed, thereby forming discrete bottom electrodes 140, each having an upwardly-pointing region defining a sloped side wall surface 142 and a tip 144. The etch and oxide removal process may be performed in two steps, e.g., using a highly selective etch that preserves the oxide layers 134 and then gently removing the oxide layers 134 in a subsequent step, or alternatively may be performed in a single step, e.g., using a slightly higher oxide etch rate that removes the oxide layers 134 along with portions of the bottom electrode layer material.

Next, as shown in FIG. 4K1 (cross-sectional side view) and FIG. 4K2 (top view), an insulator or electrolyte layer 150 and a top electrode (anode) layer 152 are formed over the stack, and in particular, over each bottom electrode 140. Electrolyte layer 150 may comprise any suitable dielectric or memristive type material or materials, for example, $SiO_x$ (e.g., $SiO_2$), GeS, CuS, $TaO_x$, $TiO_2$, $Ge_2Sb_2Te_5$, GdO, HfO, CuO, $Al_2O_3$, or any other suitable material. Top electrode layer 152 may comprise any suitable conductive material or materials, e.g., Ag, Al, Cu, Ta, TaN, Ti, TiN, Al, W or any other suitable material, and may be deposited or formed in any suitable manner.

Next, as shown in FIG. 4L1 (cross-sectional side view) and FIG. 4L2 (top view), the electrolyte layer 150 and top electrode layer 152 are patterned by forming and patterning a photoresist layer 160 over the top electrode layer 152, using any suitable photolithography techniques. As shown, the photoresist layer 160 is patterned with openings 162 that expose particular areas of the top electrode layer 152. In this embodiment, openings 162 are formed as elongated trenches between adjacent rows of bottom electrodes 140, as shown in FIG. 4L2. However, photoresist layer 160 may be patterned in any other suitable manner. For example, photoresist layer 160 may be patterned such that a discrete photoresist region remains over each bottom electrode 140 (rather than spanning multiple bottom electrodes 140 as shown in FIG. 4L2).

Next, as shown in FIG. 4M1 (cross-sectional side view) and FIG. 4M2 (top view), etch and strip/removal processes are performed to transfer the photoresist pattern into the electrolyte layer 150 and top electrode layer 152 and remove the remaining photoresist, thereby dividing the electrolyte layer 150 and top electrode layer 152 into discrete electrolyte regions 170 and corresponding top electrodes 172. As shown in FIG. 4M2, each electrolyte region 170/top electrode 172 forms a row spanning multiple bottom electrodes 140.

Next, as shown in FIG. 4N1 (cross-sectional side view) and FIG. 4N2 (top view), top electrode interconnects 180 may be formed in an insulator material 182 deposited over the stack, using any suitable techniques. The insulator material 182 may comprise any suitable insulator (e.g., $SiO_2$), which may or may not be the same material as substrate 100. Top electrode interconnects 180 may be formed from any suitable conductor (e.g., Cu), and may be formed at any suitable locations relative to top electrodes 172. In the illustrated example, as shown in FIG. 4N2, a top electrode interconnect 180 is formed over each elongated top electrode 172 at the end of each column (i.e., the connection may be periodic rather than over each bitcell).

In this manner, an array of resistive memory cells is formed, in which the bottom electrode 140 has an upwardly-pointing region defining a sloped side wall 142 and a pointed tip 144. In operation, conductive filament propagation from each respective bottom electrode 140 is substantially confined to the pointed tip 144, as the electric field naturally concentrates at the point, edge, or surface having the smallest radius of curvature. Thus, the sharper the point of tip 144, the greater the concentration of the filament-generating electric field, and thus the smaller the effective filament formation area $A_{FF}$. Thus, the pointed tip shaped bottom electrode 140 may provide a substantially reduced effective filament formation area $A_{FF}$, as compared with conventional bottom electrode structures.

FIGS. 5A1-5N2 illustrate an example method for forming a resistive memory cell structure, e.g., a CBRAM or ReRAM cell structure, including sloped ring-shaped bottom electrodes defining a ring-shaped pointed upper-edge, according to one embodiment of the present invention.

As shown in FIG. 5A1 (cross-sectional side view) and FIG. 5A2 (top view), an array of bottom electrode connectors 202 are formed in a substrate 200. Bottom electrode connectors 202 and substrate 200 may be formed in any suitable manner (e.g., using conventional semiconductor fabrication techniques) and from any suitable materials. For example, substrate 200 may be formed from an insulator, e.g., SiO₂, and each bottom electrode connector 202 may have a conductor region 204 formed from copper (Cu) or other conductive material, and a connection region 206 formed from tungsten (W) or other suitable material. In this example, each bottom electrode connector 202 is formed with a circular via-type shape. However, each bottom electrode connector 202 may be formed with any other suitable shape, e.g., an elongated line or elongated rectangular shape, a square shape, etc.

Next, as shown in FIG. 5B1 (cross-sectional side view) and FIG. 5B2 (top view), a bottom electrode (or cathode) layer 210 and a hard mask 212 are deposited or formed over the substrate 200 and bottom electrode connectors 202. Bottom electrode layer 210 may comprise any suitable conductive material or materials, e.g., polysilicon, doped polysilicon, amorphous silicon, doped amorphous silicon, or any other suitable material, and may be deposited or formed in any suitable manner. Hard mask layer 212 may be formed from any suitable materials (e.g., SiN, SiON, or other dielectric material) and may be deposited or formed in any suitable manner as known in the art.

Next, as shown in FIG. 5C1 (cross-sectional side view) and FIG. 5C2 (top view), the hard mask 212 is patterned, e.g., by forming and patterning a photoresist layer 216 over the hard mask 212, using any suitable photolithography techniques. As shown, the photoresist layer 216 is patterned with openings 218 that expose particular areas of the underlying hard mask 212. In this embodiment, openings 218 are formed as circular openings over each bottom electrode connector 202, with the perimeter of each circular opening 218 being smaller than and aligned concentrically within the perimeter of the respective bottom electrode connector 202, as shown in FIG. 5C2. In other embodiments, circular openings 218 may align in an overlapping manner with respect to their respective bottom electrode connectors 202, as viewed from the top view.

Next, as shown in FIG. 5D1 (cross-sectional side view) and FIG. 5D2 (top view), an etch is performed to transfer the photoresist pattern into the hard mask 212, thereby forming a patterned hard mask 212 having an array of openings 224. Then, as shown in FIG. 5E1 (cross-sectional side view) and FIG. 5E2 (top view), the remaining photoresist is removed, e.g., by stripping or other suitable process.

Next, bottom electrode layer 210 may be etched through the openings 224 in the patterned hard mask 212 using any suitable isotropic etch process. FIGS. 5F1 and 5F2 illustrate a snapshot of the structure at an instant during the etch process, and FIGS. 5G1 and 5G2 show a snapshot at or after completion of the etch. As shown in these figures, the etch process may remove material from bottom electrode layer 210 until the remaining portions of the bottom electrode layer 210 define a concave, bowl-shaped structure having a sloped U-shaped (in the cross-sectional side view), ring-shaped (in the top view) sidewall 230 above each bottom electrode connector 202. In some embodiments, the etch process may etch fully through the bottom electrode layer 210 and down to the bottom electrode connection region 206 to expose a top surface area of connection region 206, e.g., at the bottom center of the etched area. In other embodiments, the etch process may not extend fully through the bottom electrode layer 210, such that a portion of the bottom electrode material 210 remains over the top surface of connection region 206, even at the bottom center of the etched area.

Next, as shown in FIG. 5H1 (cross-sectional side view) and FIG. 5H2 (top view), the exposed sloped U-shaped (side view), ring-shaped (top view) sidewalls 230 defined in bottom electrode layer 210 are oxidized using any suitable process, to form an oxidized layer 234 on each sloped region 230.

Next, as shown in FIG. 5I1 (cross-sectional side view) and FIG. 5I2 (top view), hard mask 212 is removed using any suitable process, e.g., by etching or stripping.

Next, as shown in FIG. 5J1 (cross-sectional side view) and FIG. 5J2 (top view), the remaining bottom electrode layer 210 is etched utilizing the oxidized regions as a hardmask to block the etching of bottom electrode underneath. And the oxidized layers 234 are removed, thereby forming a discrete bottom electrode 240 over each bottom electrode connection 206. As shown, each bottom electrode 240 comprises a concave, bowl-shaped structure having a sloped U-shaped (cross-sectional side view), ring-shaped (in the top view) sidewall surface 242 and an upwardly-pointed ring-shaped tip 244. The etch and oxide removal process may be performed in two steps, e.g., using a highly selective etch that preserves the oxide layers 234 and then gently removing the oxide layers 234 in a subsequent step, or alternatively may be performed in a single step, e.g., using a slightly higher oxide etch rate that removes the oxide layers 234 along with portions of the bottom electrode layer material.

In some embodiments, each bottom electrode 240 may have an central opening that exposes a top surface area of the underlying connection region 206. In other embodiments, a portion of the bottom electrode material 210 remains over the top surface of connection region 206, even at the bottom center of the bowl-shaped structure, such that the top surface of the underlying connection region 206 is not exposed through the center of the bottom electrode 240.

Next, as shown in FIG. 5K1 (cross-sectional side view) and FIG. 5K2 (top view), an insulator or electrolyte layer 250 and a top electrode (anode) layer 252 are formed over the stack, and in particular, over each bottom electrode 240. Electrolyte layer 250 may comprise any suitable dielectric or memristive type material or materials, for example, $SiO_x$ (e.g., $SiO_2$), GeS, CuS, $TaO_x$, $TiO_2$, $Ge_2Sb_2Te_5$, GdO, HfO, CuO, $Al_2O_3$, or any other suitable material. Top electrode layer 252 may comprise any suitable conductive material or materials, e.g., Ag, Al, Cu, Ta, TaN, Ti, TiN, Al, W or any other suitable material, and may be deposited or formed in any suitable manner.

Next, the electrolyte layer 250 and top electrode layer 252 are patterned and etched to divide the electrolyte layer 250 and top electrode layer 252 into discrete electrolyte 270/top electrode 272 regions, each covering one or multiple bottom electrodes 202. In the example shown in FIG. 5L1 (cross-sectional side view) and FIG. 5L2 (top view), the electrolyte layer 250 and top electrode layer 252 are patterned and etched to form a discrete electrolyte 270/top electrode 272 region over each individual bottom electrode 202. (In an alternative embodiment shown in FIGS. 5N1 and 5N2 (discussed below), the electrolyte layer 250 and top electrode layer 252 are patterned and etched to form elongated electrolyte 270/top electrode 272 regions, each spanning a row of multiple bottom electrodes 202.)

Next, as shown in FIG. 5M1 (cross-sectional side view) and FIG. 5M2 (top view), top electrode interconnects 280 may be formed in an insulator material 282 deposited over the stack, using any suitable techniques. The insulator material 282 may comprise any suitable insulator (e.g., $SiO_2$), which may or may not be the same material as substrate 200. Top electrode interconnects 280 may be formed from any suitable conductor (e.g., Cu), and may be formed at any suitable locations relative to top electrodes 272. In this example embodiment, as shown in FIG. 5M2, a discrete top electrode interconnect 280 is formed over each top electrode 272.

FIG. 5N1 (cross-sectional side view) and FIG. 5N2 (top view) illustrate an alternative embodiment in which the electrolyte layer 250 and top electrode layer 252 are formed as elongated electrolyte 270/top electrode 272 regions, each spanning a row of multiple bottom electrodes 202. A top electrode interconnect 280 is formed over and connected to each elongated top electrode 272, at the end of each column (i.e., the connection may be periodic rather than over each bitcell), as shown in FIG. 5N2.

In the manner shown in FIGS. 5A1-5N2, an array of resistive memory cells is formed, in which each bottom electrode 240 has a concave bowl-shaped structure defining an upwardly-pointed ring-shaped tip 244. In operation, conductive filament propagation from each respective bottom electrode 240 is substantially confined to the ring-shaped pointed tip 244, as the electric field naturally concentrates at the point, edge, or surface having the smallest radius of curvature. Thus, the sharper the point of ring-shaped tip 244, the greater the concentration of the filament-generating electric field, and thus the smaller the effective filament formation area $A_{FF}$. Thus, the ring-shaped pointed tip of each bottom electrode 240 may provide a substantially reduced effective filament formation area $A_{FF}$, as compared with conventional bottom electrode structures.

FIGS. 6A1-6L2 illustrate an example method for forming a resistive memory cell structure, e.g., a CBRAM or ReRAM cell structure, including bottom electrodes having a pair of sloped side walls defining a pointed upper-edge, according to one embodiment of the present invention.

As shown in FIG. 6A1 (cross-sectional side view) and FIG. 6A2 (top view), an array of bottom electrode connectors 302 are formed in a substrate 300. Bottom electrode connectors 302 and substrate 300 may be formed in any suitable manner (e.g., using conventional semiconductor fabrication techniques) and from any suitable materials. For example, substrate 300 may be formed from an insulator, e.g., $SiO_2$, and each bottom electrode connector 302 may have a conductor region 304 formed from copper (Cu) or other conductive material, and a connection region 306 formed from tungsten (W) or other suitable material. In this example, each bottom electrode connector 302 is formed with a circular via-type shape. However, each bottom electrode connector 302 may be formed with any other suitable shape, e.g., an elongated line or elongated rectangular shape, a square shape, etc.

Next, as shown in FIG. 6B1 (cross-sectional side view) and FIG. 6B2 (top view), a bottom electrode (or cathode) layer 310 and a hard mask 312 are deposited or formed over the substrate 300 and bottom electrode connectors 302. Bottom electrode layer 310 may comprise any suitable conductive material or materials, e.g., polysilicon, doped polysilicon, amorphous silicon, doped amorphous silicon, or any other suitable material, and may be deposited or formed in any suitable manner. Hard mask layer 312 may be formed from any suitable materials (e.g., SiN, SiON, or other dielectric material) and may be deposited or formed in any suitable manner as known in the art.

Next, as shown in FIG. 6C1 (cross-sectional side view) and FIG. 6C2 (top view), the hard mask 312 is patterned, e.g., by forming and patterning a photoresist layer 316 over the hard mask 312, using any suitable photolithography techniques. As shown, the photoresist layer 316 is patterned with openings 318 that expose particular areas of the underlying hard mask 312. In this embodiment, openings 318 are formed as elongated trenches extending between adjacent rows of underlying bottom electrode connectors 302, as shown in FIG. 6C2. However, openings 318 may alternatively be formed with any other shape, e.g., circular via-type openings, and/or may correspond with underlying bottom electrode connectors 302 in a one-to-one manner (as opposed to the illustrated one-to-multiple arrangement).

Next, as shown in FIG. 6D1 (cross-sectional side view) and FIG. 6D2 (top view), etch and strip/removal processes are performed to transfer the photoresist pattern into the hard mask 312 and remove the remaining photoresist, thereby forming a patterned hard mask 312 having an array of openings 324.

Next, bottom electrode layer 310 may be etched through the openings 324 in the patterned hard mask 312 using any suitable isotropic etch process. FIGS. 6E1-6G2 illustrate a progression of the etch process, in particular showing "snapshots" of the structure at three different points in time along the progression of the etch. Thus, FIGS. 6E1 and 6E2 show a snapshot at a first instant in time during the etch; FIGS. 6F1 and 6F2 show a snapshot at a second instant in time during the etch; and FIGS. 6G1 and 6G2 show a snapshot at or after completion of the etch. As shown in these figures, the etch process may remove material from bottom electrode layer 310 until the remaining portions of the bottom electrode layer 310 define elongated bottom electrode regions 310A, 310B, and 310C above respective rows of bottom electrode connectors 302, each bottom electrode region 310A, 310B, and 310C having a pair of sloped sidewalls 330 meeting at an upwardly-pointing edge tip 332, thus defining a triangular cross-sectional shape. As used herein, triangular means three sided, wherein each side may be linear or may be non-linear (e.g., curved, irregular, or otherwise non-linear).

Next, as shown in FIG. 6H1 (cross-sectional side view) and FIG. 6H2 (top view), the hard mask 312 is removed using any suitable process, e.g., by etching or stripping, leaving a series of bottom electrodes 340 (corresponding to bottom electrode regions 310A, 310B, and 310C).

Next, as shown in FIG. 6I1 (cross-sectional side view) and FIG. 6I2 (top view), an insulator or electrolyte layer 350 and a top electrode (anode) layer 352 are formed over the stack, and in particular, over each bottom electrode 340. Electrolyte layer 350 may comprise any suitable dielectric or memristive type material or materials, for example, $SiO_x$ (e.g., SiO$_2$), GeS, CuS, TaO$_x$, TiO$_2$, Ge$_2$Sb$_2$Te$_5$, GdO, HfO, CuO, Al$_2$O$_3$, or any other suitable material. Top electrode layer 352 may comprise any suitable conductive material or materials, e.g., Ag, Al, Cu, Ta, TaN, Ti, TiN, Al, W or any other suitable material, and may be deposited or formed in any suitable manner.

Next, as shown in FIG. 6J1 (cross-sectional side view) and FIG. 6J2 (top view), the electrolyte layer 350 and top electrode layer 352 are patterned by forming and patterning a photoresist layer 360 over the top electrode layer 352, using any suitable photolithography techniques. As shown, the photoresist layer 360 is patterned with openings 362 that expose particular areas of the top electrode layer 352. In this embodiment, openings 362 are formed as elongated trenches between adjacent rows of bottom electrodes 340, as shown in FIG. 6J2. However, photoresist layer 360 may be patterned in any other suitable manner. For example, photoresist layer 360 may be patterned such that a discrete photoresist region remains over each bottom electrode 340 (rather than spanning multiple bottom electrodes 340 as shown in FIG. 6J2).

Next, as shown in FIG. 6K1 (cross-sectional side view) and FIG. 6K2 (top view), etch and strip/removal processes are performed to transfer the photoresist pattern into the electrolyte layer 350 and top electrode layer 352 and remove the remaining photoresist, thereby dividing the electrolyte layer 350 and top electrode layer 352 into discrete electrolyte regions 370 and corresponding top electrodes 372. As shown in FIG. 6K2, each electrolyte region 370/top electrode 372 forms a row spanning multiple bottom electrodes 340.

Next, as shown in FIG. 6L1 (cross-sectional side view) and FIG. 6L2 (top view), top electrode interconnects 380 may be formed in an insulator material 382 deposited over the stack, using any suitable techniques. The insulator material 382 may comprise any suitable insulator (e.g., SiO$_2$), which may or may not be the same material as substrate 300. Top electrode interconnects 380 may be formed from any suitable conductor (e.g., Cu), and may be formed at any suitable locations relative to top electrodes 372. In the illustrated example, as shown in FIG. 6L2, a top electrode interconnect 380 is formed over each elongated top electrode 372 at the end of each column (i.e., the connection may be periodic rather than over each bitcell).

In this manner, an array of resistive memory cells is formed, in which each bottom electrode 340 has an upwardly-pointing triangular cross-section defining a pair of sloped side walls 330 meeting at a pointed tip 332. In operation, conductive filament propagation from each respective bottom electrode 340 is substantially confined to the pointed tip 332, as the electric field naturally concentrates at the point, edge, or surface having the smallest radius of curvature. Thus, the sharper the point of tip 332, the greater the concentration of the filament-generating electric field, and thus the smaller the effective filament formation area $A_{FF}$. Thus, the generally triangular, pointed tip shaped bottom electrode 340 may provide a substantially reduced effective filament formation area $A_{FF}$, as compared with conventional bottom electrode structures.

FIGS. 7A1-7K2 illustrate an example method for forming a resistive memory cell structure, e.g., a CBRAM or ReRAM cell structure, including pyramid shaped bottom electrodes having four sloped sides meeting at an upwardly pointed tip, according to one embodiment of the present invention.

As shown in FIG. 7A1 (cross-sectional side view) and FIG. 7A2 (top view), an array of bottom electrode connectors 402 are formed in a substrate 400. Bottom electrode connectors 402 and substrate 400 may be formed in any suitable manner (e.g., using conventional semiconductor fabrication techniques) and from any suitable materials. For example, substrate 400 may be formed from an insulator, e.g., SiO$_2$, and each bottom electrode connector 402 may have a conductor region 404 formed from copper (Cu) or other conductive material, and a connection region 406 formed from tungsten (W) or other suitable material. In this example, each bottom electrode connector 402 is formed with a circular via-type shape. However, each bottom electrode connector 402 may be formed with any other suitable shape, e.g., an elongated line or elongated rectangular shape, a square shape, etc.

Next, as shown in FIG. 7B1 (cross-sectional side view) and FIG. 7B2 (top view), a bottom electrode (or cathode) layer 410 is deposited or formed over the substrate 400 and bottom electrode connectors 402. Bottom electrode layer 410 may comprise any suitable conductive material or materials, e.g., polysilicon, doped polysilicon, amorphous silicon, doped amorphous silicon, or any other suitable material, and may be deposited or formed in any suitable manner.

Next, as shown in FIG. 7C1 (cross-sectional side view) and FIG. 7C2 (top view), a patterned hard mask layer 412 is formed over the bottom electrode layer 410. Hard mask layer 412 may be formed from any suitable materials (e.g., SiN, SiON, or other dielectric material), and patterned in any suitable manner known in the art. For example, hard mask layer 412 may be patterned using a photoresist layer and suitable patterning and etch process. In the illustrated embodiment, hard mask layer 412 is patterned with a two-dimensional array of circular openings 424 located in the areas between (i.e., not overlying) the underlying bottom electrode connection regions 406. However, it should be understood that in other embodiments, openings 424 may alternatively be formed with any other shape, e.g., elongated trench-type openings, and/or may be partially or fully located above underlying bottom electrode connection regions 406.

Next, bottom electrode layer 410 may be etched through the openings 424 in the patterned hard mask 412 using any suitable etch proces.

FIGS. 7D1-7F2 illustrate a progression of the etch process, in particular showing "snapshots" of the structure at three different points in time along the progression of the etch. Thus, FIGS. 7D1 and 7D2 show a snapshot at a first instant in time during the etch; FIGS. 7E1 and 7E2 show a snapshot at a second instant in time during the etch; and FIGS. 7F1 and 7F2 show a snapshot at or after completion of the etch. As shown in these figures, the etch process may remove material from bottom electrode layer 410 until the remaining portions of the bottom electrode layer 410 define a two-dimensional array of pyramid shaped bottom electrodes 440, each located above a respective bottom electrode connector 402. Each pyramid shaped bottom electrode 440 has four sloped sidewalls 430 meeting at an upwardly-pointing tip 432.

As used herein, pyramid means a three-dimensional shape having three or more triangular or generally triangular outer sides that meet at a point or relatively small edge or surface, and a base having a trilateral, quadrilateral, or any other polygon shape. Each generally triangular outer side may be planar or non-planar (e.g., concave, convex, irregular, or otherwise non-planar).

In one embodiment, the four sloped sidewalls 430 of each pyramid shaped bottom electrode 440 are triangular or generally triangular and concave or generally concave, due to the etch process that form the pyramid shapes.

Next, as shown in FIG. 7G1 (cross-sectional side view) and FIG. 7G2 (top view), the hard mask 412 is removed using any suitable process, e.g., by etching or stripping, leaving the two-dimensional array of pyramid-shaped bottom electrodes 440.

Thus, the patterning hard mask layer 412 with the two-dimensional array of openings shown in FIGS. 7C1 and 7C2 provides for a two-dimensional array of pyramid-shaped bottom electrodes, one per bottom electrode connection 406, as opposed to patterning the hard mask with elongated trench openings that lead to elongated bottom electrodes, as disclosed in the example steps shown in FIGS. 6C1-6H2 discussed above.

Next, as shown in FIG. 7H1 (cross-sectional side view) and FIG. 7H2 (top view), an insulator or electrolyte layer 450 and a top electrode (anode) layer 452 are formed over the stack, and in particular, over each bottom electrode 440. Electrolyte layer 450 may comprise any suitable dielectric or memristive type material or materials, for example, $SiO_x$ (e.g., $SiO_2$), GeS, CuS, $TaO_x$, $TiO_2$, $Ge_2Sb_2Te_5$, GdO, HfO, CuO, $Al_2O_3$, or any other suitable material. Top electrode layer 452 may comprise any suitable conductive material or materials, e.g., Ag, Al, Cu, Ta, TaN, Ti, TiN, Al, W or any other suitable material, and may be deposited or formed in any suitable manner.

Next, as shown in FIG. 7I1 (cross-sectional side view) and FIG. 7I2 (top view), the electrolyte layer 450 and top electrode layer 452 are patterned by forming and patterning a photoresist layer 460 over the top electrode layer 452, using any suitable photolithography techniques. As shown, the photoresist layer 460 is patterned with openings 462 that expose particular areas of the top electrode layer 452. In this embodiment, openings 462 are formed as elongated trenches between adjacent rows of bottom electrodes 440, as shown in FIG. 7I2. However, photoresist layer 460 may be patterned in any other suitable manner. For example, photoresist layer 460 may be patterned such that a discrete photoresist region remains over each bottom electrode 440 (rather than spanning multiple bottom electrodes 440 as shown in FIG. 7I2).

Next, as shown in FIG. 7J1 (cross-sectional side view) and FIG. 7J2 (top view), etch and strip/removal processes are performed to transfer the photoresist pattern into the electrolyte layer 450 and top electrode layer 452 and remove the remaining photoresist, thereby dividing the electrolyte layer 450 and top electrode layer 452 into discrete electrolyte regions 470 and corresponding top electrodes 472. As shown in FIG. 7J2, each electrolyte region 470/top electrode 472 forms a row spanning multiple bottom electrodes 440.

Next, as shown in FIG. 7K1 (cross-sectional side view) and FIG. 7K2 (top view), top electrode interconnects 480 may be formed in an insulator material 482 deposited over the stack, using any suitable techniques. The insulator material 482 may comprise any suitable insulator (e.g., $SiO_2$), which may or may not be the same material as substrate 400. Top electrode interconnects 480 may be formed from any suitable conductor (e.g., Cu), and may be formed at any suitable locations relative to top electrodes 472. In the illustrated example, as shown in FIG. 7K2, a top electrode interconnect 480 is formed over each elongated top electrode 472 at the end of each column (i.e., the connection may be periodic rather than over each bitcell).

In this manner, an array of resistive memory cells is formed, in which each bottom electrode 440 has an upwardly-pointing pyramid shape have four sloped side walls 430 meeting at a pointed tip 432. In operation, conductive filament propagation from each respective bottom electrode 440 is substantially confined to the pointed pyramid tip 432, as the electric field naturally concentrates at the point, edge, or surface having the smallest radius of curvature. Thus, the sharper the point of the pyramid tip 432, the greater the concentration of the filament-generating electric field, and thus the smaller the effective filament formation area $A_{FF}$. Thus, the generally triangular, pointed tip shaped bottom electrode 440 may provide a substantially reduced effective filament formation area $A_{FF}$, as compared with conventional bottom electrode structures.

Figure 8A:
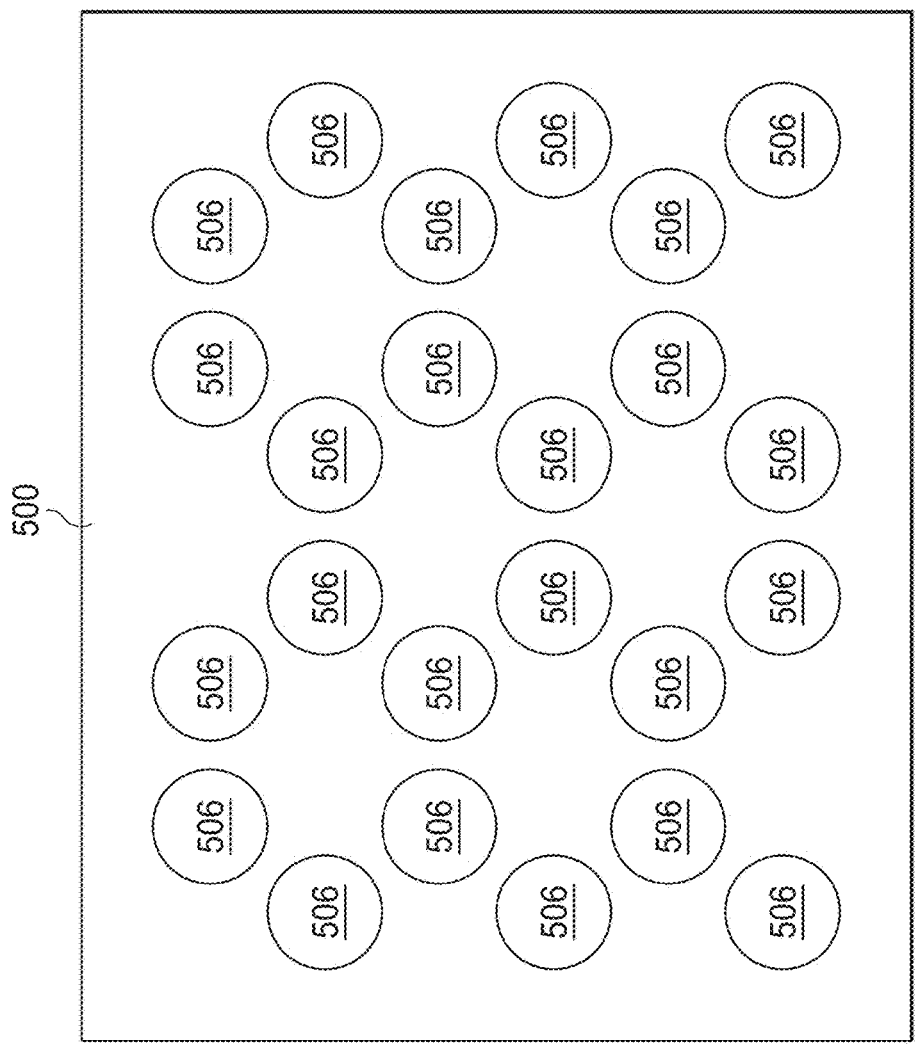
Figure 8B:
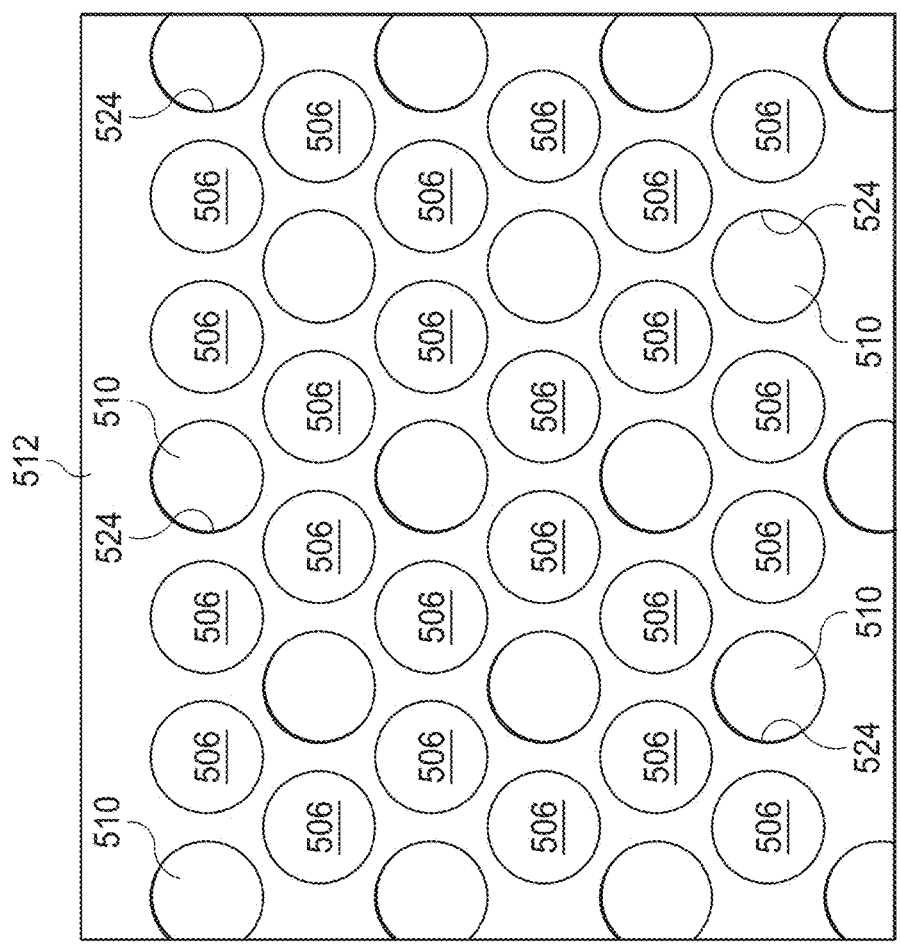

FIGS. 8A-8C illustrate steps in an example method for forming a resistive memory cell structure, e.g., a CBRAM or ReRAM cell structure, including pyramid shaped bottom electrodes having three sloped sides meeting at an upwardly pointed tip, according to one embodiment of the present invention.

FIG. 8A is a top view of a two-dimensional pattern of bottom electrode connections 506 formed in an insulator 500, e.g., analogous to the views shown in FIGS. 4A2, 5A2, 6A2, and 7A2. As shown, bottom electrode connections 506 are arranged in staggered rows that form a hexagonal pattern, as opposed to the aligned n rows by m columns patterns shown in FIGS. 4A2, 5A2, 6A2, and 7A2.

FIG. 8B is a top view of a patterned hard mask layer 512 formed over a bottom electrode layer 510 deposited over bottom electrode connection regions 506, e.g., analogous to the views shown in FIGS. 4D2, 5E2, 6D2, and 7C2. As shown, mask layer 512 is patterned with a two-dimensional array of circular openings 524 located in the areas between (i.e., not overlying) the underlying bottom electrode connection regions 506.

Finally, FIG. 8C is a top view of a two-dimensional pattern of bottom electrodes 540 formed by etching the bottom electrode layer 510 through the two-dimensional array of circular openings 524 shown in FIG. 8B, and then removing the hard mask 512, e.g., in a manner similar to the example embodiments discussed above. The extent of etching through each hard mask openings 524 is shown in FIG. 8C by a large circle 536. The portions of the bottom electrode layer 510 remaining after the etch process define an array of pyramid shaped bottom electrodes 540, e.g., similar to the pyramid shaped bottom electrodes 440 formed by the steps show in FIGS. 7B1 to 7G2, described above. However, unlike the pyramid shaped bottom electrodes 440, pyramid shaped bottom electrode 540 shown in FIG. 8C have three sloped sides instead of four, due to the arrangement of openings 524 in patterned hard mask layer 512. That is, each pyramid shaped bottom electrode 540 has three sloped side walls meeting at an upwardly pointed tip 532. In one embodiment, the three sloped sidewalls of each pyramid shaped bottom electrode 540 are triangular or generally triangular and concave or generally concave, due to the etch process that form the pyramid shapes.

Using a hexagonal array as shown in FIGS. 8A-8C may allow for a more dense packing of the resulting bitcells, e.g., by reducing the array area for a particular number of bitcells by a factor of $(\sqrt{3})/2$ (i.e., about 13%), as compared with a rectangular "n×m" array.

As with the pointed bottom electrodes discussed above, conductive filament propagation from each bottom electrode 540 is substantially confined to the pointed pyramid tip 532, as the electric field naturally concentrates at the point, edge, or surface having the smallest radius of curvature. Thus, the generally triangular, pointed tip shaped bottom electrode 540 may provide a substantially reduced effective filament formation area $A_{FF}$, as compared with conventional bottom electrode structures.

Although the disclosed embodiments are described in detail in the present disclosure, it should be understood that various changes, substitutions and alterations can be made to the embodiments without departing from their spirit and scope.

The invention claimed is:

1. A method of forming a resistive memory cell, comprising:
   forming a plurality of bottom electrode connections electrically separated from each other within a substrate;
   depositing a bottom electrode layer over the bottom electrode connections and substrate;
   performing an etch to remove portions of the bottom electrode layer to form a plurality of bottom electrodes and expose portions of the substrate, each bottom electrode having first and second sidewalls forming at least one upwardly-pointing bottom electrode region above the bottom electrode connections, each upwardly-pointing bottom electrode region defining a bottom electrode tip;
   depositing an electrolyte layer directly on the plurality of bottom electrodes and the exposed substrate and patterning said electrolyte layer such that an electrolyte region is formed directly on each bottom electrode tip and directly on its associated first and second sidewall; and
   forming a top electrode over said electrolyte region.

2. The method of claim 1, wherein the electrolyte region formed on each bottom electrode tip is configured to provide a path for the formation of a conductive filament or vacancy chain from the bottom electrode tip to the respective top electrode, via the electrolyte region, when a voltage bias is applied to the resistive memory cell.

3. The method of claim 1, wherein the resistive memory cell is a conductive bridging memory (CBRAM) cell.

4. The method of claim 1, wherein the resistive memory cell is a resistive RAM (ReRAM) cell.

5. The method of claim 1, comprising prior to performing the etch, forming and patterning a hard mask over the bottom electrode layer, such that the patterned hard mask includes openings that expose portions of the bottom electrode layer.

6. The method of claim 1, wherein:
   the etch forms at least one elongated trench in the bottom electrode layer that extends over or adjacent multiple bottom electrode connections; and
   the at least one upwardly-pointing bottom electrode region comprises at least one elongated bottom electrode region that extends over and is conductively connected to multiple bottom electrode connections.

7. The method of claim 6, wherein said first and second sidewalls are a pair of sloped sidewalls that meet at a pointed tip edge and define a triangular cross-sectional shape.

8. The method of claim 1, wherein each upwardly-pointing bottom electrode region is pyramid shaped.

9. The method of claim 8, wherein each pyramid shaped bottom electrode region has three sloped sidewalls.

10. The method of claim 8, wherein each pyramid shaped bottom electrode region has four sloped sidewalls.

11. The method of claim 1, wherein each upwardly-pointing bottom electrode region is aligned with and conductively connected to a single bottom electrode connection.

12. The method of claim 1, wherein
   forming a plurality of bottom electrode connections comprises forming a two-dimensional array of bottom electrode connections; and
   forming at least one upwardly-pointing bottom electrode region above the bottom electrode connections comprises forming a two-dimensional array of pyramid shaped bottom electrode regions, each conductively coupled to one of the bottom electrode connections.

13. The method of claim 12, wherein forming an electrolyte region and a top electrode over each bottom electrode tip comprises forming a plurality of elongated electrolyte regions and corresponding elongated top electrodes, each elongated electrolyte region and corresponding elongated top electrode covering a row of multiple pyramid shaped bottom electrode regions.

14. The method of claim 1, wherein said first sidewall is a vertical sidewall and said second sidewall is a sloped sidewall.

15. The method of claim 1, wherein at least one of said sidewalls has a concave shape.

16. A method of forming a resistive memory cell, comprising:
   forming a plurality of bottom electrode connections in an insulator substrate;
   depositing a bottom electrode layer over a top surface of the insulator substrate comprising exposed areas of the bottom electrode connections;
   performing an etch to remove portions of the bottom electrode layer wherein the etch exposes areas of the top surface of the insulator substrate to form a plurality of upwardly-pointing bottom electrode regions above the bottom electrode connections, each upwardly-pointing bottom electrode region having at least a first and a second sidewall defining a bottom electrode tip; and
   forming individual electrolyte region directly on each bottom electrode tip and directly on each associated first and second sidewall; and
   forming a top electrode over said electrolyte region.

17. The method of claim 16, wherein the electrolyte region formed on each bottom electrode tip is configured to provide a path for the formation of a conductive filament or vacancy chain from the bottom electrode tip to the respective top electrode, via the electrolyte region, when a voltage bias is applied to the resistive memory cell.

18. The method of claim 16, wherein the resistive memory cell is a conductive bridging memory (CBRAM) cell.

19. The method of claim 16, wherein the resistive memory cell is a resistive RAM (ReRAM) cell.

20. The method of claim 16, comprising prior to performing the etch, forming and patterning a hard mask over the bottom electrode layer, such that the patterned hard mask includes openings that expose portions of the bottom electrode layer.

21. The method of claim 16, wherein:
   the etch forms at least one elongated trench in the bottom electrode layer that extends over or adjacent multiple bottom electrode connections; and
   the at least one upwardly-pointing bottom electrode region comprises at least one elongated bottom electrode region that extends over and is conductively connected to multiple bottom electrode connections.

22. The method of claim 21, wherein said first and second sidewalls are a pair of sloped sidewalls that meet at a pointed tip edge and define a triangular cross-sectional shape.

23. The method of claim 16, wherein each upwardly-pointing bottom electrode region is pyramid shaped.

24. The method of claim 23, wherein each pyramid shaped bottom electrode region has three sloped sidewalls.

25. The method of claim 23, wherein each pyramid shaped bottom electrode region has four sloped sidewalls.

26. The method of claim 16, wherein each upwardly-pointing bottom electrode region is aligned with and conductively connected to a single bottom electrode connection.

27. The method of claim 16, wherein
forming a plurality of bottom electrode connections comprises forming a two-dimensional array of bottom electrode connections; and
forming at least one upwardly-pointing bottom electrode region above the bottom electrode connections comprises forming a two-dimensional array of pyramid shaped bottom electrode regions, each conductively coupled to one of the bottom electrode connections.

28. The method of claim 27, wherein forming an electrolyte region and a top electrode over each bottom electrode tip comprises forming a plurality of elongated electrolyte regions and corresponding elongated top electrodes, each elongated electrolyte region and corresponding elongated top electrode covering a row of multiple pyramid shaped bottom electrode regions.

29. The method of claim 16, wherein said first sidewall is a vertical sidewall and said second sidewall is a sloped sidewall.

30. The method of claim 16, wherein at least one of said sidewalls has a concave shape.

* * * * *